US012009838B1

(12) United States Patent
Bauer et al.

(10) Patent No.: US 12,009,838 B1
(45) Date of Patent: Jun. 11, 2024

(54) PHYSICAL LAYOUT OF THE FLOQUET CODE BASED ON SQUARE-OCTAGON LATTICE

(71) Applicant: MICROSOFT TECHNOLOGY LICENSING, LLC, Redmond, WA (US)

(72) Inventors: Roman Bela Bauer, Santa Barbara, CA (US); Jeongwan Haah, Bellevue, WA (US); Christina Paulsen Knapp, Goleta, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 21 days.

(21) Appl. No.: 17/990,299

(22) Filed: Nov. 18, 2022

(51) Int. Cl.
  *H03M 13/29* (2006.01)
  *G06N 10/20* (2022.01)
  *G06N 10/40* (2022.01)

(52) U.S. Cl.
  CPC ............ *H03M 13/29* (2013.01); *G06N 10/20* (2022.01); *G06N 10/40* (2022.01)

(58) Field of Classification Search
  CPC ........ H03M 13/29; G06N 10/20; G06N 10/04
  USPC .......................................................... 714/755
  See application file for complete search history.

(56) References Cited

U.S. PATENT DOCUMENTS

| 11,146,339 | B1* | 10/2021 | de Beaudrap | .......... | H04B 10/29 |
| 2020/0401922 | A1* | 12/2020 | Clarke | .................. | G06N 10/00 |
| 2023/0027698 | A1* | 1/2023 | Hastings | ........... | H03M 13/3944 |
| 2023/0115086 | A1* | 4/2023 | Hastings | ................ | G06N 10/20 |
|  |  |  |  |  | 714/10 |
| 2023/0354720 | A1* | 11/2023 | Drachmann | ............ | C23C 14/24 |
| 2023/0419156 | A1* | 12/2023 | Bauer | ..................... | G06N 10/40 |
| 2024/0028940 | A1* | 1/2024 | Knapp | .................. | G06N 10/40 |
| 2024/0030328 | A1* | 1/2024 | Knapp | ................ | H01L 29/7782 |
| 2024/0032444 | A1* | 1/2024 | Knapp | ................. | H10N 60/128 |

OTHER PUBLICATIONS

Paetznick et al., Performance of planar Floquet codes with Majorana-based qubits, Oct. 10, 2022, arXiv, pp. 1-16. (Year: 2022).*

(Continued)

*Primary Examiner* — John J Tabone, Jr.
(74) *Attorney, Agent, or Firm* — Workman Nydegger

(57) ABSTRACT

An apparatus and method are provided for storing and processing quantum information. More particularly, a physical layout is provided to perform Floquet codes. The physical layout includes a quantum processor having an array of qubits (e.g., columns of tetrons or hexons in which Majorana zero modes are located on topological superconductor segments) with a gateable semiconductor devices forming interference loops to perform two-qubit Pauli measurements. Coherent links between qubits in a column enable certain two-qubit Pauli measurements, especially those additional two-qubit Pauli measurements used at a boundary surrounding a region of the bulk code. The two-qubit Pauli measurements are selected to minimize a size of the interference loops. Certain embodiments perform Floquet codes in six time steps. Hexagon embodiments tile the array of qubits with unit cells of 6-gon vertical (or horizontal) bricks. Square-octagon embodiments tile the array of qubits with unit cells of two 4-gon and two 8-gon bricks.

20 Claims, 71 Drawing Sheets

(56) References Cited

OTHER PUBLICATIONS

Bonderson, et al., "Measurement-Only Topological Computation", In Journal of Physical Review Letters, vol. 101, Issue 1, Jul. 4, 2008, 4 Pages.

Chao, et al., "Optimization of the Surface Code Design for Majorana-Based Qubits", In Repository of arXiv:2007.00307v2, Oct. 26, 2020, pp. 19 Pages.

Gidney, et al., "A Fault-Tolerant Honeycomb Memory", In Repository of arXiv:2108.10457v2, Dec. 13, 2021, 17 Pages.

Haah, et al., "Boundaries for the Honeycomb Code", In Repository of arXiv:2110.09545v2, Apr. 18, 2022, 12 Pages.

Hastings, et al., "Dynamically Generated Logical Qubits", In Repository of arXiv:2107.02194v2, Oct. 12, 2021, 19 Pages.

Karzig, et al., "Scalable Designs for Quasiparticle-Poisoning-Protected Topological Quantum Computation with Majorana Zero Modes", In Journal of Physical Review B, vol. 95, Issue 23, Jun. 21, 2017, pp. 32 Pages.

Knapp, et al., "Modeling Noise and Error Correction for Majorana-based Quantum Computing", In Repository of arXiv:1806.01275v3, Aug. 24, 2018, 36 Pages.

Tran, et al., "Optimizing Clifford Gate Generation for Measurement-only Topological Quantum Computation with Majorana Zero Modes", In Journal of SciPost Physics, vol. 8, Issue 6, Jun. 24, 2020, 71 Pages.

\* cited by examiner

Hexagon unit cell 100

Yellow (0)

Blue (1)

Green (2)

Square-octagon parallelogram
850

Square-octagon brick parallelogram 890

Square-octagon lattice parallelogram 880

PHYSICAL LAYOUT OF THE FLOQUET CODE BASED ON SQUARE-OCTAGON LATTICE

CROSS-REFERENCE TO RELATED APPLICATIONS

This application is related to U.S. Provisional Patent Application Ser. No. 63/267,282 filed on Jan. 28, 2022 and entitled "PHYSICAL LAYOUT OF THE FLOQUET CODE WITH MAJORANA-BASED QUBITS" and U.S. Ser. No. 17/990,243 filed on Nov. 18, 2022 and entitled, "PHYSICAL LAYOUT OF THE FLOQUET CODE WITH MAJORANA-BASED QU BITS."

BACKGROUND

Quantum computing and information processing have great potential, but to achieve this potential several unique challenges must be overcome. Among these unique challenges is decoherence of quantum states arising from coupling between qubits and their environment. This decoherence challenge can be addressed is several ways, each of which have relative advantages and disadvantages. There are benefits to exploring multiple approaches to the decoherence challenge, including different types of qubit technologies, architectures, and codes.

One approach is quantum error correction, which is used in quantum computing to protect quantum information from errors due to decoherence and other quantum noise. Quantum error correction can be important to achieve fault-tolerant quantum computation that can reduce the effects of noise on stored quantum information, faulty quantum gates, faulty quantum preparation, and faulty measurements.

Generally, quantum error correction includes a series of syndrome measurements resulting in an indication whether a fault (or error) has occurred. Decoding the results for the syndrome measurements may provide information about which fault occurred and regarding which unitary operator can be performed to correct the fault.

Previously, the surface code has been explored for scalable fault-tolerant quantum computing architectures. The surface code has several advantages including having a high threshold and local support on a two-dimensional planar lattice make it highly appealing for a wide variety of plausible physical implementations.

One qubit platform that promises to reach error rates far below what is required for the surface code is topological quantum computation. Topological qubits are endowed with topological protection, which can be thought of as hardware-level error protection that is able to suppress the effect of any local error exponentially in physical parameters such as the size of the system and the spectral gap. While many different physical systems exhibit topological order and could in principle be used for topological quantum computation, one of the most promising implementations are Majorana zero modes (MZMs) in semiconductor-superconductor heterostructures.

As stabilizer codes are constructed from multi-qubit Pauli measurements, these MZM-based measurement-only topological qubits appear to be ideally suited for the implementation of the surface code. Indeed, several possible approaches have been discussed, including direct measurement of the weight-4 Pauli operators, as well as circuits that implement the stabilizers as a sequence of weight-two measurements. However, these implementations either rely on operations that are challenging to implement physically or suffer from overhead in time and space that is much larger than implementations of the surface code based on, say, superconducting qubits.

A new class of codes called "Floquet codes" address many of the above challenges. Floquet codes have local support on a two-dimensional lattice, and Floquet codes can act as a fault-tolerant quantum memory by way of a time-ordered sequence of two-qubit Pauli measurements. Compared to the surface code, which is fundamentally constructed from four-qubit Pauli measurements, this obviates the need for compiling four-qubit Pauli measurements into either a sequence of two-qubit Clifford gates and single-qubit measurements, or one- and two-qubit Pauli measurements. The codes can be formulated on any face-three-colorable lattice and thus afford significant flexibility in the physical layout. A natural choice of lattice is the honeycomb lattice. The honeycomb Floquet code on a torus was shown to have highly competitive thresholds and logical error rates. However, due to the boundary conditions, it is impractical for large-scale implementation on a physical plane.

Previously, however, there is no physical layout for implementing Floquet codes. The disclosure herein remedies that by providing various embodiments for physical layouts to efficiently implement Floquet codes on various lattices.

The subject matter claimed herein is not limited to embodiments that solve any disadvantages or that operate only in environments such as those described above. Rather, this background is only provided to illustrate one exemplary technology area where some embodiments described herein may be practiced.

This section includes many of the inventors' insights into the problem to be solved and should not be construed as applicant admitted prior art.

BRIEF SUMMARY

One embodiment illustrated herein includes a device that includes a quantum processor and a classical processor. The quantum processor includes a plurality of qubits arranged in qubit columns and assigned to respective plaquettes in a three-colorable lattice The quantum processor includes a gateable semiconductor device comprising semiconductor columns respectively arranged between the qubit columns, the gateable semiconductor device performing two-qubit Pauli measurements between respective qubit pairs of the plurality of qubits. The classical processor applies a Floquet code to the quantum processor, the Floquet code detecting errors based on results of the two-qubit Pauli measurements. The classical processor applies the Floquet code to the quantum processor by controlling the gateable semiconductor device to perform a sequence of the two-qubit Pauli measurements. The classical processor applies a bulk code of the Floquet code to a first portion of the plurality of qubits, the first portion corresponding to a first set of the plaquettes, the first set of the plaquettes being arranged in unit cells that each have two 4-gon plaquettes and two 8-gon plaquettes.

Another embodiment illustrated herein includes a method of performing a Floquet code on a quantum processor. The method includes assigning, using a classical processor, a plurality of qubits to plaquettes in a three-colorable lattice, the qubits being arranged in qubit columns, and semiconductor columns of a gateable semiconductor device being arranged between the respective qubit columns to perform two-qubit Pauli measurements on the plurality of qubits. The method further includes identifying, using the classical processor, a bulk portion of the plurality of qubits and corresponding plaquettes with a bulk code of the Floquet code. The method further includes performing, using the classical processor, a sequence of steps of the bulk code on the bulk portion, each step comprising two-qubit Pauli measurements in the bulk portion that are performed by controlling a gateable semiconductor device to form connections between pairs of qubits in the plaquettes of the bulk portion. The method further includes detecting, using the classical processor, errors based on results of the check measurements a quantum processor comprising. The plaquettes in the bulk portion are arranged in unit cells that each have two 4-gon plaquettes and two 8-gon plaquettes.

A third embodiment illustrated herein includes a device that includes a quantum processor and a classical processor. The quantum processor includes a plurality of qubits configured arranged in respective qubit columns. The quantum processor includes a gateable semiconductor device comprising semiconductor columns each arranged between the respective qubit columns, the gateable semiconductor device performing two-qubit Pauli measurements by connecting respective qubit pairs of the plurality of qubits. The classical processor stores code that when executed causes the classical processor to apply a Floquet code to the quantum processor, the Floquet code detecting errors based on results of the two-qubit Pauli measurements. The classical processor assigns the plurality of qubits to plaquettes. In a first portion of the plurality of qubits the classical processor applies a bulk code of the Floquet code, and the first portion includes plaquettes arranged in unit cells, each of the unit cells consisting of two 4-gon plaquettes and two 8-gon plaquettes. The classical processor applies the Floquet code to the quantum processor by controlling the gateable semiconductor device to perform a sequence of the two-qubit Pauli measurements.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1A:
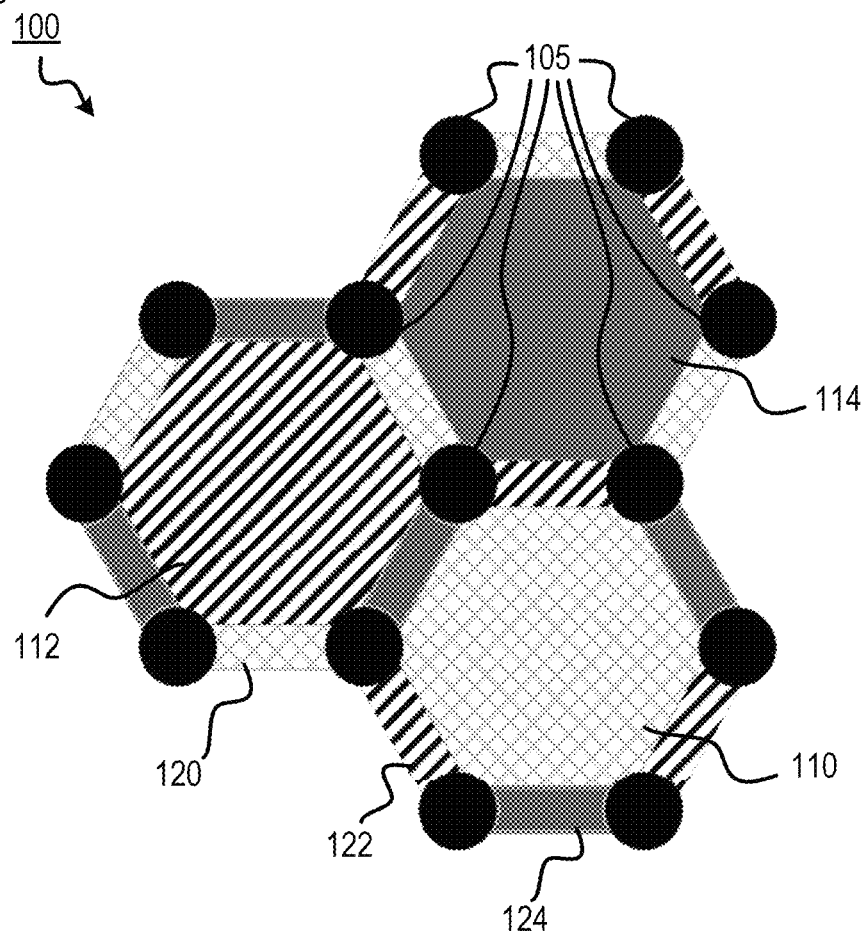
FIG. 1A illustrates an example of a hexagon unit cell, according to one embodiment.
Figure 1A:
Figure 1A:
Figure 1A:

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Physical systems for performing quantum information processing and quantum computing will exhibit errors due to physical limitations of the systems. Quantum error correction enables reduction of the error rates by detecting errors and them correcting them. Significant advancements have been made in determining new theoretical frameworks and new codes, such as the Floquet codes performed on the honeycomb and 4.8.8 lattices. Here, another significant advancement is disclosed: a physical layout for implementing these new codes in a physical system.

To implement useful algorithms, quantum computers must operate at error rates that are currently physically unattainable. Quantum error correcting codes address this issue by encoding a logical qubit in many physical qubits and performing a set of measurements on the physical qubits to detect and correct errors. Thus, while the physical error rate is bounded from below by the physics of the particular implementation of the qubits, the logical error rate can be made arbitrarily low by increasing the distance of the code (effectively the size of the code, and also the number of errors that can be corrected in one round of error correction). Two metrics used to assess the effectiveness of quantum error correcting codes are the threshold and overhead. The threshold refers to the physical error rate below which increasing the size of the code reduces the logical error. A code with high error threshold is desirable as it reduces the requirements on the physical qubits. The overhead refers to the volume of space and time required to implement the code for a desired logical error rate given some physical error rate. A code with low overhead is desirable as it can be implemented in less time on fewer qubits, and as such requires fewer resources to implement the desired algorithm. Finally, the actual performance of any quantum error correcting code will be highly sensitive to its physical implementation, as the choice of physical qubits and their layout will ultimately set the attainable physical error rates.

Topological quantum computation is a promising qubit platform for reaching error rates far below what is required for the surface code. Topological qubits are endowed with topological protection, which can be thought of as hardware-level error protection that is able to suppress the effect of any local error exponentially in physical parameters such as the size of the system and the spectral gap. While many different physical systems exhibit topological order and could in principle be used for topological quantum computation, one of the most promising implementations are Majorana zero modes (MZMs) in semiconductor-superconductor heterostructures. A particularly promising scheme to operate such qubits is measurement-only topological quantum computation, which avoids having to physically move topological excitations and instead performs all manipulations via (in the case of MZMs) joint fermion parity measurements on small numbers of MZMs. The natural operations of these qubits are measurements of multi-qubit Pauli operators in a collection of adjacent qubits. Exactly which Pauli operators are available depends on the details of the physical layout, which can thus be tailored to a particular application.

As stabilizer codes are constructed from multi-qubit Pauli measurements, these MZM-based measurement-only topological qubits are ideally suited for their implementation. Of the possible implementations that have been proposed, they either rely on operations that are challenging to implement physically or suffer from overhead in time and space that is much larger than implementations of the surface code based on superconducting qubits, for example.

Floquet codes provide an alternative to surface codes. Floquet codes provide a new class of codes that also have local support on a two-dimensional lattice. Floquet codes can act as a fault-tolerant quantum memory by way of a time-ordered sequence of two-qubit Pauli measurements. Compared to the surface code, which is fundamentally constructed from four-qubit Pauli measurements, the use of two-qubit Pauli measurements in Floquet codes advantageously obviates the need for compiling four-qubit Pauli measurements into either a sequence of two-qubit Clifford gates and single-qubit measurements, or one- and two-qubit Pauli measurements. The codes can be formulated on any face-three-colorable lattice and thus afford significant flexibility in the physical layout.

A natural choice of lattice is the honeycomb lattice. The honeycomb Floquet code on a torus can be shown to have highly competitive thresholds and logical error rates. Regarding boundary conditions, a simple set of planar boundary conditions are proposed for the honeycomb code.

In addition to the honeycomb lattice, the Floquet code can also be implemented on a 4.8.8 lattice (also known as truncated-square or square-octagon lattice). For both the 4.8.8 code and the honeycomb code, it can be shown that the bulk operations can be naturally implemented in an array of so-called tetrons, which is a particular variant of measurement-only MZM-based topological qubits. This implementation uses only the most natural set of short-ranged measurements for this qubit platform. Then, boundary conditions are introduced for both the honeycomb and the 4.8.8 code that can be implemented directly in these tetron arrays, and which lead to physical implementations that require no auxiliary qubits and use only one physical operation per check operator. Embodiments using the honeycomb lattice are discussed first. Then, embodiments using the 4.8.8 lattice or square-octagon lattice are discussed.

As discussed in A. Paetznick et al., "Performance of planar Floquet codes with Majorana-based qubits" available at https://arxiv.org/pdf/2202.11829.pdf, which is incorporated herein by reference in its entirety, it can be shown through numerical simulations that planar Floquet codes significantly outperform the surface code for the topological platform (or any other platform where two-qubit Pauli measurements are directly available). These improvements are largely due to the comparatively high thresholds and more time-efficient syndrome measurements.

The methods and devices disclosed herein are based on a physical layout using Majorana-based measurement-only qubits to implement Floquet codes on the honeycomb and square-octagon lattices. This layout pairs the benefits of these Floquet codes (high threshold, low overhead) with the natural advantages of Majorana-based qubits (topologically protected two-qubit measurements). The layout is chosen to minimize physical requirements on the qubit islands. Logical qubits are encoded in patches of physical qubits, where the size of the patches determines the code distance. The physical layout uses a regular lattice of physical qubit islands that supports all patch sizes; favorable boundary conditions are identified that minimize the physical measurement distances and allow for efficient packing of patches in the plane.

There are several advantages of the physical layout disclosed herein. Significantly, the same qubits islands, coherent links, and quantum dots are not involved in simultaneous measurements. It can be seen from the measurement circuits depicted herein that the disclosed physical layout avoids any such conflicts. Moreover, the code only uses 'natural' nearest neighbor measurements (those requiring the shortest physical distances and thus expected to have the lowest error rate) in the bulk. For the disclosed qubit basis the measurements include ZZ measurements between horizontally adjacent qubits, and between vertically adjacent qubits the measurements include XX, YY, XY, and YX measurements. Coherent links support the additional set of measurements required along patch boundaries, as well as single-qubit measurement and characterization.

Further advantages of the physical layout disclosed herein include that the Floquet code on the honeycomb lattice (and the 4.8.8 lattice discussed below) can be shown to be competitive in terms of resource overhead and error threshold with the surface code. This is significant because the surface code has previously been heralded as the leading quantum error correcting code for platforms such as Majorana-based qubits or superconducting qubits that require low-weight local measurements.

Additionally, the disclosed physical layout for the Floquet code holds several advantages over that for the surface code with Majorana-based qubits. First, the surface code is implemented by four-qubit stabilizer measurements. Because Majorana-based qubits are unlikely to directly support simultaneous measurements of four qubits, these four-qubit stabilizer measurements are implemented by introducing auxiliary qubits and breaking each stabilizer measurement into 20 time steps for a tetron architecture or 32 time steps for a hexon architecture. In contrast, the Floquet code is built directly from nearest-neighbor two-qubit measurements and can be implemented using only six time steps, thereby significantly reducing the overhead to implement the code. Second, the measurement sequence used to implement the surface code in the bulk uses measurements outside of the natural set of nearest-neighbor measurements identified above. In particular every two-qubit measurement involves a coherent link. As such, the expected physical error rate for implementing the Floquet code is lower than that for the surface code on qubits of the same quality.

Referring now to FIG. 1A, a unit cell 100 of a hexagon lattice is shown, illustrating a tiling unit 100 for the honeycomb code. This is a non-limiting example, and other unit cell configurations can be used, as would be understood by a person of ordinary skill in the art. Qubits are indicated by black dots 105. A check operator ZZ for each horizontal edge, XX for each edge with positive slope, and YY for each edge with negative slope. The lattice is three colorable, having hexagon with three distinct labels. Here, the first type of hexagon 110 is labeled by "yellow" or labeled by "0", and is surrounded by edges labeled as blue edges 122 and green edges 124. The second type of hexagon 112 is labeled by "blue" or labeled by "1", and is surrounded by edges labeled as yellow edges 120 and green edges 124. The third type of hexagon 114 is labeled by "green" or labeled by "2", and is surrounded by edges labeled as yellow edges 120 and green edges 124. At the vertices of the hexagons 110, 112, and 114 are located respective qubits 105. There are more than one physical qubits 105 for each logical qubit in order to provide redundancy for performing error correction.

The honeycomb code is defined by a time-ordered sequence of weight-two Pauli operators supported on vertices of a hexagonal lattice. Each operator, or "check," corresponds to an edge in the lattice. A family of honeycomb codes can be constructed by tiling some number of "units" 100, which is a set of three adjacent faces as shown in FIG. 1A. The operators are assigned such that all operators supported at a given vertex anticommute. A specific choice for the honeycomb lattice that satisfies these conditions is to assign ZZ to horizontal edges, XX to edges with positive slope, and YY to edges with negative slope. To define the order in which operators are measured, colors (e.g., blue, yellow, green) can be assigned to each edge such that no two edges touching the same vertex have the same color. Then, each face is surrounded by two colors of edges, and each face is colored by the lone remaining color, as illustrated in FIG. 1A. For a lattice with periodic boundary conditions (e.g., a torus), a tiling using this unit is all that is required. The check measurements are then time-ordered by color: first yellow, then blue, then green. This period-three sequence forms one round of syndrome extraction for the honeycomb code. A number of rounds proportional to the distance is used for a fault-tolerant quantum memory.

Figure 1B:
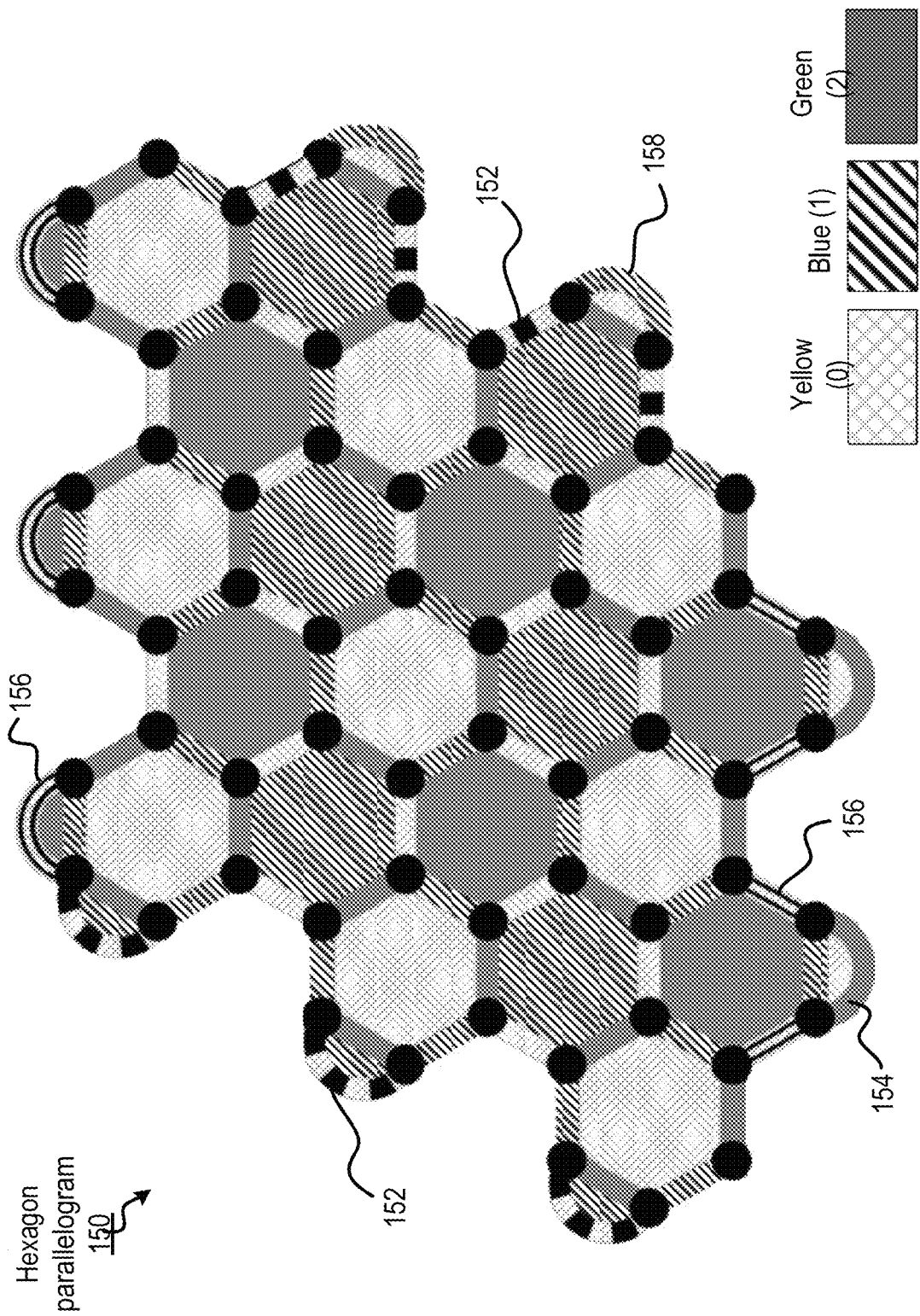
FIG. 1B illustrates an example of a hexagon parallelogram, according to one embodiment.

Generally, performing the honeycomb code on a torus is not practical, and boundary conditions for a planar geometry are used instead. One set of boundary conditions forms a parallelogram shape as shown in FIG. 1B. First, a set of units is tiled to form the bulk of the parallelogram. Then, additional qubits and edges are added around the perimeter. Some of the faces around the boundary are incomplete, resulting in 2-gons instead of hexagons. The parallelogram boundaries also require a modification to the time-ordering of the check measurements. Instead of measuring checks in the period-three sequence (yellow, blue, green), the edges are measured in a period-six sequence (yellow, blue, green, yellow, green, blue). Most of the edges, including all of the blue edges 158 and green edges 154, are measured twice during this sequence. The black-yellow dashed edges 152 are measured only once.

Parallelogram boundary conditions for the honeycomb code. Solid color edges are measured in a period-six sequence (yellow, blue, green, yellow, green, blue). Black-yellow edges are Pauli operators chosen such that the triple of check operators meeting at a vertex is pairwise anticommuting. The dashed black-yellow edges 152, bordering blue faces, are measured during the first yellow round, while the striped black-yellow edges 156, bordering green faces, are measured during the second yellow round.

The sequence of check measurements defines a corresponding sequence of stabilizer groups. The instantaneous stabilizer group at a given time step is the group of Pauli operators obtained by projecting onto each check operator up to and including the chosen time step. This includes all of the check measurements at that time step, and after at least four time steps, the Pauli operators supported on each of the hexagonal faces. The instantaneous logical operators are the normalizers of the instantaneous stabilizer group, modulo the instantaneous stabilizer group.

On a torus (i.e., without boundaries), the instantaneous stabilizer group consists of the plaquette stabilizers around the hexagons and the check operators at the moment. With boundaries, the instantaneous stabilizer group possesses new types of elements (transient stabilizers), in addition to perpetual stabilizers associated with the hexagons, 4-gons, and 2-gons.

First, when yellow checks are measured after green checks, black-yellow striped checks bordering green faces are not measured. Hence, the green checks at the bottom of FIG. 1B remain in the instantaneous stabilizer group. In the next step, the green checks are measured again and, in the absence of errors, the outcomes of the green checks at the bottom boundary are deterministic. This gives a node in the decoding graph, inferred by 2 green check outcomes. It is contrasted to a decoding graph node corresponding to a hexagon, which is inferred by 12 check outcomes.

Second, similarly, the instantaneous stabilizer group at the yellow step (that follows a green step) contains the product of the outcomes of the two green checks at the top of FIG. 1B, which are separated by one yellow edge. Since, the green checks are measured at the next step, a decoding graph node is obtained that is inferred by 4 green check outcomes.

Finally, the top-left corner is exceptional, where two 2-gons do not carry perpetual stabilizers. The three qubits at the corner support a subgroup of the instantaneous stabilizer group (ISG), and this subgroup has period 6 up to signs (see Table 1 for concrete details). Whenever there is a deterministic outcome, there is a decoding graph node.

TABLE 1

Elements of the instantaneous stabilizer group of the planar honeycomb code.

| Step | Check operator | In steady state, ISG contains up to signs | Outcome deterministic? |
|------|----------------|-------------------------------------------|------------------------|
| Y    | IYX            | IZZ, IYX                                  | Yes                    |
| B    | IZZ            | IZZ, IYX                                  |                        |
| G    | XXI            | XXI, IXY                                  |                        |
| Y    | ZYI            | XXI, ZYI                                  | Yes                    |
| G    | XXI            | XXI, ZYI                                  |                        |
| B    | IZZ            | YZI, IZZ                                  |                        |

Figure 2A:
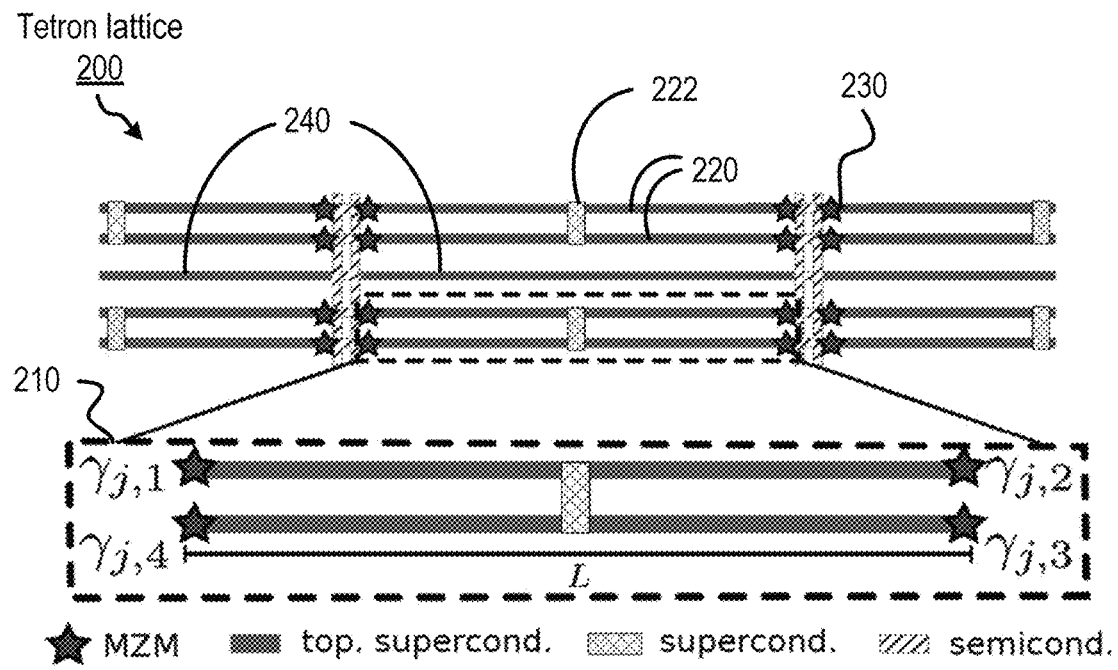
FIG. 2A illustrates an example of a tetron configuration, according to one embodiment.
Figure 2B:
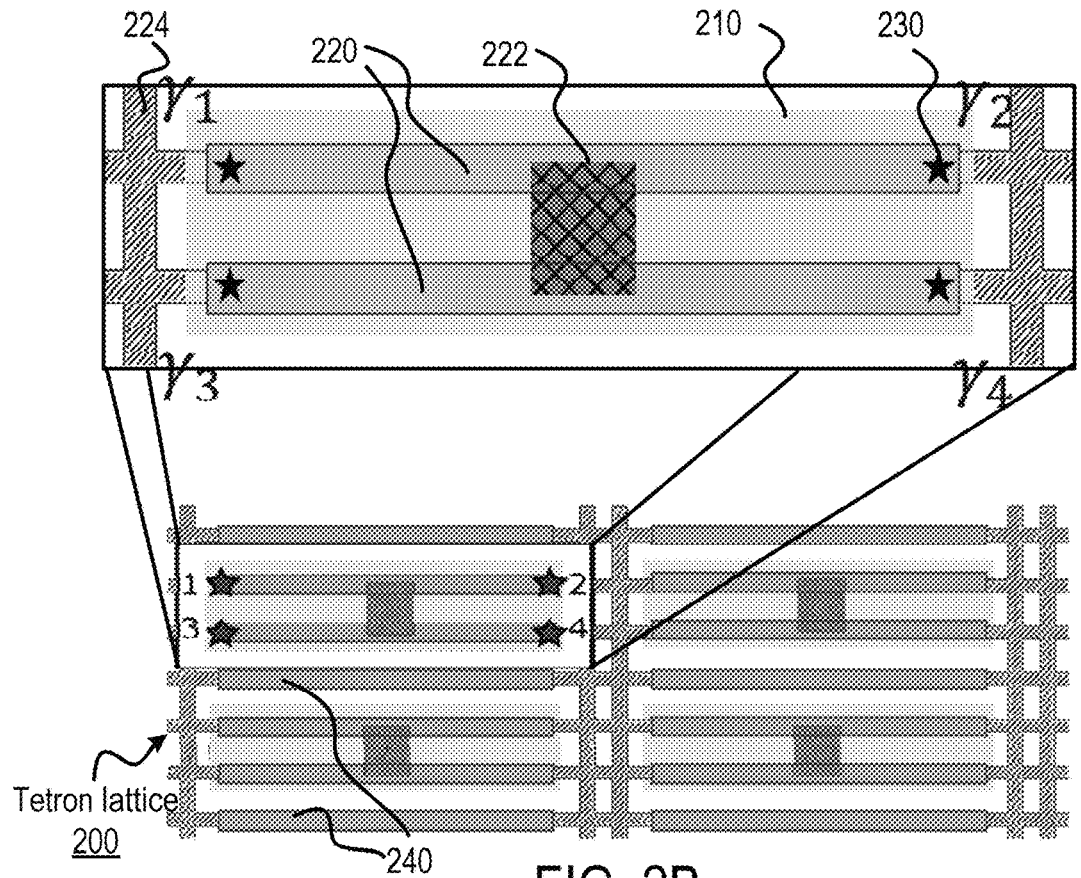
FIG. 2B illustrates another schematic of the tetron configuration, according to one embodiment.
Figure 2C:
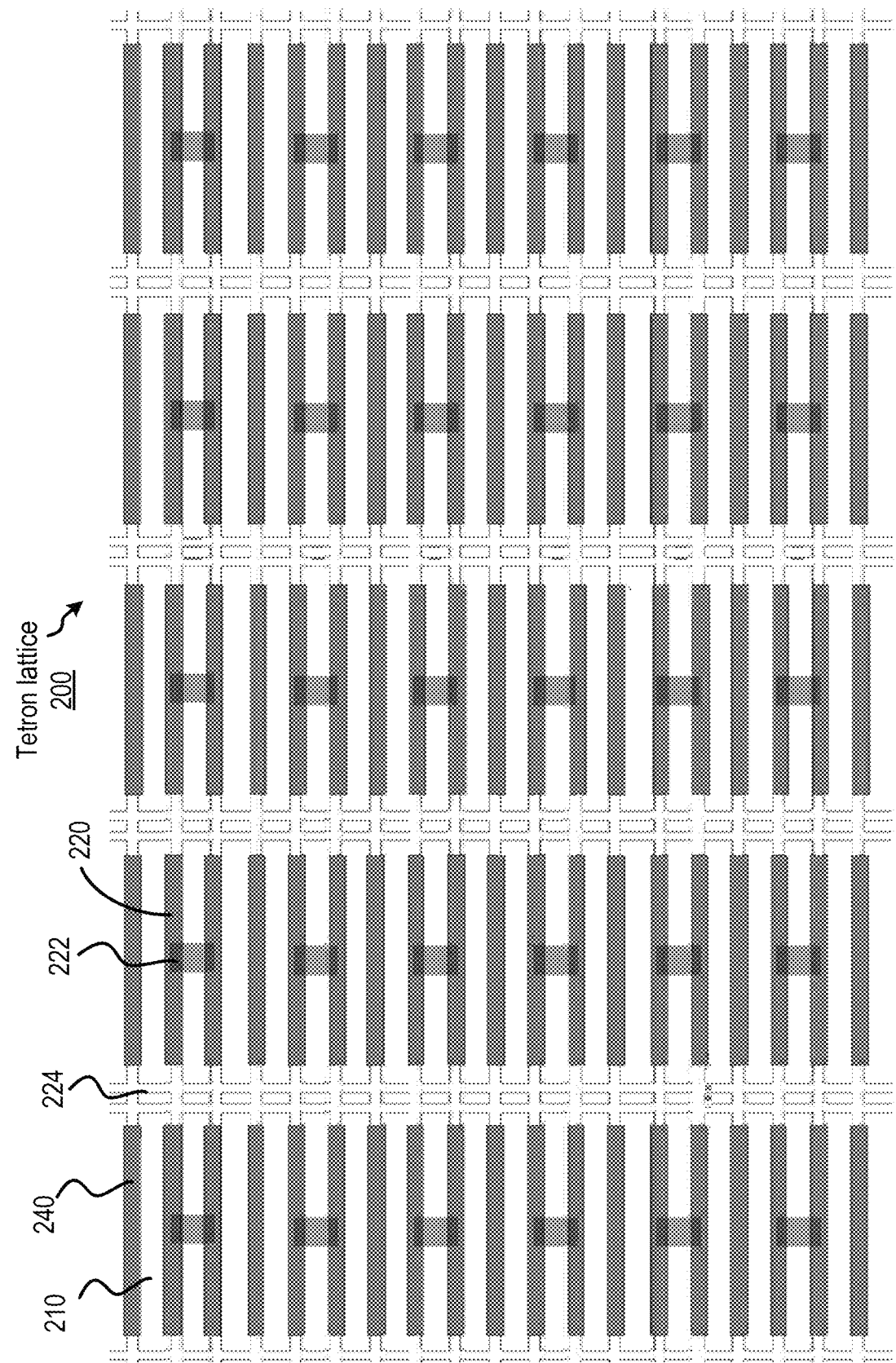
FIG. 2C illustrates an example of a tetron lattice, according to one embodiment.

FIGS. 2A, 2B and 2C illustrate a tetron 210 in a lattice 200 of tetrons. A representative tetron 210 includes a superconductor island 222 and topological superconductor sections 220 that can define Majorana Zero Modes (MZMs) such as MZM 230 at respective ends. Other MZMs established in the tetron 210 are indicated with stars, but, for clarity in illustration, not all MZMs are shown. The columns of tetrons are separated by a gateable semiconductor structure 224 that permits selection of measurement paths. The tetron 210 includes two topological superconducting wires 220 that are connected by a regular superconducting bridge 222. Rows of tetrons are separated by coherent links 240, which are topological superconductor sections provide coherent quantum links from one side of a column of tetrons to the other side. The gateable semiconductor structure 224 includes two semiconductor columns. The coherent links 240 are available for single qubit characterization and certain boundary measurements.

As shown in FIG. 2C, the layout for the Floquet codes can have a square grid of two-sided tetrons 210 such that vertical nearest-neighbor qubit islands are separated by a coherent link 240 and columns of tetrons are separated by a pair of vertical semiconducting wires 224. Coherent links 240 are themselves topological wires, which are in a floating configuration (i.e., have no connection to ground), and the coherent links 240 are used to facilitate measurements between opposite sides of the qubit islands.

In certain embodiments, the columns of semiconducting wires 224 contain gate-controlled junction that allow the formation of quantum dots. Tetrons 210 encode a qubit state in the ground state subspace of four Majorana zero modes (MZMs) 230, one at each end of each topological wire. Pauli measurements are performed by coupling pairs of MZMs 230 through the semiconducting wires 224 and coherent links 240 adjacent to the qubits to define measurement loops. By forming at least one quantum dot along the measurement loop and capacitively coupling a microwave measurement circuit to this quantum dot, the measurement result can be obtained.

Majorana-based qubits encode quantum information in the degenerate ground state subspace associated with pairs of MZMs. Encoding the qubit in this way protects the quantum information at a hardware level, as a noisy environment cannot distinguish the qubit states. Error processes on the idle qubit are exponentially suppressed in macroscopic parameter ratios of the system ($L/\xi$, $\Delta/kBT$), corresponding to 'topological protection' of the idle qubit. Here, two-sided tetrons for the physical layout are discussed. But two-sided tetrons are one example of a nonlimiting embodiments, and other configurations of MZMs can be used. For example, another example is provided below in which a variation for two-sided hexons is discussed. Both tetrons and hexons are charging-energy protected topological qubits operated according to a measurement-only scheme.

For the physical implementation of the Floquet codes, a square grid of tetron qubits can be used. Now, a brief description of the tetron architecture is provided. In FIG. 2C, the tetron lattice 200 has two parallel p-wave superconducting wires 220 connected by a trivial superconducting wire 222 in the center. Together, these form a qubit island with a finite charging energy, which fixes the total fermion number in the ground state and suppresses quasi-particle poisoning events. Each topological wire has a Majorana zero mode (MZM) 230 at either end, described by self-adjoint fermion operators $\gamma_j$, $j \in \{1, 2, 3, 4\}$ labeled as shown in FIGS. 2A and 2B. These satisfy the canonical anticommutation relations $\{\gamma_i, \gamma_j\} = 2\delta_{ij}$. Fixing the total parity to be even, $-\gamma_1\gamma_2\gamma_3\gamma_4 = 1$, these four Majorana zero modes form a two-dimensional degenerate ground state that can be used to encode a qubit. The single-Pauli operators are given by Majorana bilinears as $$i\gamma_1\gamma_2 = i\gamma_3\gamma_4 = X,$$

$$i\gamma_1\gamma_4 = i\gamma_2\gamma_3 = Y,$$

$$i\gamma_1\gamma_3 = -i\gamma_2\gamma_4 = Z.$$

That each Pauli operator has two equivalent representations as Majorana bilinear is beneficial for an efficient implementation of Floquet codes. Two-qubit Pauli operators can be inferred and each corresponds to four equivalent products of four Majorana operators. Single- and multi-qubit Pauli measurements are performed by forming an interference loop that includes the corresponding set of MZMs 230. These interference loops must be formed such that electrons can travel along them coherently, with the loop entering and exiting the qubit(s) through the MZM pair(s) of interest and the remainder of the loop formed by semiconducting segments. The semiconductor 224 is shown in FIG. 2C. Within the semiconductor 224 are structures that enable gateable interactions/measurements of the MZMs 230.

For example, quantum information can be manipulated according to a measurement-only protocol, which is facilitated by tunable couplings between MZMs 230 and nearby semiconductor quantum dots. As discussed in T. Karzig et al., "Scalable designs for quasiparticle-poisoning-protected topological quantum computation with majorana zero modes," Phys. Rev. B 95, 235305 (2017), arXiv: 1610.05289, which is incorporated herein by reference in its entirety, quantum dots can be defined and selectively coupled to MZMs by tuning depletion gates in a nearby semiconducting wire that is connected to the tetron's MZM side. Measurements of the parity $i\gamma_j\gamma_k$ can then be done by connecting MZMs $\gamma_j$ and $\gamma_k$ to quantum dots in the semiconducting wire. In general, the eigenvalue $p_{jk}$ of $i\gamma_j\gamma_k$ will affect the ground-state energy as well as the average charge and differential capacitance of the quantum dots. This can be used in a variety of schemes to make the desired measurement. According to one approach scalable topological quantum computing is achieved by performing projective measurements of the combined fermionic parity of multiple MZMs. Such measurements are initiated by appropriately tuning gates to couple MZMs to quantum dots. This realizes the devices with one quantum dot or more quantum dots. The gates control the amplitudes for electrons to tunnel between the MZMs and a quantum dot. The virtual transitions of electrons to the island are state dependent and, therefore, shift the energy levels in a parity-dependent manner. Suitable spectroscopy on the quantum dot system allows measurements of the two-MZM parity or of the four-MZM parity. Before and after the measurement, all couplings are turned off, leaving the MZM island and the quantum dot with fixed charge. In this decoupled state, noise cannot measure and collapse the qubit state.

According to certain non-limiting embodiments, within the semiconductor 224 are structures are tunable junctions that allow interference loops to be configured on nanosecond timescales. If the loops additionally include semiconductor quantum dots, the state of the qubits will shift the excitation spectrum of the quantum dot in a way that can be detected using standard microwave frequency techniques, thus performing a measurement of the (multi-)qubit Pauli operator. To form long loops (in excess of the semiconductor phase coherence length), it is convenient to introduce additional floating topological wires, which are referred to as "coherent links" 240. The coherent links 240 can be seen as single topological wires between the tetron qubits in FIG. 2C. While in principle measurement loops can be made arbitrarily large, in practice the measurement error increases with the size of the loop, and it is thus desirable to rely on measurements corresponding to short loops. The length of the loop for a given Pauli measurement can be optimized by choosing from the set of equivalent Majorana operators the one that leads to the shortest loop. For this specific layout, two-qubit measurements that avoid coherent links (e.g., ZZ, XX, XY, YX, and YY between vertical nearest neighbors, ZZ between horizontal nearest neighbors) are expected to be of similar fidelity to single-qubit measurements with one coherent link (X and Y), and higher than those involving additional superconducting islands (e.g., ZX between vertical or horizontal neighbors). Note that, at each given time step, only one pair of MZMs on the qubit can be measured at a time to define a single path through the qubit island, and that measurement loops cannot intersect.

Further, FIG. 2C illustrates a nonlimiting example of a physical layout for a zero-overhead implementation of the Floquet code on the honeycomb lattice. The layout shows a square grid of tetrons (e.g., qubit islands with four MZMs). Each row of tetrons is separated by a coherent link required for single qubit characterization and certain boundary measurements. Columns of tetrons are separated by two semiconducting columns that allow for simultaneous measurements between vertically adjacent qubits.

Figure 3A:
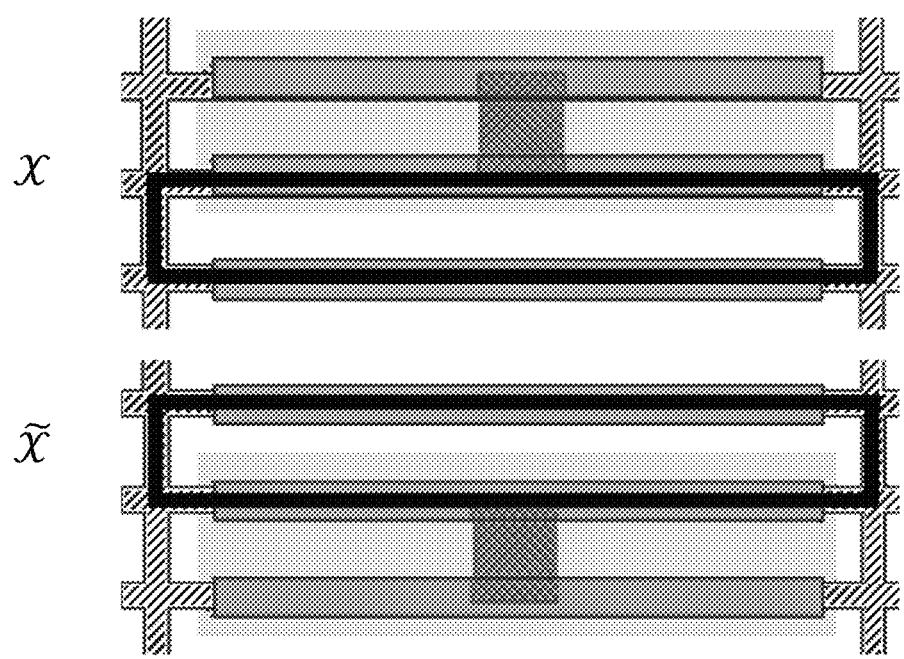
FIG. 3A illustrates a schematic diagram of a physical layout of one-qubit X Pauli measurements, according to one embodiment.
Figure 3B:
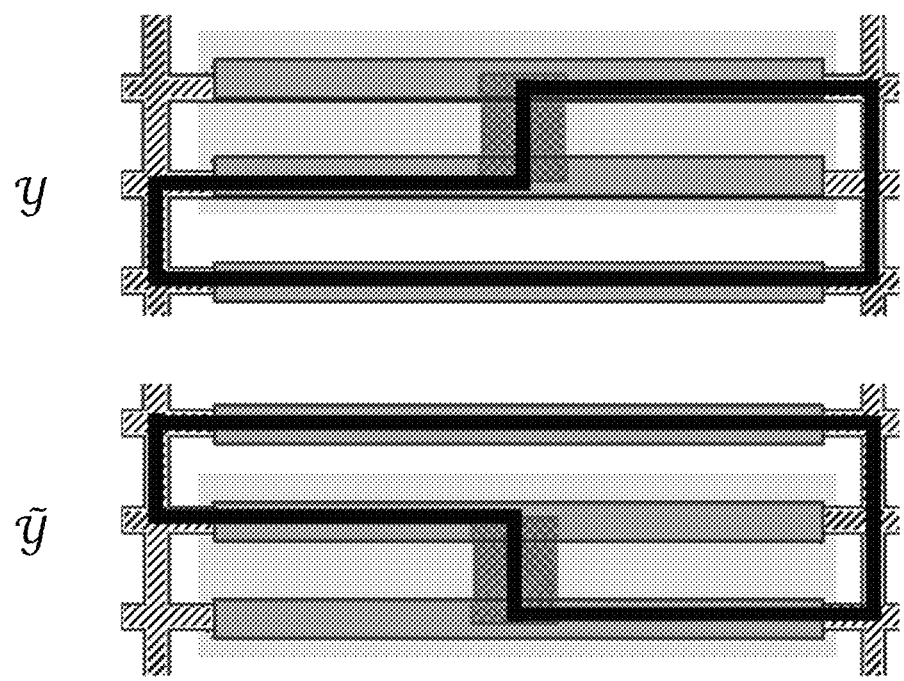
FIG. 3B illustrates a schematic diagram of a physical layout of one-qubit Y Pauli measurements, according to one embodiment.
Figure 3C:
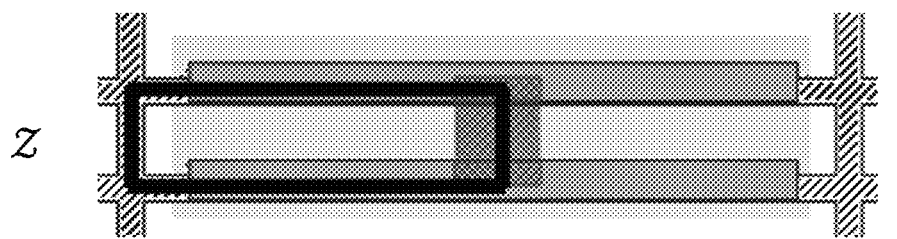
FIG. 3C illustrates a schematic diagram of a physical layout of one-qubit Z Pauli measurements, according to one embodiment.
Figure 3C:
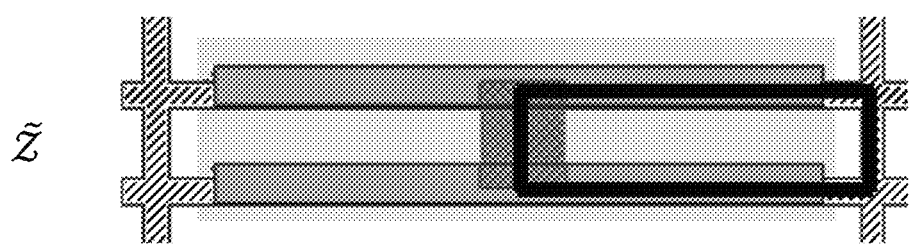

FIG. 3A illustrates single-qubit measurements for the X Pauli measurement, according to the above-defined basis. There are two choices to perform. For the X Pauli measurement, the first choice uses the lower MZMs and is denoted as the "$\mathcal{X}$" loop, and the second choice uses the upper MZMs and is denoted as the "$\tilde{\mathcal{X}}$" loop. In FIG. 3B, the single-qubit measurements for the Y Pauli measurement, according to the above-defined basis. These single-qubit measurements are denoted as the "$\mathcal{Y}$" loop and the "$\tilde{\mathcal{Y}}$" loop. In FIG. 3C, the single-qubit measurements for the Z Pauli measurement, according to the above-defined basis. These single-qubit measurements are denoted as the "$\mathcal{Z}$" loop and the "$\tilde{\mathcal{Z}}$" loop.

According to certain embodiments, the tetron has two parallel topological superconducting wires connected by a trivial superconducting wire in the center. Each topological wire has a MZM at either end, which are labeled as $\gamma_j$, $j \in \{1, 2, 3, 4\}$ according to the MZM labels shown in FIG. 2B.

The qubit states are encoded in pairs of MZMs. For instance, when the fermion parity on the island is even $-\gamma_1\gamma_2\gamma_3\gamma_4 = 1$, a qubit basis can be fixed as:

$$i\gamma_1\gamma_2 = i\gamma_3\gamma_4 = \sigma_x,$$

$$i\gamma_1\gamma_4 = i\gamma_2\gamma_3 = \sigma_y,$$

$i\gamma_1\gamma_3 = -i\gamma_2\gamma_4 = \sigma_z$.

To perform a Pauli measurement, the pair of MZMs corresponding to the desired measurement basis is purposefully coupled. This can be achieved by forming an interference loop through which electrons can travel coherently, with one arm of the loop entering and exiting the qubit through the MZM pair of interest. This interference loop can be formed using semiconducting or superconducting arms. Note that only one pair of MZMs on the qubit can be measured at a time to define a single path through the qubit island and measurement loops cannot intersect.

For each single-qubit Pauli measurement there are two choices of MZM pairs. Below, X, Y, or Z Pauli measurements are referred to agnostically with respect to which of the two MZM pairs are part of the interference loops. To specify a particular measurement choice, the following designations can be used $X = i\gamma_3\gamma_4$, $Y = i\gamma_2\gamma_3$ $Z = -i\gamma_2\gamma_4$, and $\tilde{X} = i\gamma_1\gamma_2$, $\tilde{Y} = i\gamma_1\gamma_4$ $\tilde{Z} = i\gamma_1\gamma_3$.

When performing two-qubit measurements, certain choices of P, P̃ will yield shorter measurement loops.

In principle, measurement loops can be made arbitrarily large and involve as many qubits as desired. In practice, the probability of a measurement error increases as the size of the loop increases, due to several factors, which are discussed now.

First, semiconductors have a finite phase coherence length; semiconductor reference arms must be shorter than this length to support the coherent electron transport required for the MZM parity measurement. The longer the semiconducting segment in the measurement loop, the higher the probability that phase coherence is lost.

Second, the horizontal extent of a qubit island is likely too long for a semiconducting reference arm, leading to the need for topological coherent links to facilitate measurements between MZMs on opposite sides of a qubit island. The junction between topological and semiconducting segments of the measurement loop must be in the tunneling regime; the more tunnel junctions in the measurement, the lower the measurement visibility unless the islands are all tuned to resonance. Thus, there is a higher probability of measurement error when multiple topological islands are involved.

Third, to tune between different measurement configurations, every semiconductor segment and topological wire must be separated by a cutter gate. The more cutters involved in a measurement, the higher probability of a tuning error when changing between measurement configurations. These tuning errors can cause correlated errors between all qubits involved in the measurement.

Fourth, a quasiparticle excited on a qubit, semiconductor arm, or coherent link involved in a measurement can travel to another qubit, semiconductor arm, or coherent link connected by the measurement loop. Thus, the more qubits involved in a measurement, the higher the probability of correlated errors.

Advantageously, the measurements applied herein have been selected in view of the above factors to minimize errors. In view of the above factors, it is beneficial to have measurement loops be as short as possible and involve the fewest number of junctions. For the qubit basis discussed above (additional bases are discussed below, which bases are referred to as the primed basis and double primed basis), it would be expected that single qubit Z measurements to have the lowest error as their measurement loops only require one short semiconducting segment. Both X and Y measurements require a coherent link, and X loops have slightly shorter semiconducting segments than Y loops. For two-qubit Pauli measurements, XX, XY, YY, YX, and ZZ between vertically adjacent qubits and ZZ between horizontally adjacent qubits all have similar loop distance to single qubit X and Y. These measurements are labeled as 'natural' because their loops involve two topological segments and at most six semiconductor segments. All other two-qubit measurements require longer measurement loops and are thus preferable to avoid.

Figure 3D:
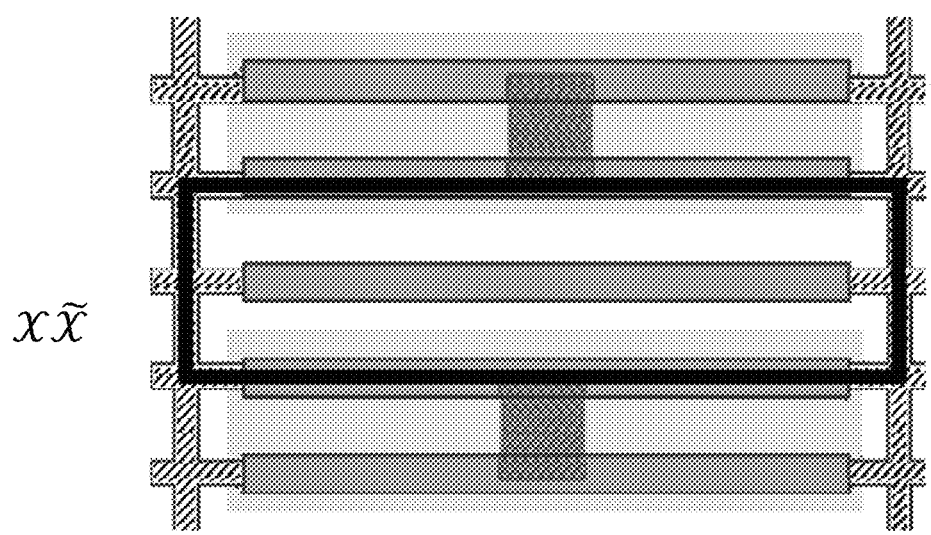
FIG. 3D illustrates a schematic diagram of a physical layout of a two-qubit XX Pauli measurement, according to one embodiment.
Figure 3E:
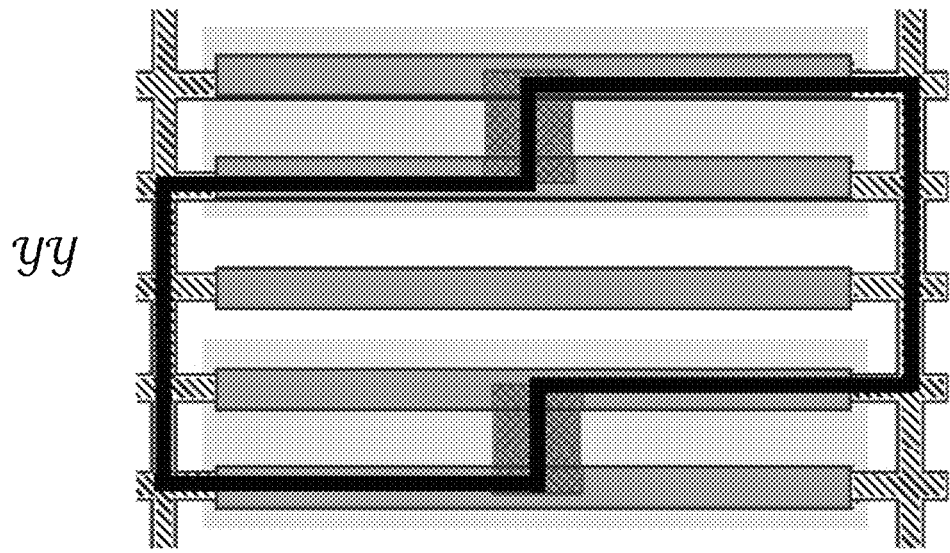
FIG. 3E illustrates a schematic diagram of a physical layout of a two-qubit YY Pauli measurement, according to one embodiment.
Figure 3F:
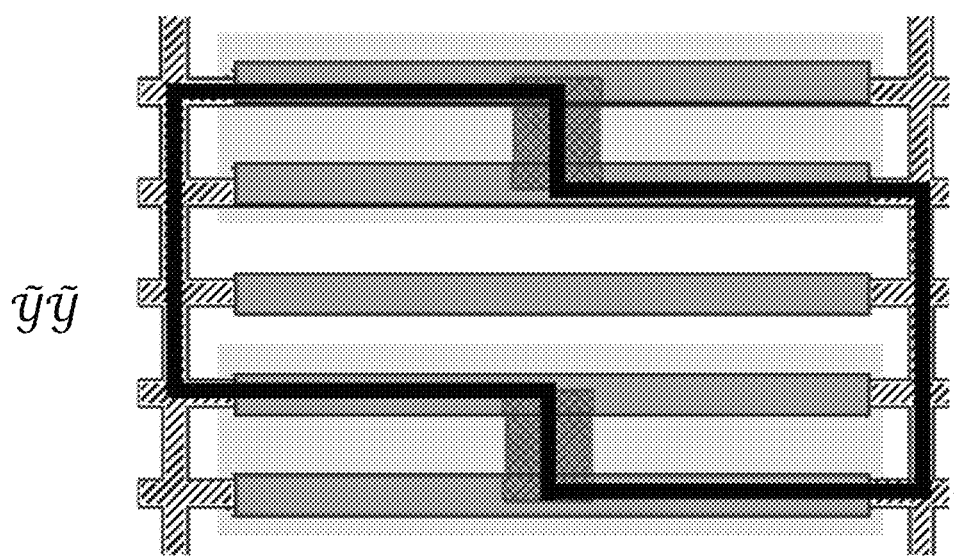
FIG. 3F illustrates a schematic diagram of a physical layout of another two-qubit YY Pauli measurement, according to one embodiment.
Figure 3G:
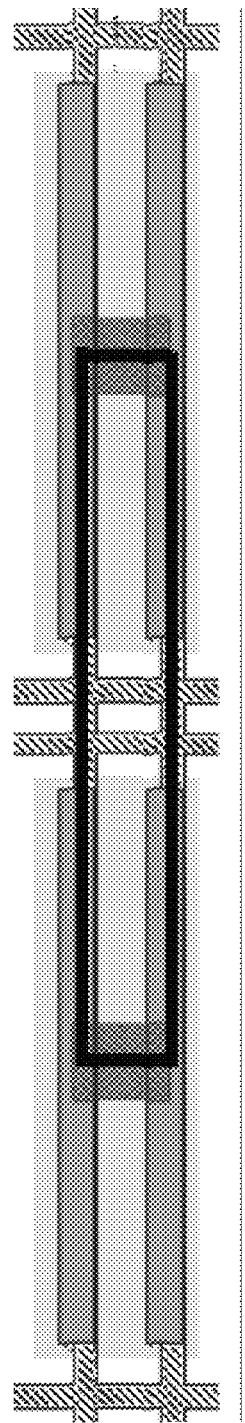
FIG. 3G illustrates a schematic diagram of a physical layout of a two-qubit ZZ Pauli measurement, according to one embodiment.

Various two qubit measurements are also used for the tetrons. FIGS. 3D-G illustrate some of the two-qubit measurements that are used in the bulk of the Floquet code. Although other two-qubit measurements could be used, those two-qubit measurements illustrated in FIGS. 3D-G advantageously minimize the measurement error by minimizing the size of the measurement loops. All bulk measurements have two superconducting arms and two semiconducting arms, corresponding to similar physical resource requirements to single-qubit X and Y measurements. In FIG. 3D, a two-qubit measurement is illustrated for the XX Pauli measurement, which is denoted as the "$\mathcal{X}\,\tilde{\mathcal{X}}$" loop. In FIGS. 3E and 3F, two measurement options are illustrated for the two qubit YY Pauli measurement, which are respectively denoted as the "$\mathcal{Y}\,\mathcal{Y}$" loop and the "$\tilde{\mathcal{Y}}\,\tilde{\mathcal{Y}}$" loop. Note that either the "$\mathcal{Y}\,\mathcal{Y}$" loop or the "$\tilde{\mathcal{Y}}\,\tilde{\mathcal{Y}}$" loop can be used. In FIG. 3G, a two-qubit measurement is illustrated for the ZZ Pauli measurement, which is denoted as the "$\mathcal{Z}\,\tilde{\mathcal{Z}}$" loop.

Figure 4A:
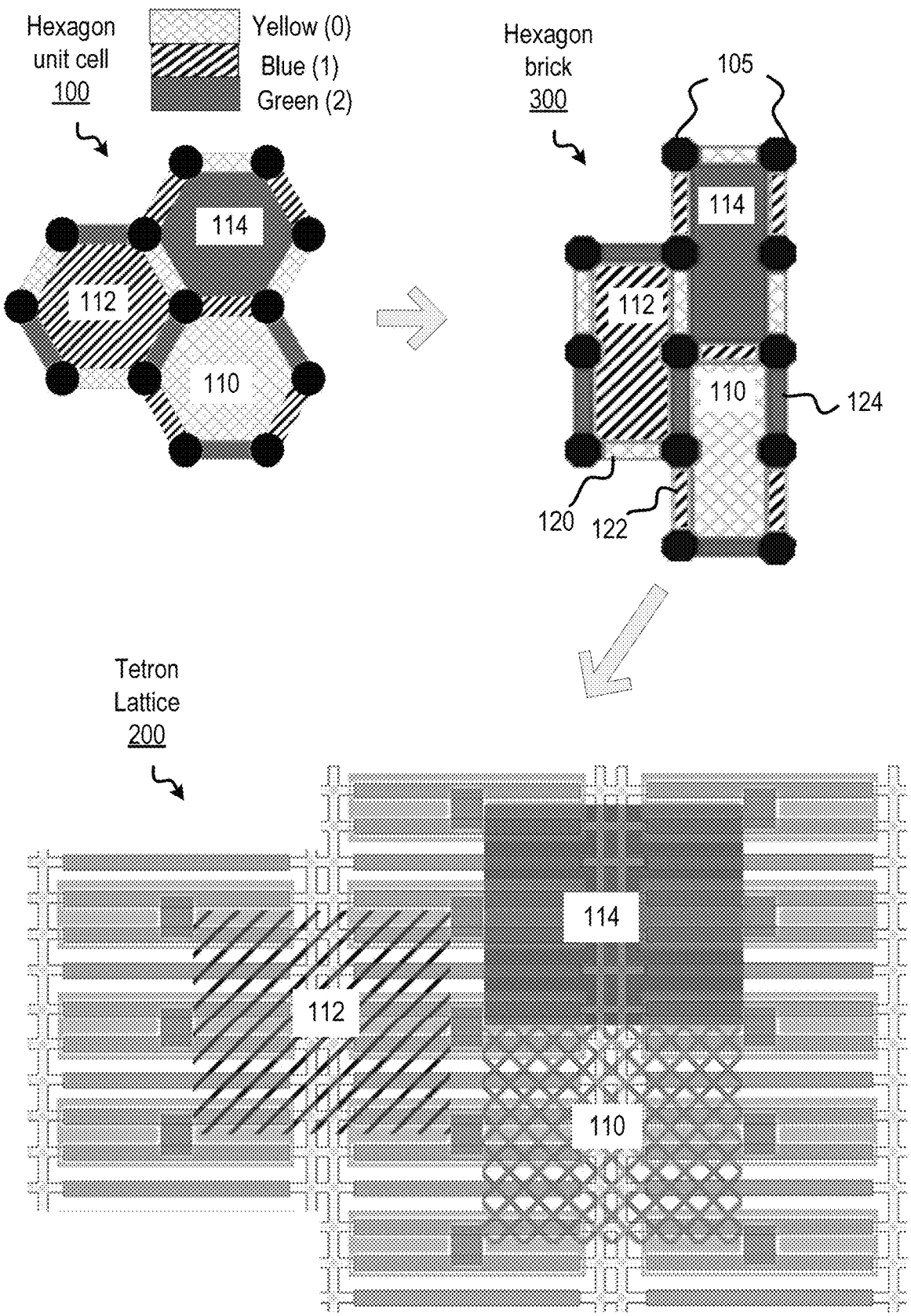
FIG. 4A illustrates a mapping of the hexagon unit cell to the hexagon unit brick and mapping of the hexagon unit brick to the tetron lattice, according to one embodiment.

FIG. 4A illustrates a nonlimiting example of how the honeycomb lattices map to an array of tetrons, such as the tetron lattice 200. In FIG. 4A, the hexagon unit cell 100 has a corresponding hexagon brick 300, which in turn corresponds to a region within the tetron lattice 200. Note the qubits (i.e., vertices of the hexagons) each correspond to a respective tetron, whereas the edges of the hexagons correspond to measurements between tetrons, rather than corresponding to a physical structure within the tetron lattice 200. The colors can refer to the measurement time steps, rather than the Pauli operators.

Figure 4B:
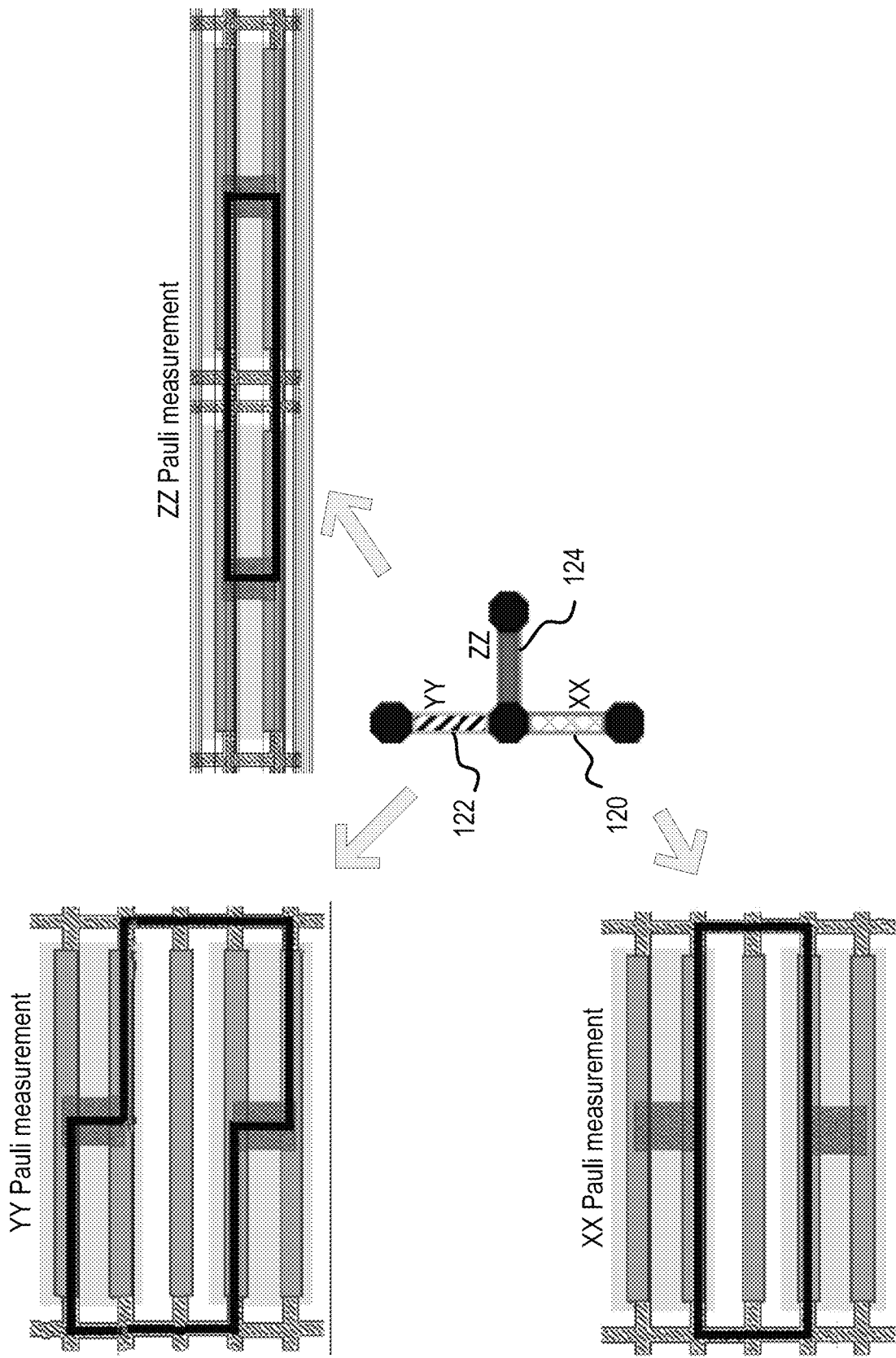
FIG. 4B illustrates a mapping of edges of the hexagon unit brick to two-qubit Pauli measurements, according to one embodiment.
Figure 5A:
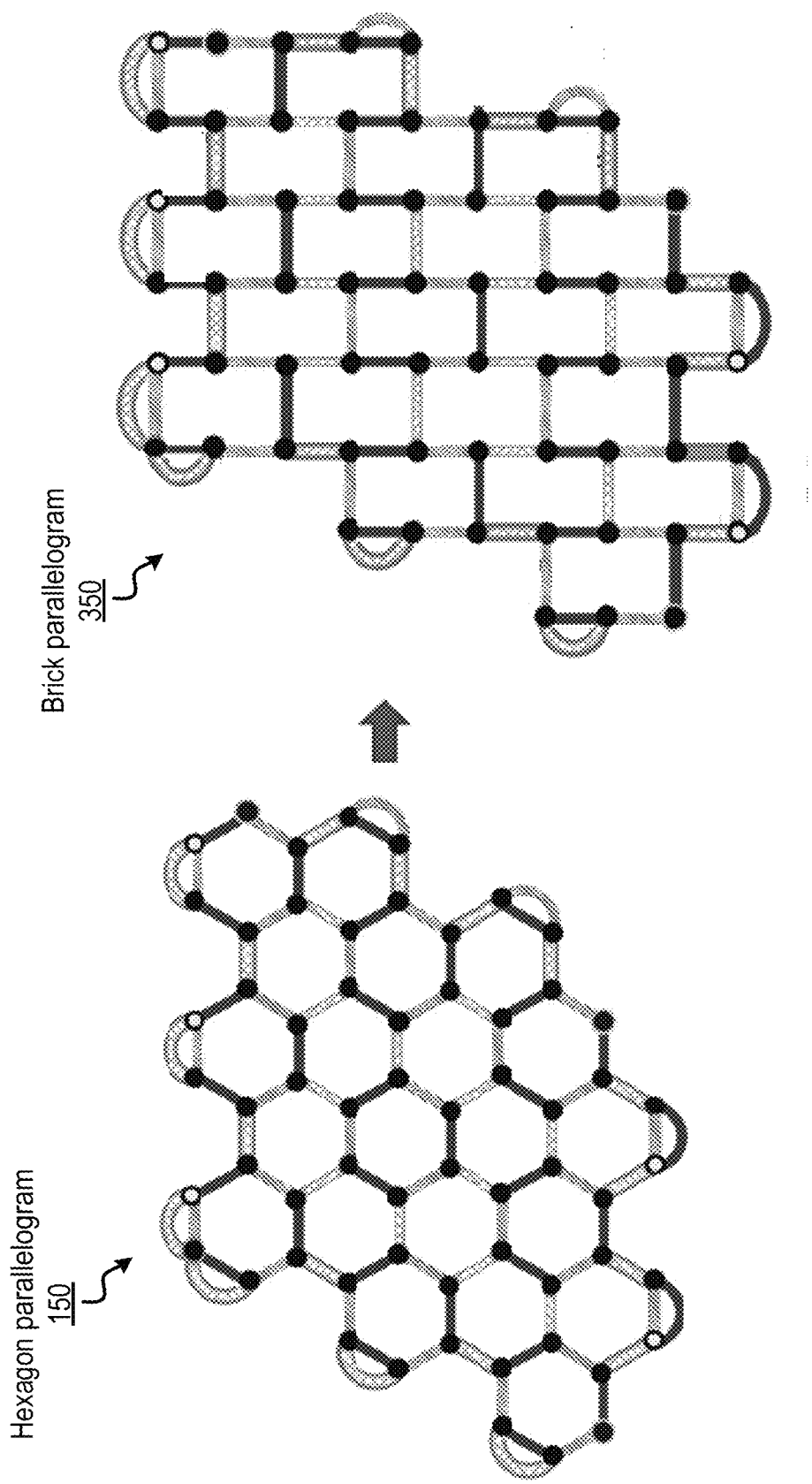
FIG. 5A illustrates a mapping of the hexagon parallelogram to the brick parallelogram, according to one embodiment.
Figure 5B:
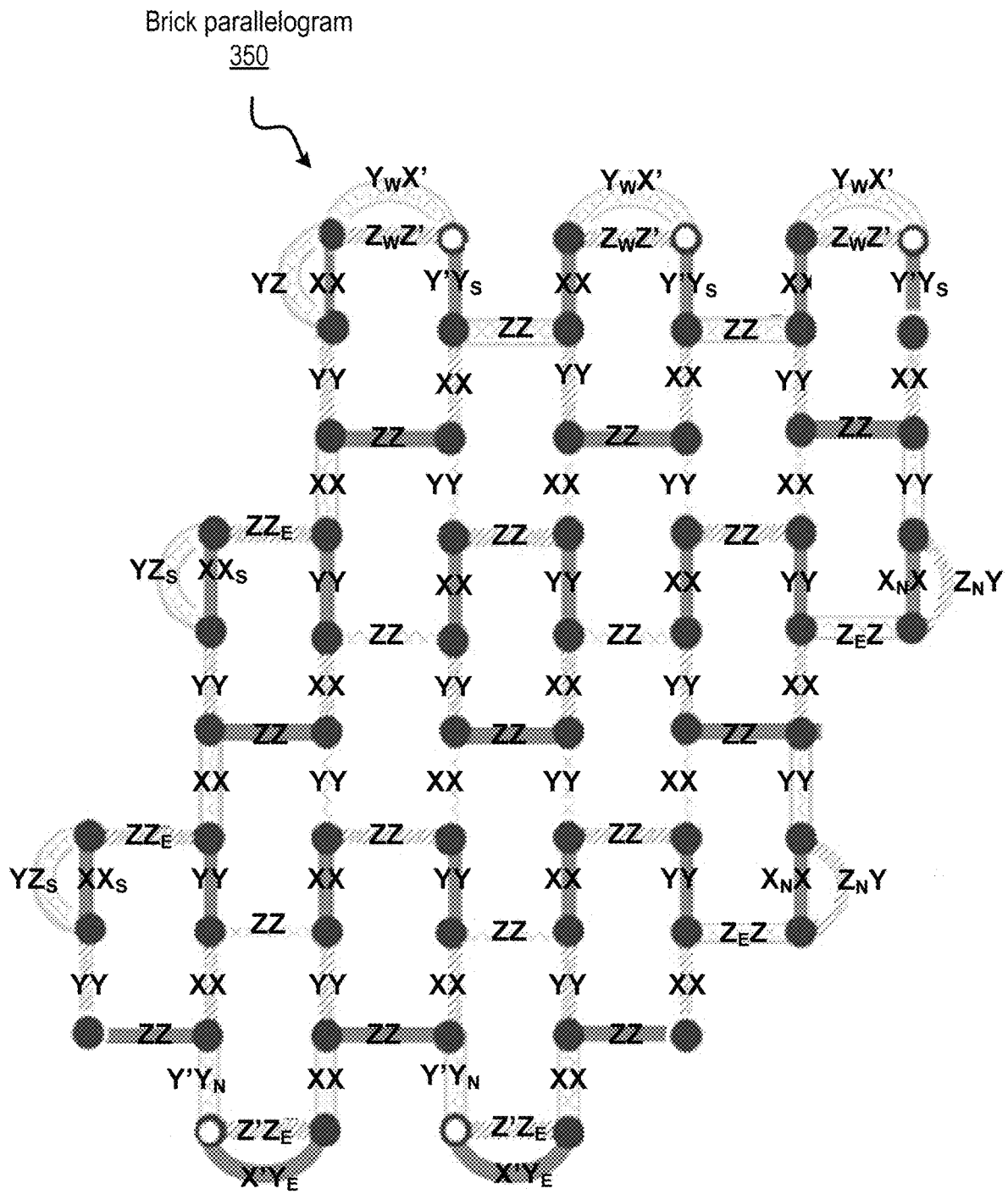
FIG. 5B illustrates two-qubit Pauli measurements superimposed on the corresponding edges of the brick parallelogram, according to one embodiment.
Figure 5C:
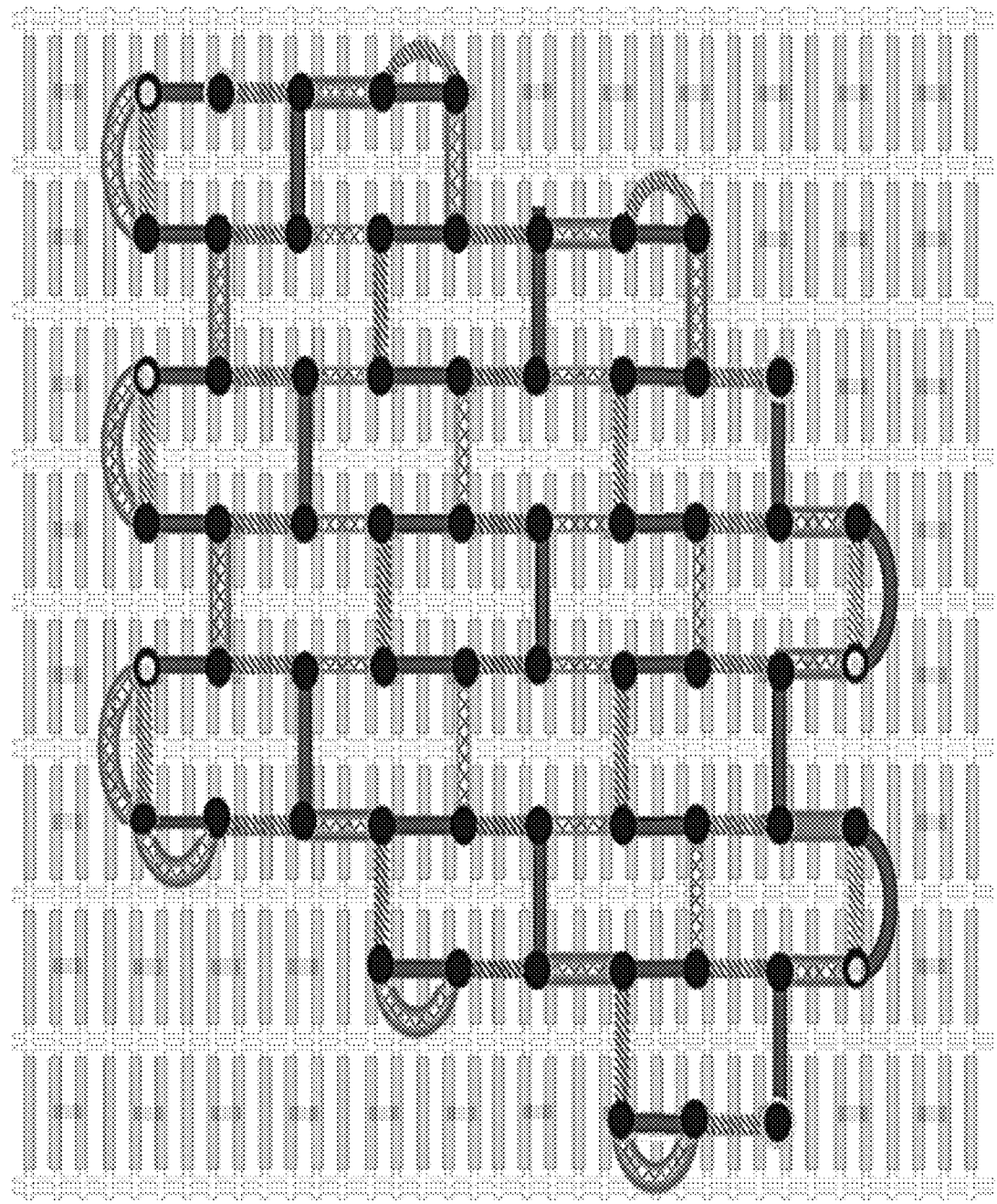
FIG. 5C illustrates the brick parallelogram superimposed on the tetron lattice, according to one embodiment.
Figure 5D:
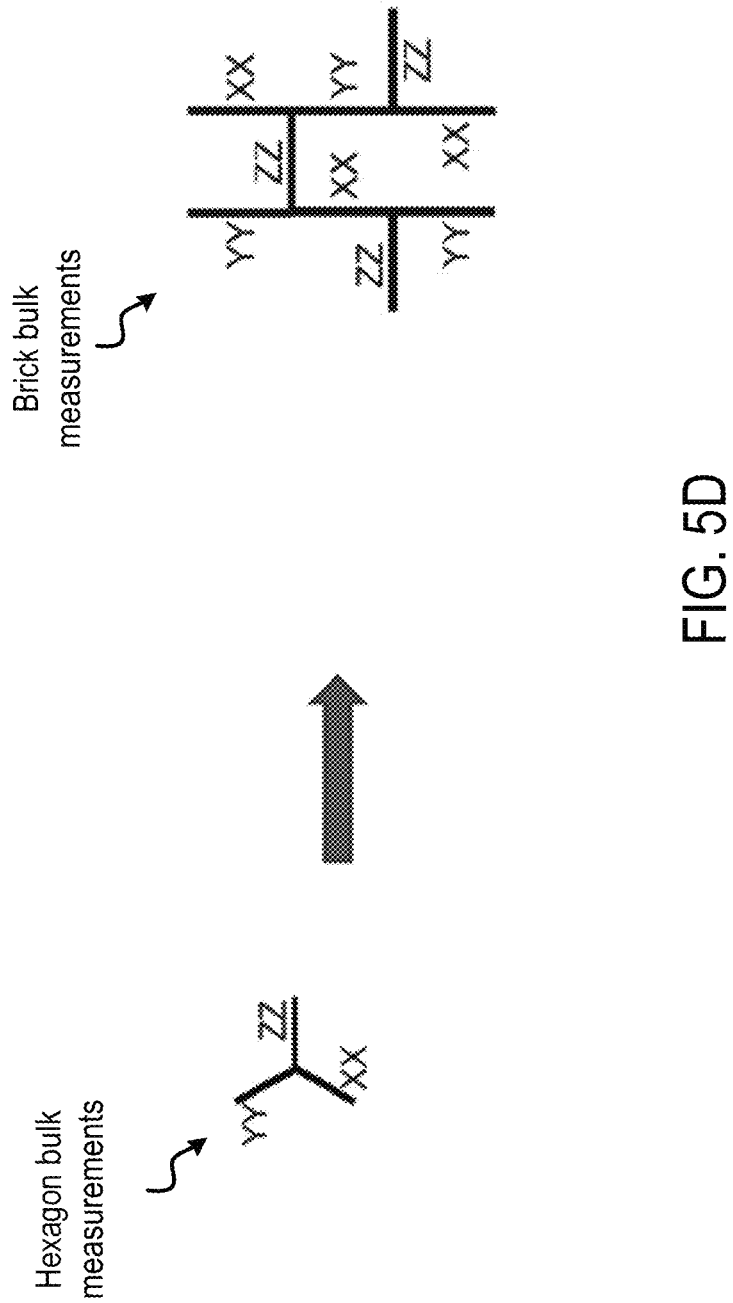
FIG. 5D illustrates a mapping of hexagon edges to brick edges, according to one embodiment.

FIG. 4B illustrates a nonlimiting mapping of the edges of the hexagon brick 300 mapping to respective bulk measurement loops. Note that all horizontal edges correspond to ZZ measurements, as illustrated in FIGS. 4B and 5D. Additionally, the vertical edges in the hexagon bricks 300 (see., e.g., FIGS. 4A and 5D) are either XX or YY measurements. According to the nonlimiting example of the honeycomb bulk code disclosed herein (see., e.g., FIGS. 7A-F), in the physical layout, ZZ measurements are chosen to be $\mathcal{Z}_W\tilde{\mathcal{Z}}_E$, where the subscripts W/E indicate 'West/East' indicating the left/right qubit islands, respectively. Similarly, the XX and YY measurements are chosen to be $\mathcal{X}_N\tilde{\mathcal{X}}_S$ and $\mathcal{Y}_N\mathcal{Y}_S$, respectively. Here, the subscripts N/S indicate 'North/South' referring to the top/bottom qubit islands, respectively. Thus, the bulk code operation only uses natural two qubit measurements, which are expected to have similar fidelity to single-qubit measurements.

Floquet codes are so-named because they encode a dynamical logical qubit and can thus be related to Floquet theory, the study of periodically driven systems. The measurements implementing the code are done over a series of repeating time steps. Consequently, the logical operators of the code change between time steps. Details of the codespace can be found in U.S. patent application Ser. No. 17/364,812, filed Jun. 30, 2021 and U.S. Provisional Patent Application 63/254,875, filed Oct. 12, 2021, both of which are incorporated herein by reference in their entirety. Here, it is sufficient to note that implementing the code over multiple time steps is an inherent property of Floquet codes, rather than a consequence of implementing the code on a particular qubit architecture.

The Floquet code can be understood as having two parts: a bulk measurements/code and the code/measurements applied along the boundaries. By applying the Floquet code on a torus, the code simplifies because the boundary part of code can be avoided. Accordingly, first the basic operation of the Floquet code is reviewed on a torus (i.e., a system without boundaries). The Floquet code can be implemented on any lattice with degree-3 vertices that is face-three-colorable, which is the case for both the honeycomb lattice and the square-octagon lattice.

Here, the bulk code is described for the honeycomb lattice, and the square-octagon lattice is described subsequently. As illustrated in FIG. 5A, e.g., qubits lie on the vertices of the lattice and edges denote two-qubit measurements. For the honeycomb lattice, a code implementation is chosen such that every horizontal edge corresponds to a ZZ measurement, edges with positive slope correspond to XX measurements, and edges with negative slope correspond to YY measurements, as illustrated in FIG. 5D, for example. Each qubit is involved in all three types of measurements (with different neighboring qubits). The code is implemented in three repeating time steps: (1) perform all measurements corresponding to crosshatched edges, then (2) those corresponding to diagonal-line edges, then (3) those corresponding to grey edges, then repeat. The bulk two-qubit measurements map from the honeycomb lattice to the brick corresponding to tetrons as illustrated in FIG. 5D.

Returning to FIG. 4A, the honeycomb lattice and the 4.8.8/square-octagon lattice (discussed below) map to this tetron array 200 using vertical bricks 300. Each plaquette with 2n sides maps to a rectangle with a height of n qubits. For both the honeycomb lattice and the square-octagon lattice (discussed below), the Floquet code is implemented over six timesteps. These six steps are illustrated in FIGS. 7A-F for the honeycomb lattice, and are illustrated in FIGS. 7A-F for the 4.8.8/square-octagon lattice.

Generally, The honeycomb lattices map to the tetron array using vertical bricks such that each 2n-gon (e.g., n=3 for a hexagon) corresponds to a rectangle of height n. With this mapping, the honeycomb codes in the bulk use a subset of the highest fidelity two-qubit measurements: XX and YY measurements between vertically adjacent qubit islands, and ZZ between horizontally adjacent qubit islands. To implement measurements on neighboring pairs of vertically adjacent qubits without their corresponding loops intersecting, measurements are performed using two columns of semiconductor separating each column of qubits. Thus, the implementation of the honeycomb Floquet codes on this physical layout does not require any auxiliary qubits or extra time steps, a significant advantage compared to codes built out of higher-weight stabilizers.

As discussed with respect to FIG. 1B, the honeycomb code can be applied on a torus with periodic boundary conditions, but in practice, the honeycomb code may be applied to a planar structure, in which case the boundary conditions present special cases. FIGS. 5A-C illustrates an example of the boundary conditions applied for a planar structure being mapped to respective bricks (i.e., a brick parallelogram 350), which correspond to a tetron lattice 200. The nonlimiting example of FIG. 5A shows mapping of the hexagon parallelogram 150 to a brick parallelogram 350.

FIG. 5C shows how the brick parallelogram 350 maps to the tetron lattice 200 by superimposing the brick parallelogram 350 over the tetron lattice 200. FIG. 5D illustrates an example for mapping the bulk measurements from the hexagons to the bricks. The boundary conditions present additional challenges, especially in view of the limited resources for performing measurements. FIG. 5B illustrates the measurements applied between respective tetrons, including the boundaries. To implement the boundary conditions depicted for the code patches in the hexagon parallelogram 150 (see, e.g., FIG. 1B) additional measurements are used in addition to the XX, YY, and ZZ measurements of the bulk honeycomb code.

To implement the Floquet codes on a planar surface, there are peripheral regions of the lattice in which are implemented boundary measurements to define a logical qubit in some 'patch' of the surface. The boundary conditions for the honeycomb code are summarized here.

Figure 7A:
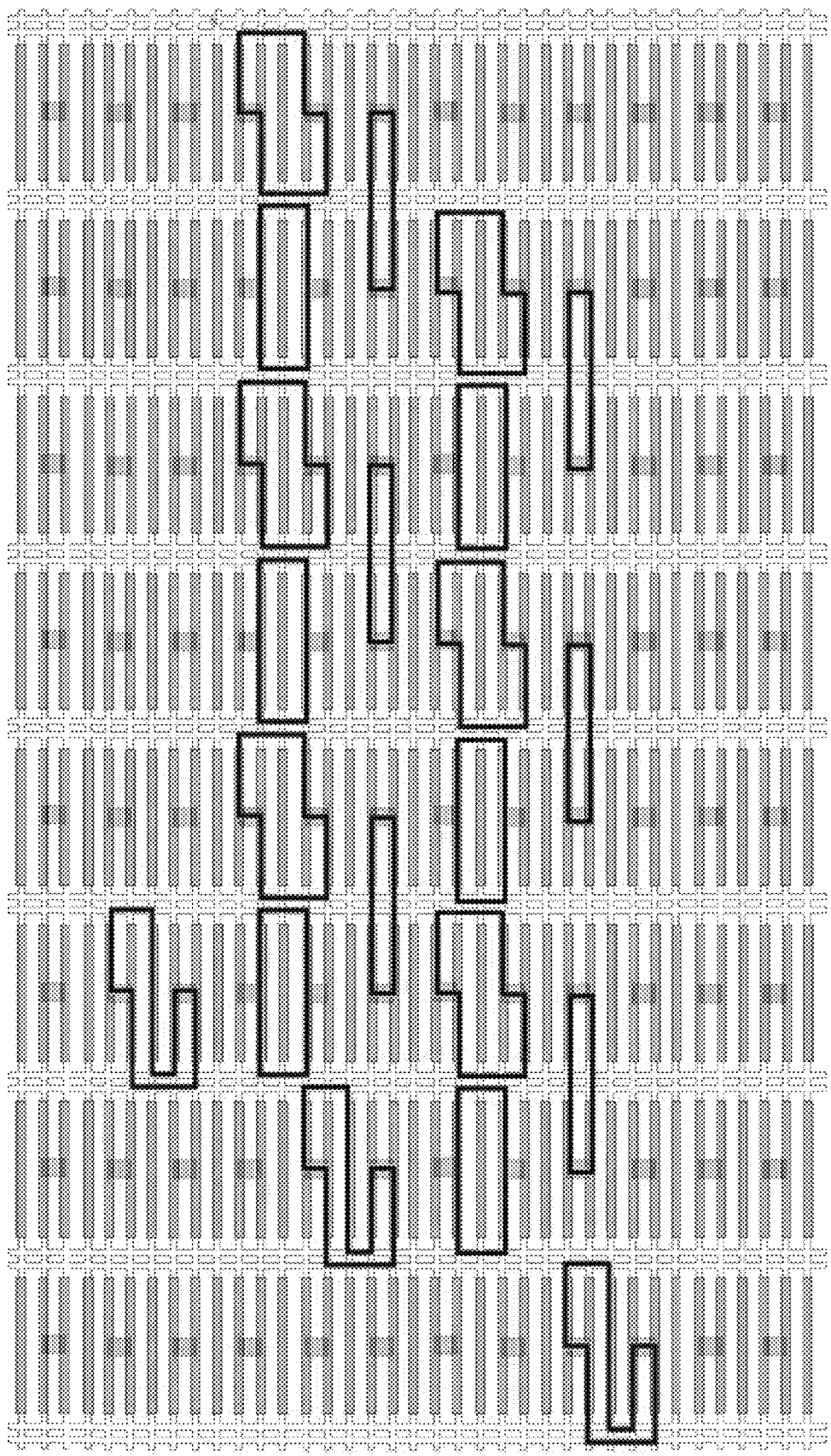
FIG. 7A illustrates an example of a first step of a honeycomb code for vertical bricks, according to one embodiment.
Figure 7B:
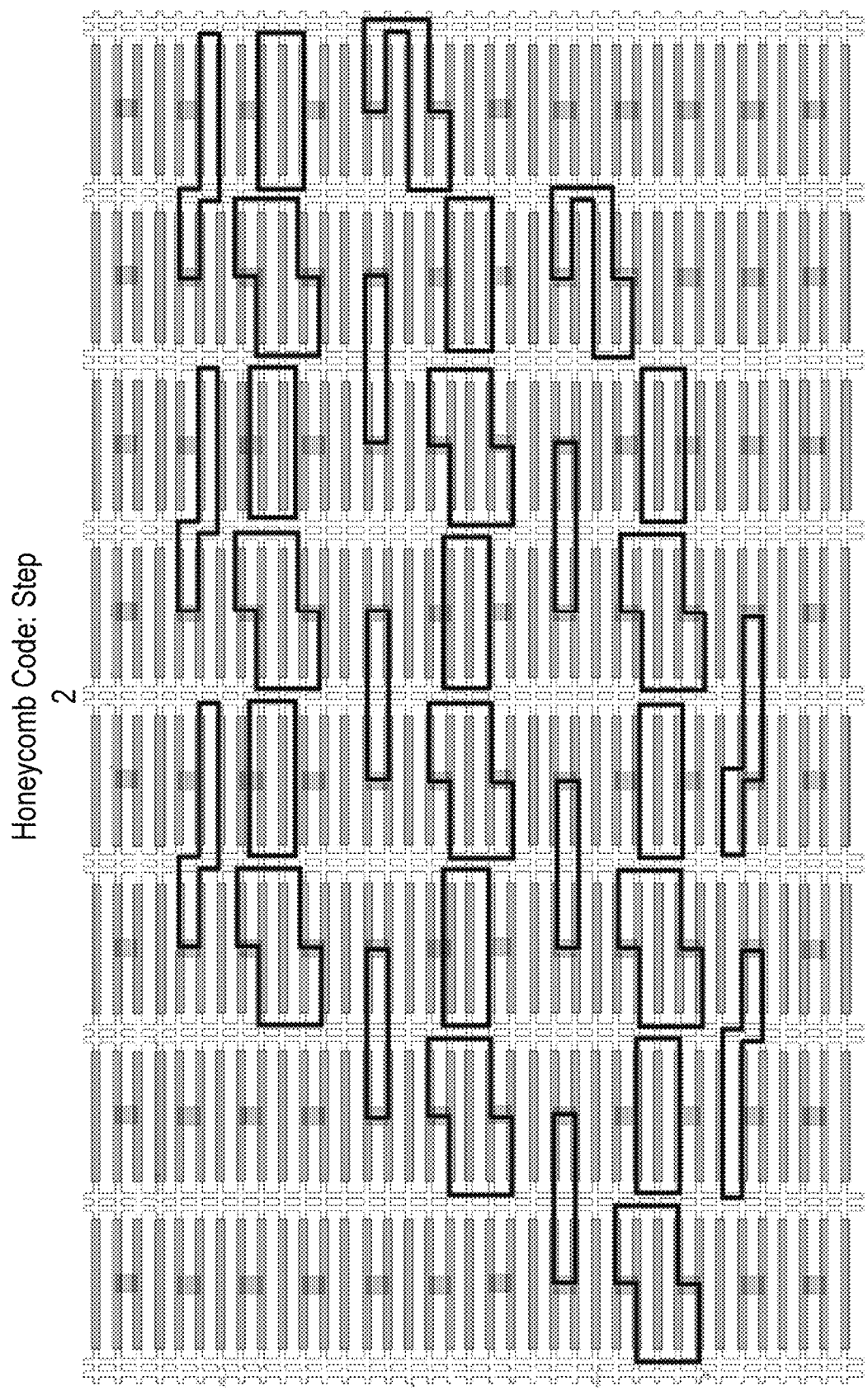
FIG. 7B illustrates an example of a second step of a honeycomb code for vertical bricks, according to one embodiment.
Figure 7C:
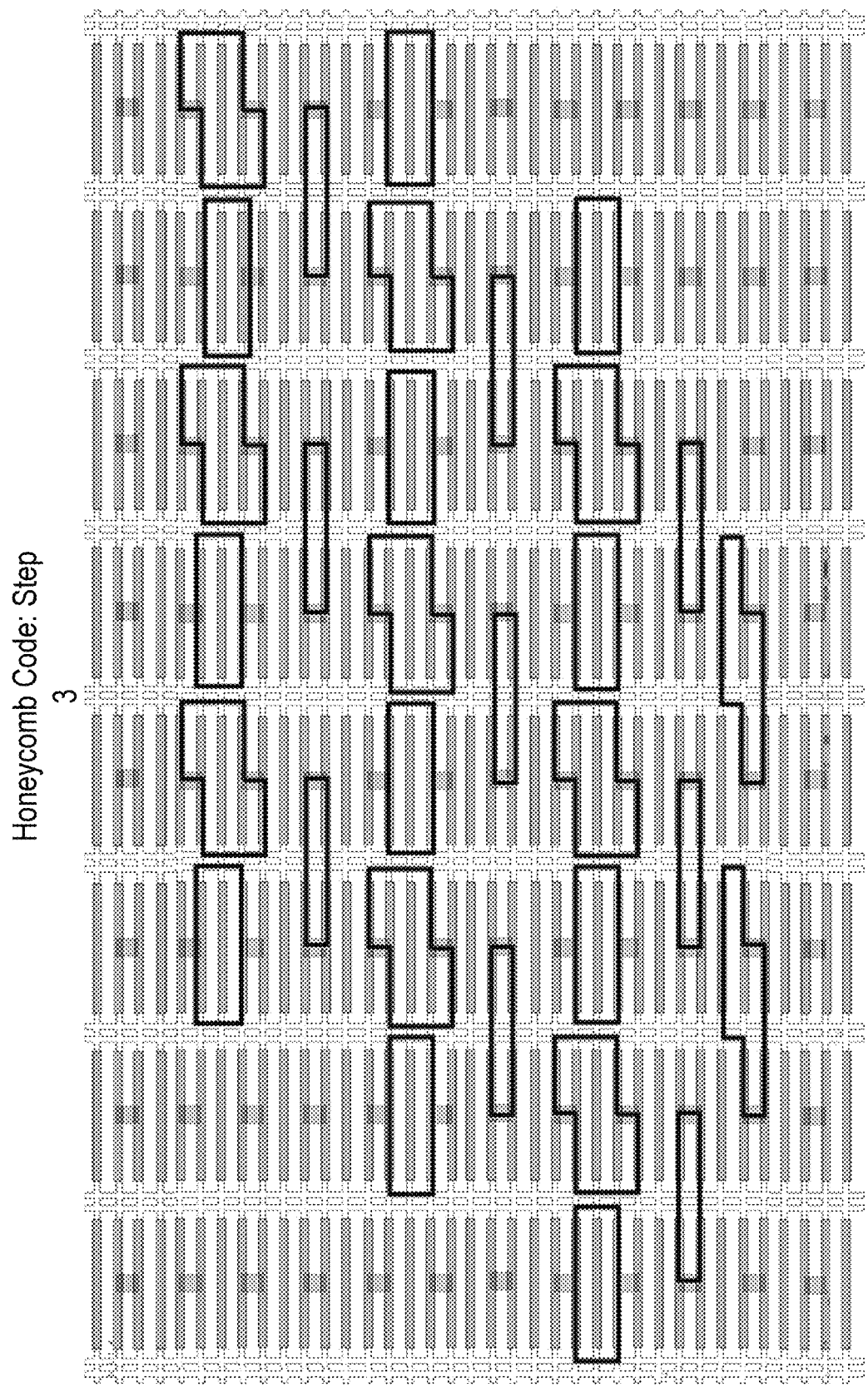
FIG. 7C illustrates an example of a third step of a honeycomb code for vertical bricks, according to one embodiment.
Figure 7D:
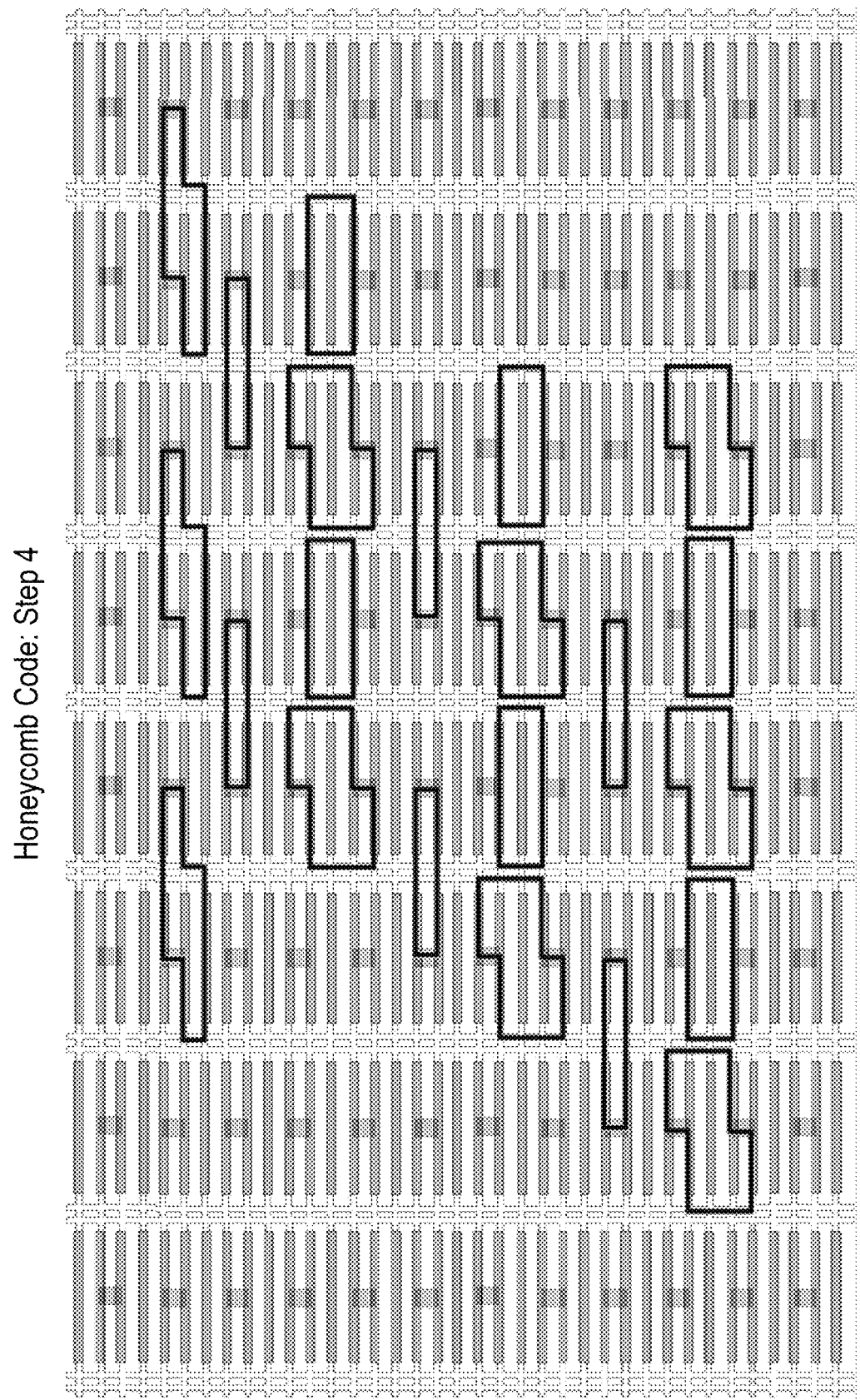
FIG. 7D illustrates an example of a fourth step of a honeycomb code for vertical bricks, according to one embodiment.
Figure 7E:
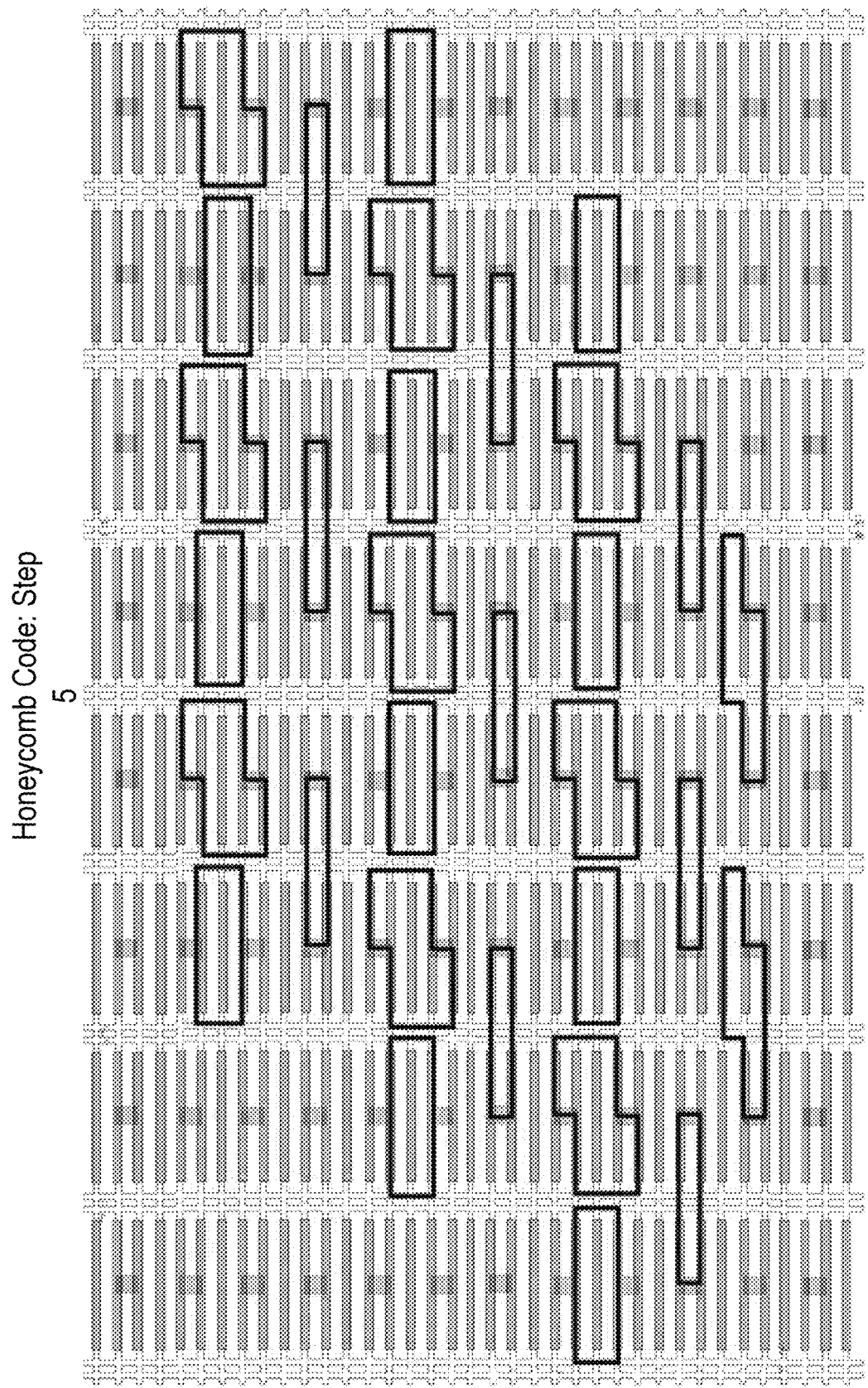
FIG. 7E illustrates an example of a fifth step of a honeycomb code for vertical bricks, according to one embodiment.
Figure 7F:
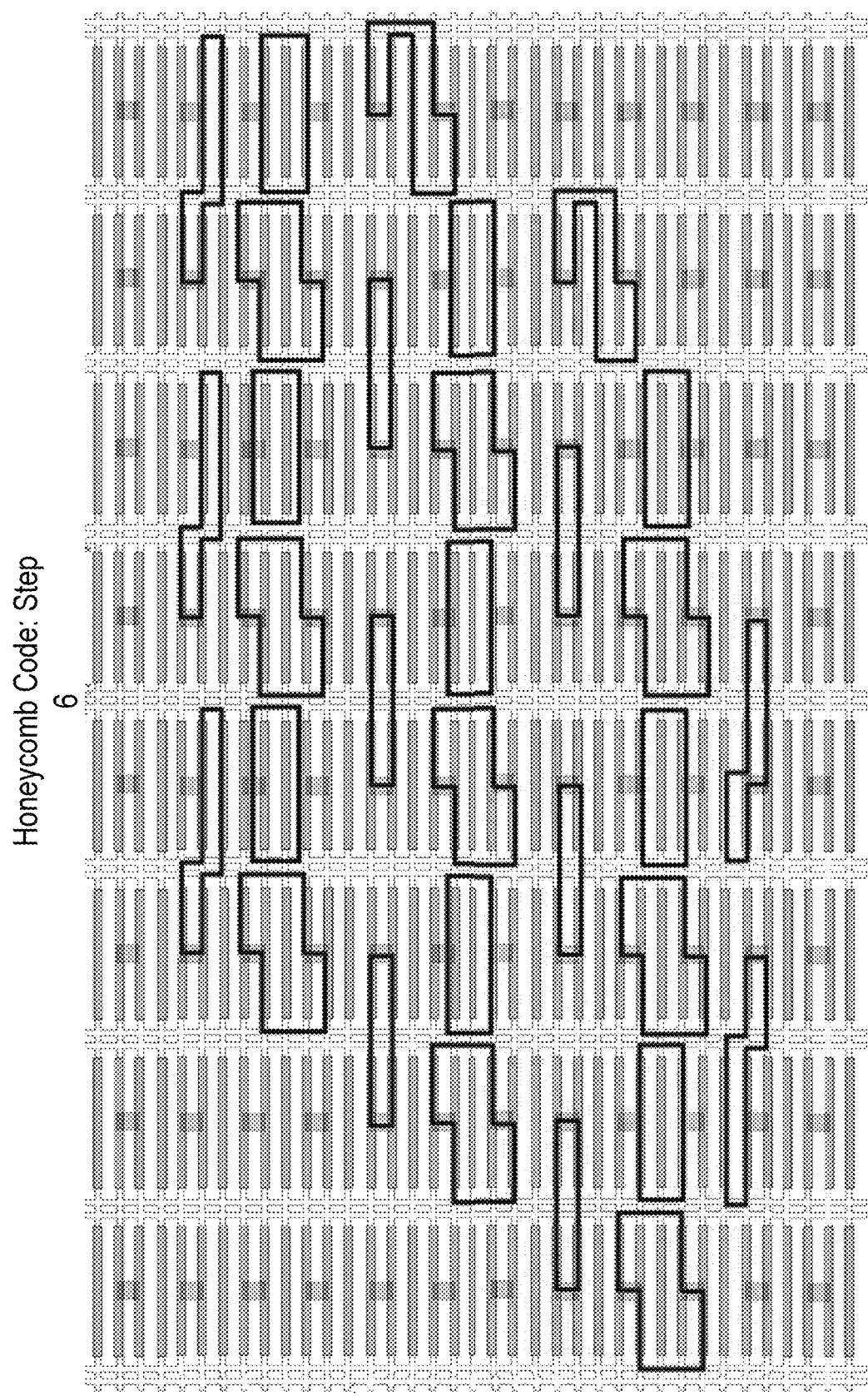
FIG. 7F illustrates an example of a sixth step of a honeycomb code for vertical bricks, according to one embodiment.
Figure 7G:
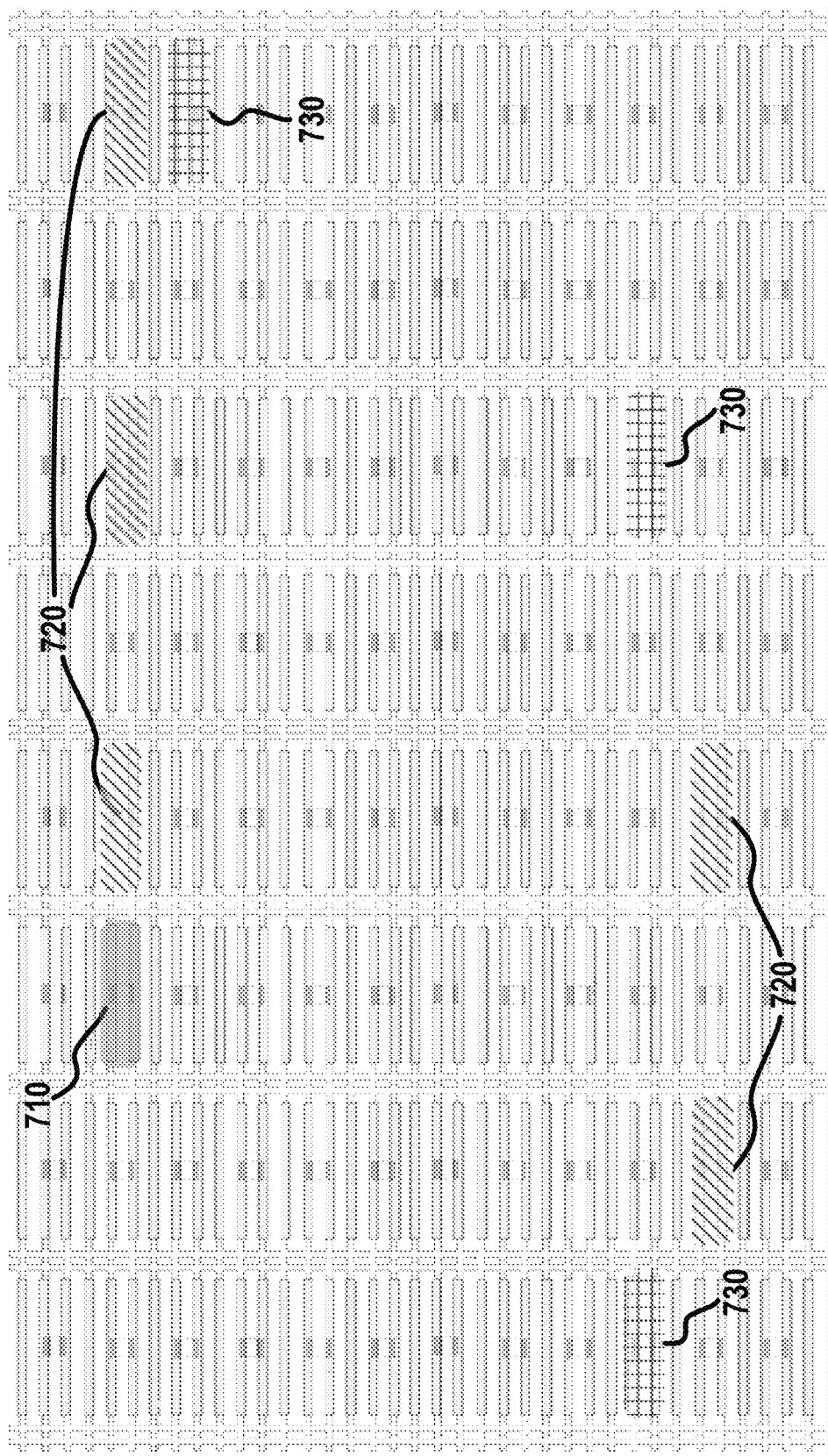
FIG. 7G illustrates an example of locations of distinguished qubits on a tetron lattice for a honeycomb code for vertical bricks, according to one embodiment.

First, all but four qubits are "degree-3." That is, all the degree-3 qubits participate in three 2-qubit Pauli measurements so that the qubit is measured in each Pauli basis. The distinguished qubits are either "degree-2," meaning they only participate in two 2-qubit Pauli measurements and thus are not measured in one of the Pauli bases, or "degree-4," meaning they participate in four 2-qubit Pauli measurements so that one of the Pauli bases is measured twice. The distinguished qubits are shown in FIGS. 7H-I, in which qubits 730 are degree-2 and qubit 710 is degree-4.

Along a boundary segment, each qubit is involved in two boundary and one bulk measurement. All the bulk measurements along a segment having the same texture/pattern are implemented in the same time step. After a time step implementing the measurements for a first texture/pattern, the boundary measurements are applied in the subsequent times steps for the remaining two textures/patterns. Spatially, the edges (see, e.g., FIGS. 7H-I) along the boundary are arranged such that the boundary measurements alternate between two textures/patterns. That is, if a first edge along the boundary a first texture/pattern then the nearest neighbor edge along the boundary will be a second texture/pattern from the two remaining textures/patterns. And the edges along the boundary for a given side of the parallelogram will alternate between the first texture/pattern and the second texture/pattern, as illustrated in FIG. 7H. For example, the top and bottom boundary segments in FIG. 7H are formed from alternating gray and crosshatched edges. Similarly, the left and right boundary segments in FIG. 7H are formed from alternating diagonal-striped and crosshatched edges.

Whereas, the bulk measurements can be performed in a repeating measurement sequence having three steps, with the addition of the boundaries, the measurement sequence is modified to have six time steps. This modification avoids measuring a logical operator along the boundary. At most half of the distinguished color boundary measurements are measured at a given time step. For example, FIG. 1B shows the distinguished color boundary measurements as including the black-yellow dashed edges 152, the striped black-yellow edges 156. Note yellow and crosshatched are the same, and blue is the same as diagonal-striped.

Figure 7H:
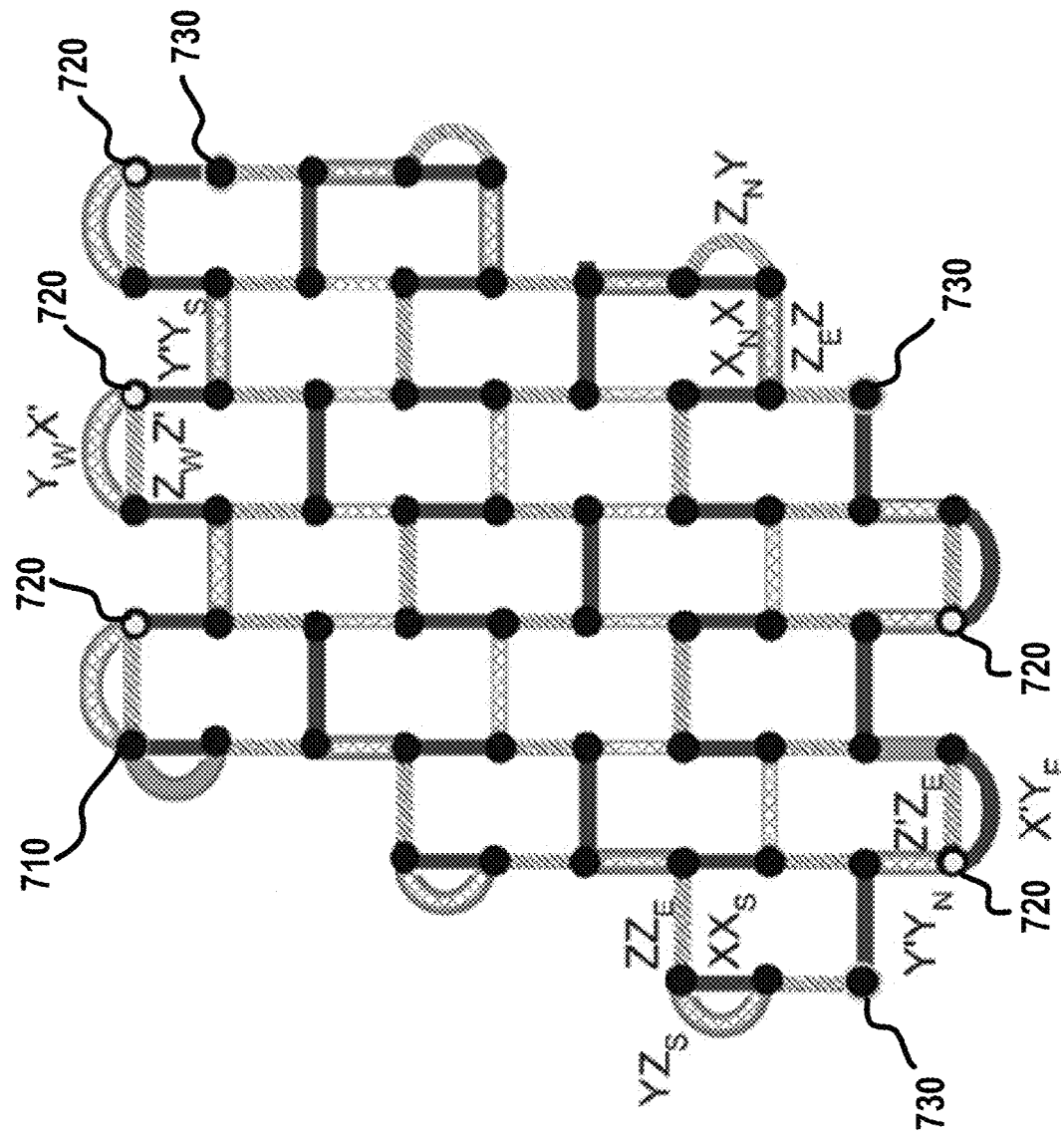
FIG. 7H illustrates an example of locations of distinguished qubits on a tetron lattice for a honeycomb code for vertical bricks, according to one embodiment.
Figure 7I:
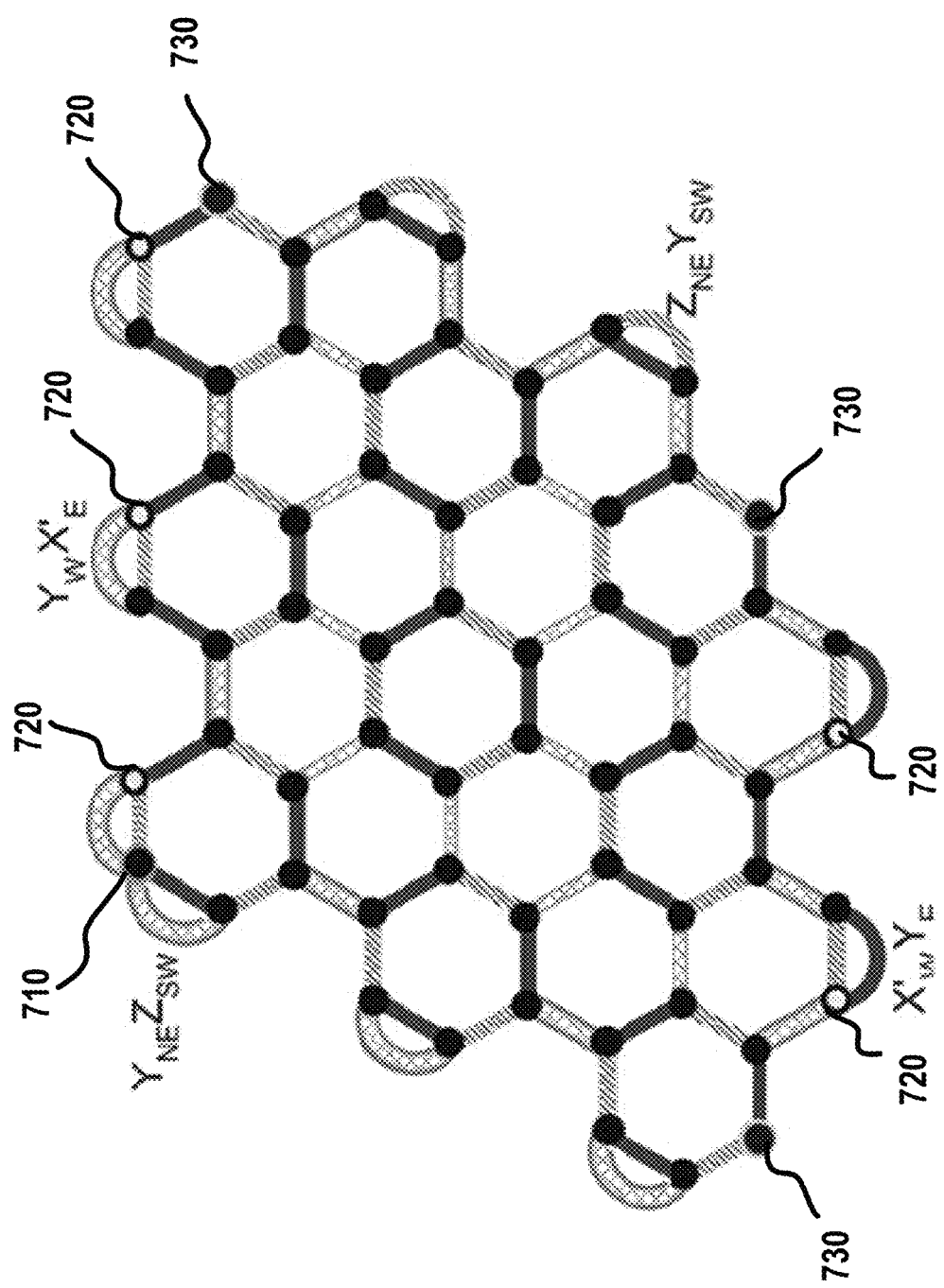
FIG. 7I illustrates Pauli measurements along a boundary of a parallelogram patch for a honeycomb Floquet code, according to one embodiment.

For the boundary patches shown in the nonlimiting embodiment shown in FIG. 7H (and shown more particularly in FIGS. 7A-F), the sequence is: (1) measure all crosshatched bulk edges and the edges crosshatched along the left and right boundaries, (2) measure all diagonal-striped edges, (3) measure all solid grey edges, (4) measure all crosshatched bulk edges and the crosshatched edges along top and bottom boundaries, (5) measure all solid grey edges, (6) measure all diagonal-striped edges.

In FIGS. 5C and 7G-I are shown a patch encoding of a logical qubit of the Floquet honeycomb. The honeycomb patch has three degree-2 qubits 730 and one degree-4 qubit 710. These patches can be extended by following the pattern to encompass more bulk plaquettes while respecting the boundary rules summarized above.

To implement these patches on the physical layout of tetrons, additional measurement loops are used beyond the natural set of 2-qubit measurements used in the bulk. For the qubits 720 in FIGS. 7G-I, the encoding is modified to use a primed basis in which the boundary qubits use the Pauli measurements $i\gamma_1\gamma_2 = i\gamma_3\gamma_4 = \sigma'_z$, $i\gamma_1\gamma_4 = i\gamma_2\gamma_3 = \sigma'_y$, $i\gamma_1\gamma_3 = -i\gamma_2\gamma_4 = \sigma'_x$.

That is, the MZMs that encode X and Z are swapped. Thus, rather than participating in horizontal ZZ and XX measurements, the latter of which requires two coherent links, these qubits participate in horizontal ZZ, XX, (i.e., XZ and ZX) measurements, each of which requires a single coherent link. The qubits 720, as shown in FIGS. 7G-I, are encoded in the primed basis.

In FIGS. 7A-F, the six step measurement sequence for the honeycomb Floquet codes are shown in on these preferred physical patches. The physical tetron layout supports arbitrary code distance implementations. For example, because the coherent links are included throughout, which qubits lay on the boundary can be changed. Beyond their utility in boundary measurements, the coherent links are also useful for single qubit characterization, as illustrated in FIGS. 3A-C.

It is noted that the patches indicated can be used to tile the plane, which is useful when doing lattice surgery on the honeycomb code.

Figure 6A:
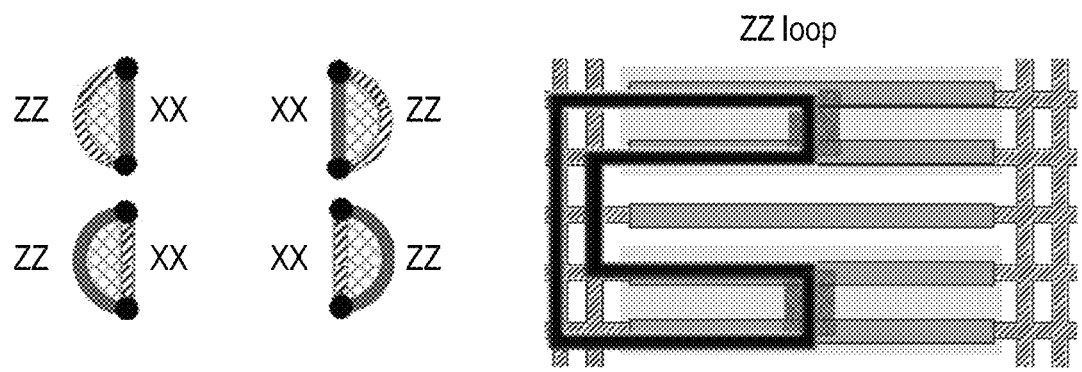
FIG. 6A illustrates a two-qubit ZZ Pauli measurement for left and right boundaries, according to one embodiment.
Figure 6B:
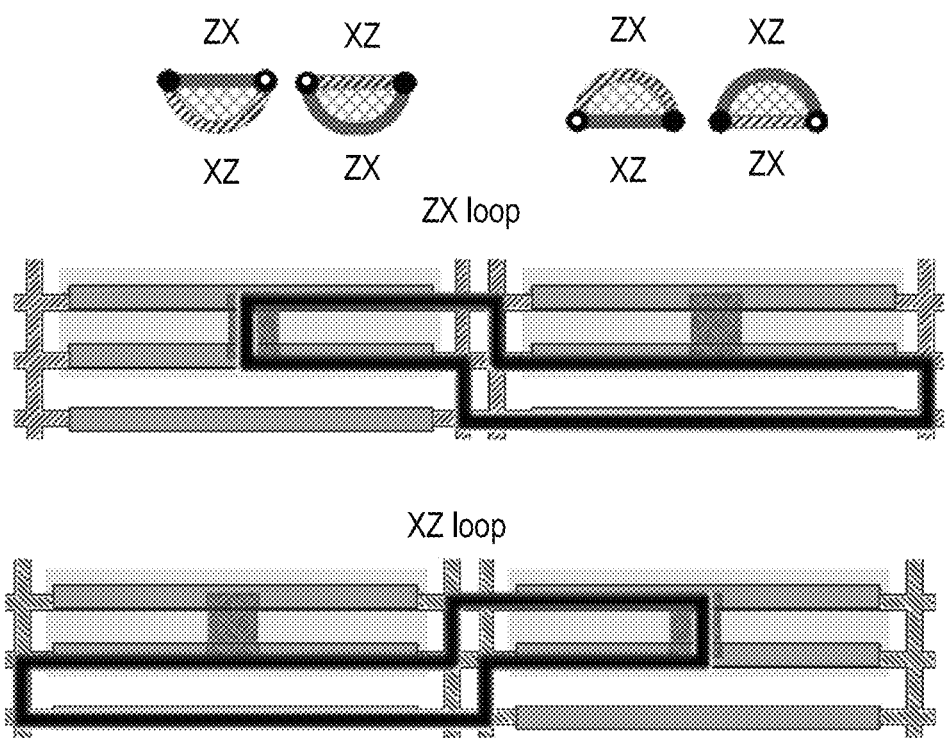
FIG. 6B illustrates two-qubit ZX and XZ Pauli measurements for top and bottom boundaries, according to one embodiment.

FIGS. 6A-G illustrates some of the additional measurement loops that are introduced for additional boundary measurements used for the honeycomb Floquet code. The measurement loops are shown for a subset of the boundary plaquettes, the remaining boundary measurements are straightforward extensions of those depicted here. FIG. 6A illustrates 2-gons along vertical boundaries in which ZZ loops are used between vertically adjacent qubit islands. These ZZ loops can be implemented using both semiconducting columns to the left or right of the qubit. These boundary measurements can be found, e.g., in the 4.8.8 square-octagon lattice (discussed below) along the left and right boundaries. FIG. 6B illustrates 2-gons along horizontal boundaries that use ZX and XZ between horizontally adjacent qubit islands, which can be implemented using the coherent links above or below the qubit islands. The white dot indicates that, for convenient physical implementation, the role of X and Z operators are swapped for that qubit as compared to the bulk. For example, a horizontal edge is assigned ZZ in the bulk, but becomes either XZ or ZX when an endpoint is marked by the white dot. These boundary measurements can be found, e.g., in the 4.8.8 square-octagon lattice (discussed below) along the top and bottom boundaries.

Figure 6C:
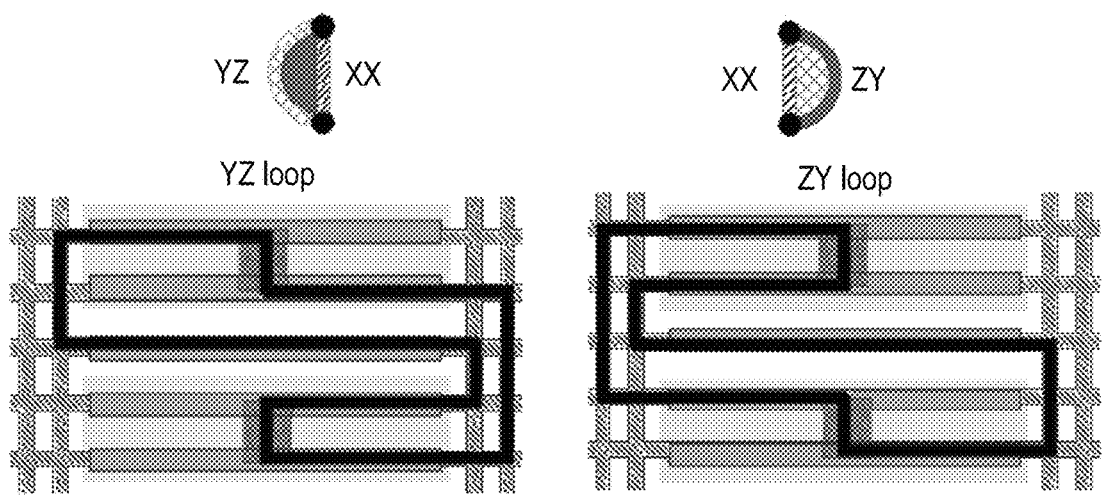
FIG. 6C illustrates two-qubit YZ and ZY Pauli measurements for left and right boundaries, according to one embodiment.
Figure 6D:
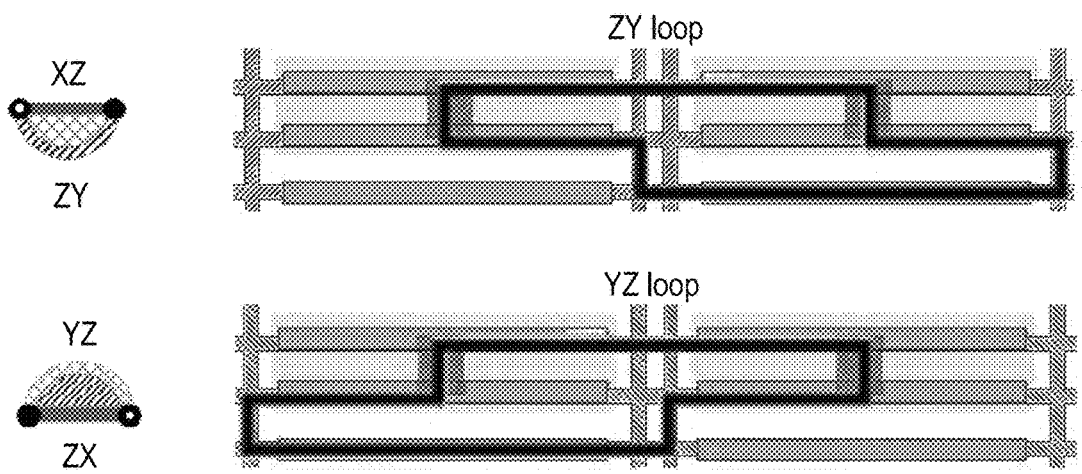
FIG. 6D illustrates two-qubit YZ and ZY Pauli measurements for top and bottom boundaries, according to one embodiment.
Figure 6E:
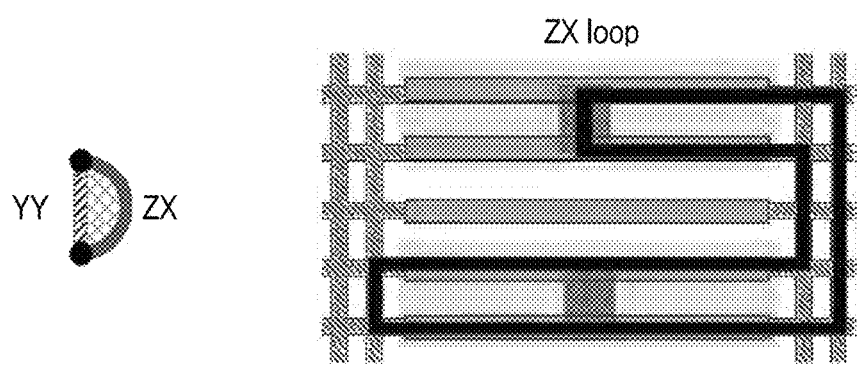
FIG. 6E illustrates a two-qubit ZX Pauli measurement for a right boundary, according to one embodiment.
Figure 6F:
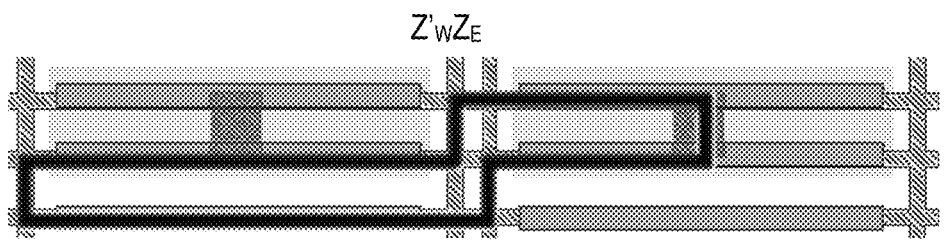
FIG. 6F illustrates a two-qubit $Z'_W Z_E$ measurement, according to one embodiment.
Figure 6G:
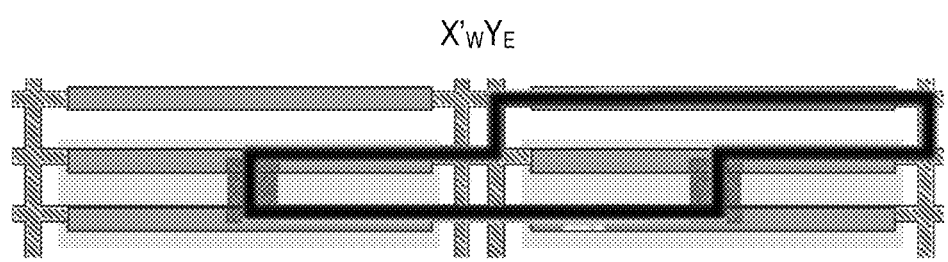
FIG. 6G illustrates a two-qubit $X'_W Y_E$ measurement, according to one embodiment.
Figure 6H:
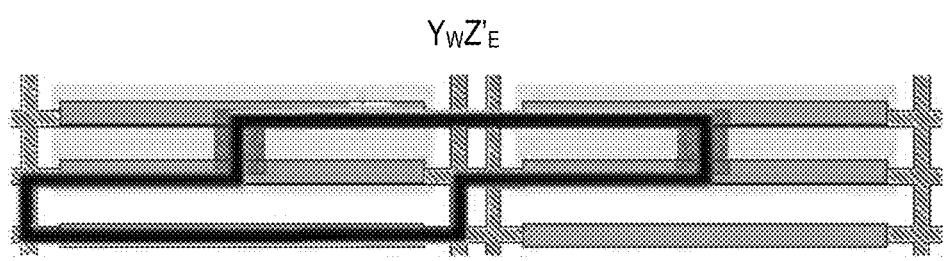
FIG. 6H illustrates a two-qubit $Y_W Z'_E$ measurement, according to one embodiment.
Figure 6I:
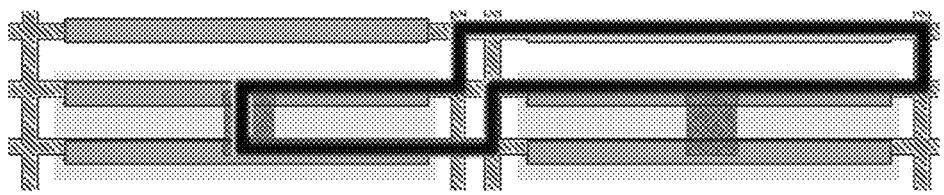
FIG. 6I illustrates a two-qubit $Z_W Z'_E$ measurement, according to one embodiment.
Figure 6J:
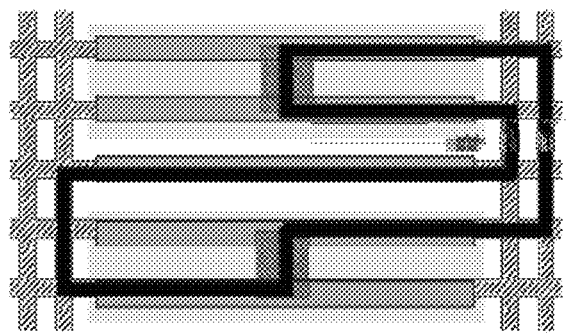
FIG. 6J illustrates a two-qubit $Z_N Y_S$ measurement, according to one embodiment.
Figure 6K:
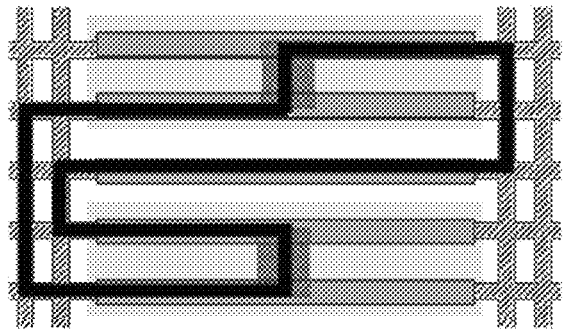
FIG. 6K illustrates a two-qubit $Y_N Z_S$ measurement, according to one embodiment.

FIGS. 6C-E illustrates additional boundary measurements for the honeycomb Floquet code. FIG. 6C shows 2-gons along vertical boundaries that use YZ or ZY measurements between vertically adjacent qubit islands, which can be implemented using both semiconducting columns to the left or right of the qubit and the coherent link between the qubits. These boundary measurements can be found, e.g., in the honeycomb lattice along the left and right boundaries. FIG. 6D shows 2-gons along horizontal boundaries that use ZY and XZ measurements or that use YZ and ZX measurements between horizontally adjacent qubit islands. These can be implemented using the coherent links above or below the qubit islands. Like in FIG. 6B, the white dot indicates that the role of X and Z operators are swapped for that qubit as compared to the bulk. Note that XZ and ZX measurement loops are shown in FIG. 6B. These boundary measurements can be found, e.g., in the honeycomb lattice along the top and bottom boundaries. FIG. 6E shows a 2-gon along vertical boundaries that use ZX measurements between vertically adjacent qubit islands, which can be implemented using both semiconducting columns to the left or right of the qubit island and the coherent link separating the qubit islands. These boundary measurements can be found, e.g., in the honeycomb lattice along the right boundaries.

FIGS. 6F-K illustrates additional boundary measurements for the Floquet code. Many of these additional boundary measurements are used in the honeycomb Floquet code, used in the square-octagon Floquet code, or used in both the honeycomb Floquet code and the square-octagon Floquet code.

For the honeycomb code, extending the bulk measurement pattern to the boundaries requires measuring ZY and YZ between vertically adjacent qubit islands, and YX and XY between horizontally adjacent qubit islands. The new vertical measurements each make use of a single coherent link, as shown in FIG. 6C. The new pair of horizontal measurements each require two coherent links; these can be avoided by modifying the measurement pattern for one of the qubits forming 2-gons along horizontal boundaries (e.g., from ZZ and XY along the bottom boundary 2-gons to XZ and ZY, and from ZZ and YX along the top boundary to ZX and YZ as shown in FIGS. 6C-D). There are multiple choices for how to modify these boundary conditions that introduce the same number of one-coherent link measurements.

FIGS. 7A-F show the full measurement circuit for the honeycomb Floquet code on the physical layout.

Figure 7J:
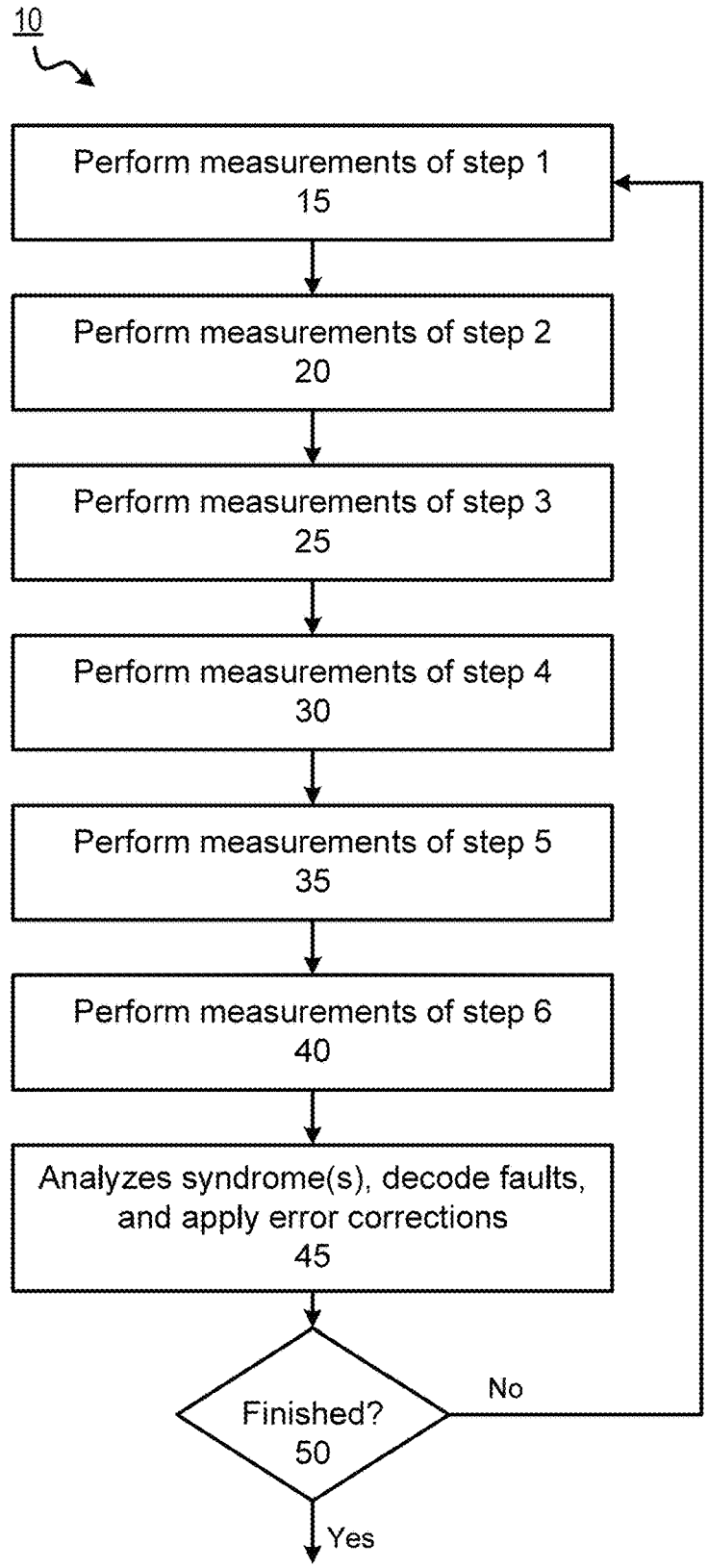
FIG. 7J illustrates a flow diagram for an example of a method for performing a Floquet code, according to one embodiment.

FIG. 7J illustrates a method 10 of performing the Floquet code. Method 10 works for both the hexagon configuration and the square-octagon configuration, as well as for other configurations. FIGS. 7A-F are specific for the honeycomb Floquet code, which is performed using hexagon configuration. The description provided here assumes the honeycomb Floquet code and a hexagon configuration, but it easily generalizes to other Floquet codes and configurations. In the first step 15 of method 10, the two-qubit measurements shown in FIG. 7A are performed on the tetrons lattice 200. In the second step 20 of method 10, the two-qubit measurements shown in FIG. 7B are performed on the tetrons lattice 200. In the third step 25 of method 10, the two-qubit measurements shown in FIG. 7C are performed on the tetrons lattice 200. In the fourth step 30 of method 10, the two-qubit measurements shown in FIG. 7D are performed on the tetrons lattice 200. In the fifth step 35 of method 10, the two-qubit measurements shown in FIG. 7E are performed on the tetrons lattice 200. In the sixth step 40 of method 10, the two-qubit measurements shown in FIG. 7F are performed on the tetrons lattice 200. In the seventh step 45 of method 10, the measurement results from one or more of the previous steps are analyzed to determine if there were any errors. Step 45 can be performed after any and/or each of the measurement steps. If one or more errors occurred, the measurement results can then be decoded to determine which errors occurred, and what unitary operations are to be performed on the qubits to correct the errors. As indicated by step 50, this process can be repeated until error correction is no longer needed, and the process is finished.

As discussed above, the Floquet code can also be realized on a square-octagon lattice (also referred to as a 4.8.8 lattice). The Floquet code on a square-octagon lattice is now discussed.

Figure 8A:
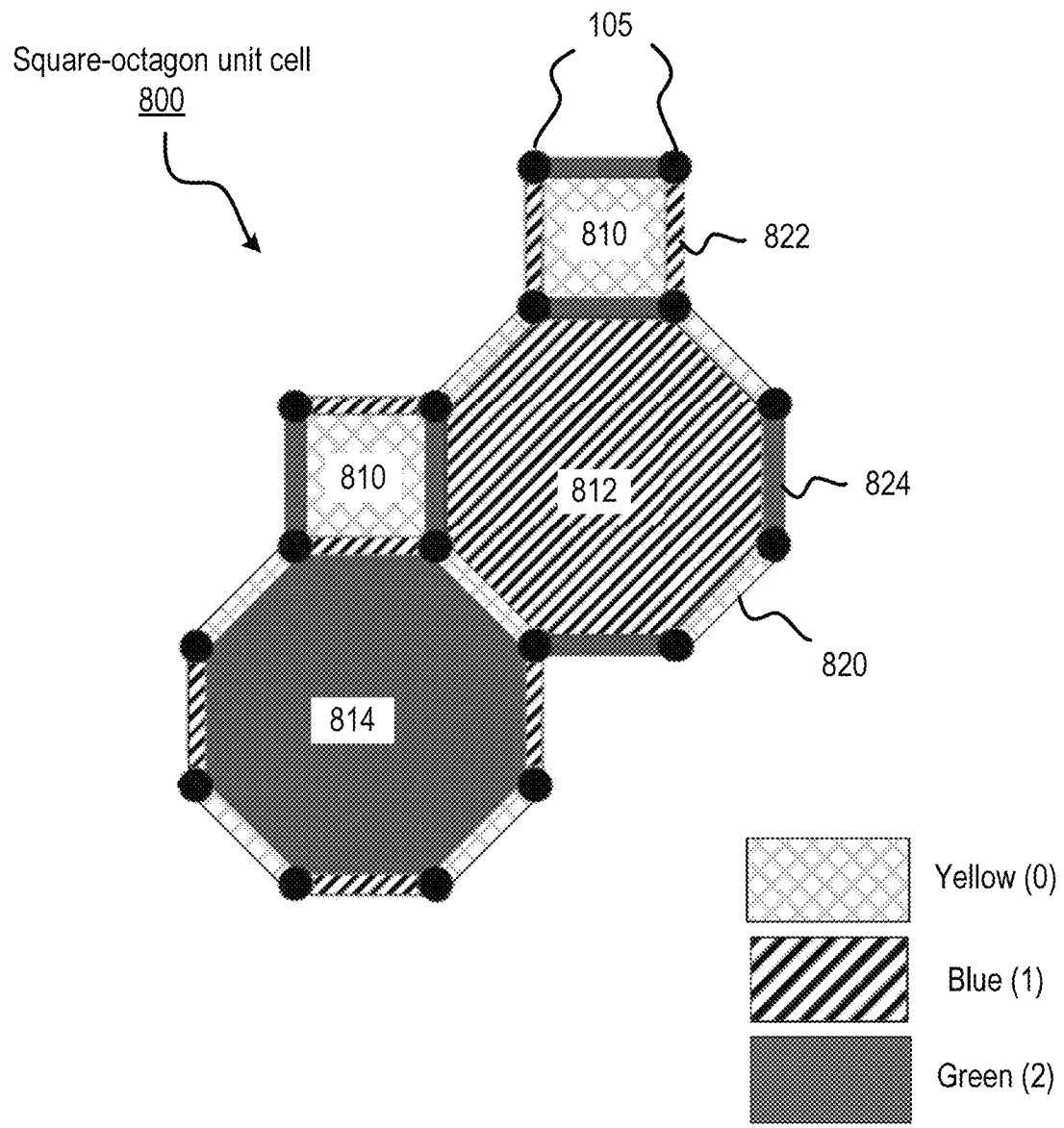
FIG. 8A illustrates an example of a square-octagon (also called 4.8.8 lattice) unit cell, according to one embodiment.

Like the honeycomb lattice, the 4.8.8 lattice is three-colorable and can therefore be used to construct a similar family of Floquet codes. The basic unit is the unit cell 800, which is shown in FIG. 8A, and the unit cell 800 can be used to tile the torus. Qubits are again placed on the vertices of the lattice, each of which is incident to three edges of different labels/colors (e.g., the three edges can be identified by the labels/colors blue, yellow, green). The two-qubit measurements can be assigned with XX measurements assigned to each vertical edge (colored green or blue), YY measurements assigned to each diagonal edge (colored yellow), and ZZ measurements assigned to each horizontal edge (colored green or blue). This choice makes Pauli frames translation invariant in the underlying physical qubits. Like-colored edges are measured simultaneously and colors are alternated in a time-ordered sequence. Note that the types of decoding graph nodes for the 4.8.8 Floquet code are conceptually simpler than those of honeycomb Floquet code. There are perpetual stabilizers associated with each plaquette (8-, 4-, and 2-gons), leading to decoding graph nodes inferred by 16, 8, or 4 check outcomes. In addition, there are decoding graph nodes inferred by just 2 check outcomes along the boundary.

Figure 8B:
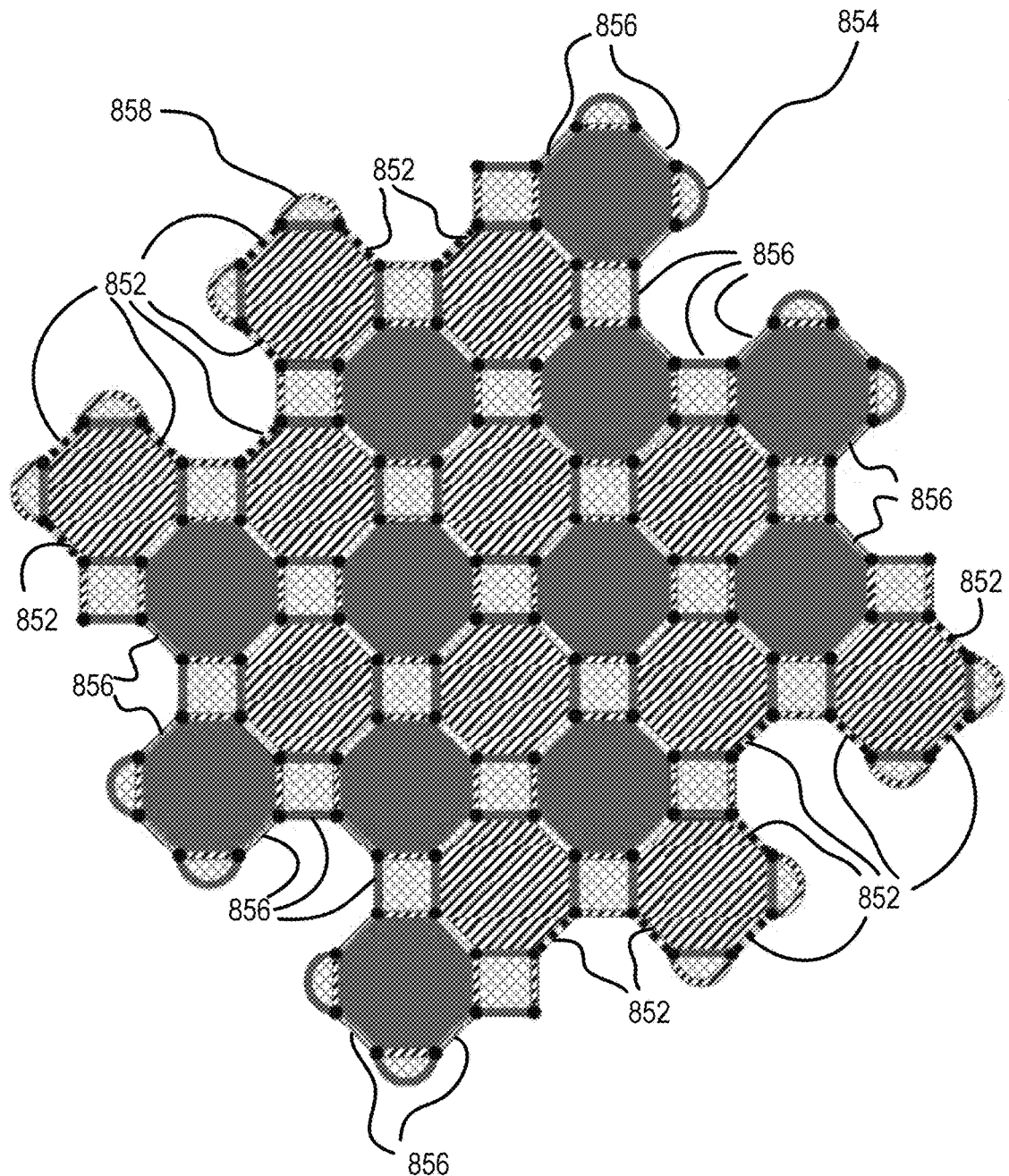
FIG. 8B illustrates an example of a parallelogram (also called rectangle) patch for a square-octagon (4.8.8) lattice, including definitions of the boundary edges, according to one embodiment.

To define the code with open boundaries, again a choice of boundary conditions is required. A convenient choice is shown in FIG. 8B. Time-ordering of the check measurements is also analogous to the honeycomb code. On the torus the period-three sequence (yellow, blue, green) is sufficient. On the plane, the following period-six sequence is used: yellow, blue, green, yellow, green, blue. Black-yellow dashed edges 852 are each measured only once during the period-six sequence. The planar check sequence prescribed above can be modified by permutations of the colors. For example (blue, yellow, green, blue, green, yellow). Because of the asymmetry of the faces in the 4.8.8 lattice, the choice of colors is not entirely arbitrary. It is possible that other permutations may change logical performance.

If errors occur independently on each qubit, then, like the honeycomb, the distance is equal to the minimum weight d of the logical operators. Unlike the honeycomb, the effective distance of the 4.8.8 code remains unchanged if the noise model includes two-qubit errors on the check measurements. This property leads to better spatial overhead under a two-qubit correlated noise model. The essential reason for this is that every two-qubit operator on the support of a check operator intersects any minimum-weight logical operator only in one qubit.

It can be formally shown that the effective distance is still d under two-qubit errors on the check measurements by the following consideration. The decoding graph can be constructed under a simplified error model in which a single-qubit Pauli error P may be introduced only if it immediately follows the measurement of a check operator P⊗P. Any Pauli error configuration in spacetime defines a 1-chain in this decoding graph, and a logical operator corresponds to a path from one boundary to the opposite boundary of the decoding graph. Then, it suffices to show that no two-qubit error on the support of any check operator can advance the end point of the 1-chain by more than graph distance one from a boundary plane of the decoding graph.

Figure 8C:
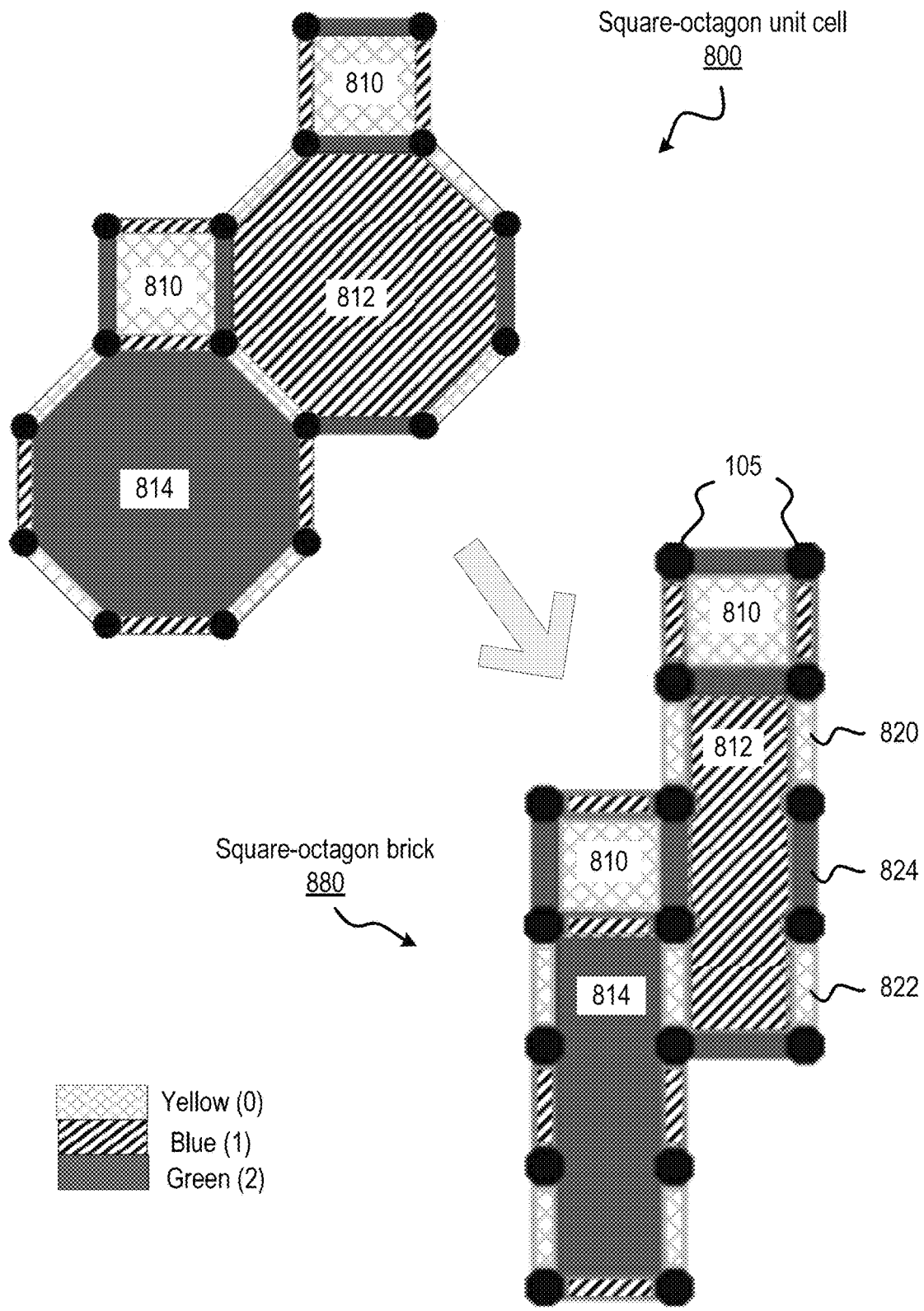
FIG. 8C illustrates a mapping of the square-octagon unit cell to the square-octagon unit brick, according to one embodiment.
Figure 8D:
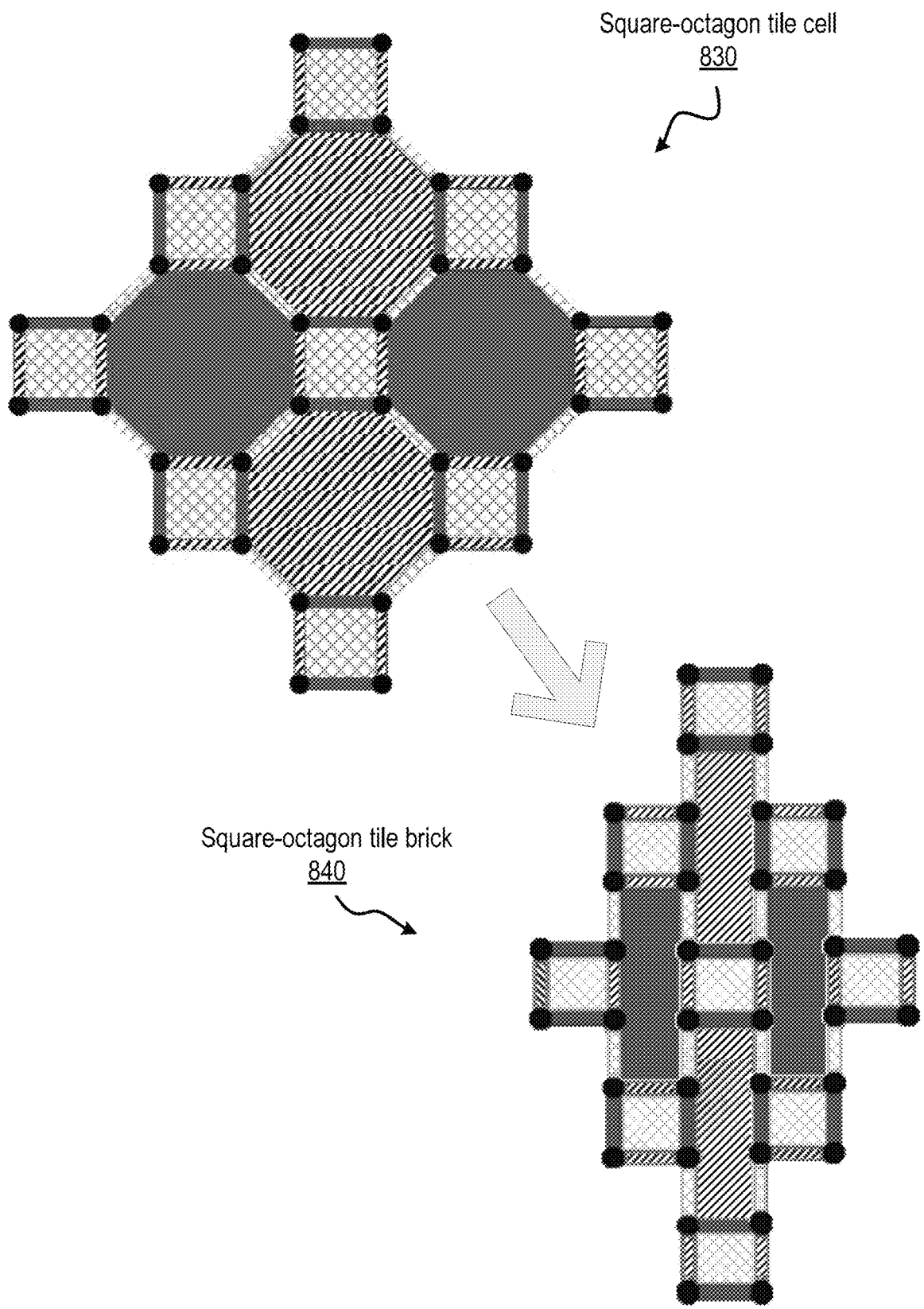
FIG. 8D illustrates a mapping of the square-octagon tile cell to the square-octagon tile brick, according to one embodiment.

FIGS. 8C-D illustrates that, like the hexagonal lattice, the 4.8.8 lattices map to the tetron array 200 using vertical bricks such that each 2n-gon corresponds to a rectangle of height n. With this mapping, the 4.8.8 Floquet codes in the bulk use a subset of the highest fidelity two-qubit measurements: XX and YY measurements between vertically adjacent qubit islands, and ZZ between horizontally adjacent qubit islands. To implement measurements on neighboring pairs of vertically adjacent qubits without their corresponding loops intersecting, two columns of semiconductor separate each column of qubits. Thus, the implementation of the 4.8.8 Floquet codes on this physical layout does not require any auxiliary qubits or extra time steps, a significant advantage compared to codes built out of higher-weight stabilizers.

Figure 8E:
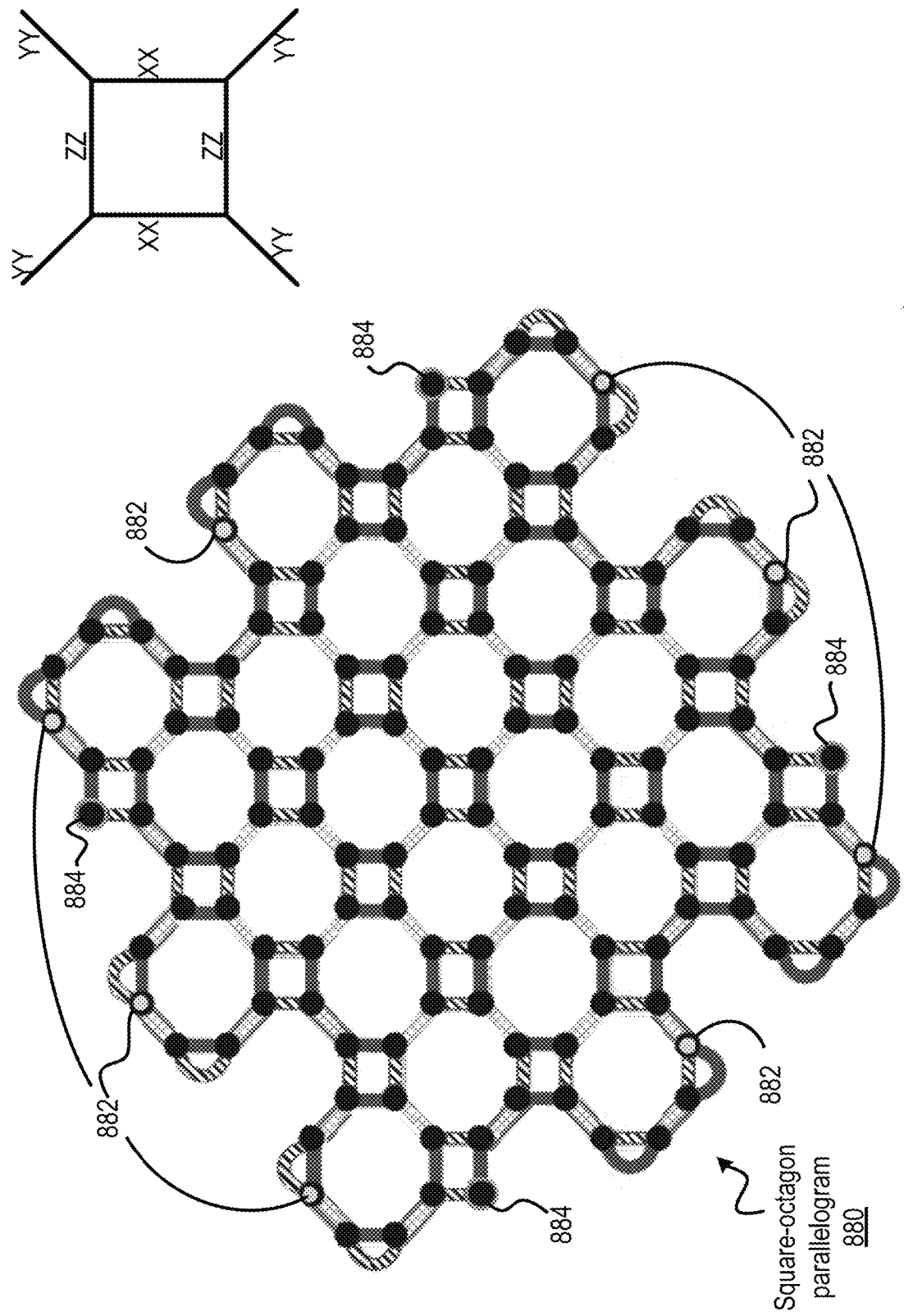
FIG. 8E illustrates bulk measurements and boundaries of the square-octagon parallelogram, according to one embodiment.

FIG. 8E shows which measurements are associated with which edges. FIG. 8D further illustrates the mapping of the square-octagon tile 830 to a square-octagon brick 840.

Returning to FIGS. 8A and 8C, the square 810 is labeled "yellow," and is surrounded by edges labeled as blue 822 and green 824. The first type of octagon 812 is labeled "blue," and is surrounded by edges labeled yellow 820 and green 824. The second type of octagon 814 is labeled "green," and is surrounded by edges labeled yellow 820 and green 824. Respective qubits 105 are located at the vertices of the squares 810 and octagons 812 and 814.

Now is discussed the nonlimiting example of rectangular boundary conditions for the 4.8.8 Floquet code that is illustrated in FIG. 8B. Like the honeycomb code, solid color edges (e.g., green (grey pattern) edges 854 and blue (diagonal-line pattern) edges 858) are measured in a period-six sequence (yellow, blue, green, yellow, green, blue). Dashed black-yellow edges 852 and striped black-yellow edges 856 are the same Pauli type as solid yellow edges, but are measured at different rounds in the measurement sequence. Dashed edges 852, incident to blue (diagonal-line pattern) faces, are measured during the first yellow round. Striped edges 856, incident to green (grey pattern) faces, are measured during the second yellow round.

To implement the boundary conditions requires additional measurements. These additional measurements have been discussed above with respect to the hexagon lattice. In the 4.8.8 Floquet code, extending the bulk measurement pattern to the boundaries introduces ZZ between vertically adjacent qubit islands, and XX between horizontally adjacent qubit islands. While the former can be implemented without using any coherent links, the latter requires two coherent links. To avoid this, the measurement pattern is modified for one of the qubits forming 2-gons along horizontal boundaries. One choice is to swap X and Z for one of the qubits, which is indicated by a white dot, as seen for example in FIG. 6B. This modification swaps a no-coherent link (ZZ) and a two-coherent link (XX) measurement for two one-coherent link measurements (XZ and ZX).

For the square-octagon lattice, an exemplary embodiment is disclosed in which all horizontal edges correspond to ZZ measurements, while vertical edges correspond to XX measurements and diagonal edges to YY measurements. Again, the edge coloring indicates in which time step each measurement occurs. Vertical brick walling this lattice allows us to implement the square-octagon Floquet code on the same physical tetron layout with the same set of two-qubit measurements: $\mathcal{X}_N \tilde{\mathcal{X}}_S$, $\mathcal{Y}_N \mathcal{Y}_S$, and $\mathcal{Z}_W \tilde{\mathcal{Z}}_E$. As such, the physical requirements for implementation of the bulk square-octagon Floquet code are the same as for the bulk honeycomb Floquet code.

FIG. 8E shows the patch encoding with respect to boundaries for a parallelogram geometry using the 4.8.8 (square-octagon) lattice. The square-octagon parallelogram 880 has four degree-2 qubits 884. These patches can be extended by following the pattern to encompass more bulk plaquettes while respecting the boundary rules summarized above.

To implement these patches on the physical layout of tetrons, additional measurement loops are used beyond the natural set of 2-qubit measurements used in the bulk. For the qubits 882 in FIG. 8E, the encoding is modified to use a primed basis in which the boundary qubits use the Pauli measurements $$i\gamma_1\gamma_2 = i\gamma_3\gamma_4 = \sigma'_z,$$

$$i\gamma_1\gamma_4 = i\gamma_2\gamma_3 = \sigma'_y,$$

$$i\gamma_1\gamma_3 = -i\gamma_2\gamma_4 = \sigma'_x.$$

That is, the MZMs that encode X and Z are swapped. Thus, rather than participating in horizontal ZZ and XX measurements, the latter of which requires two coherent links, these qubits participate in horizontal ZZ, XX, (i.e., XZ and ZX) measurements, each of which requires a single coherent link.

Figure 8F:
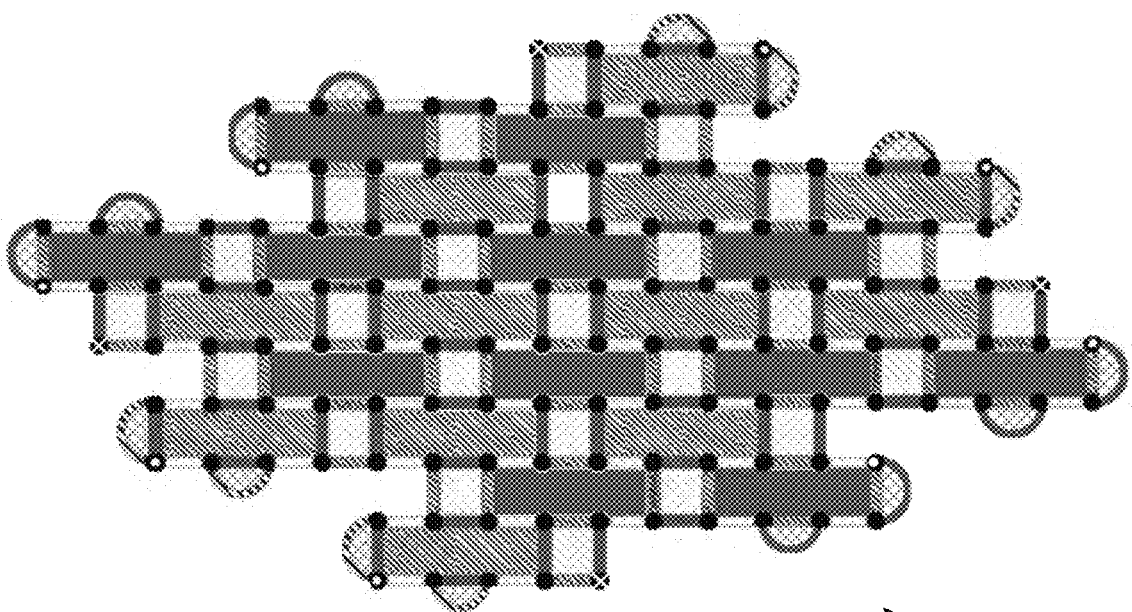
FIG. 8F illustrates a mapping of the square-octagon parallelogram to the brick parallelogram on a square-octagon lattice, according to one embodiment.
Figure 8F:
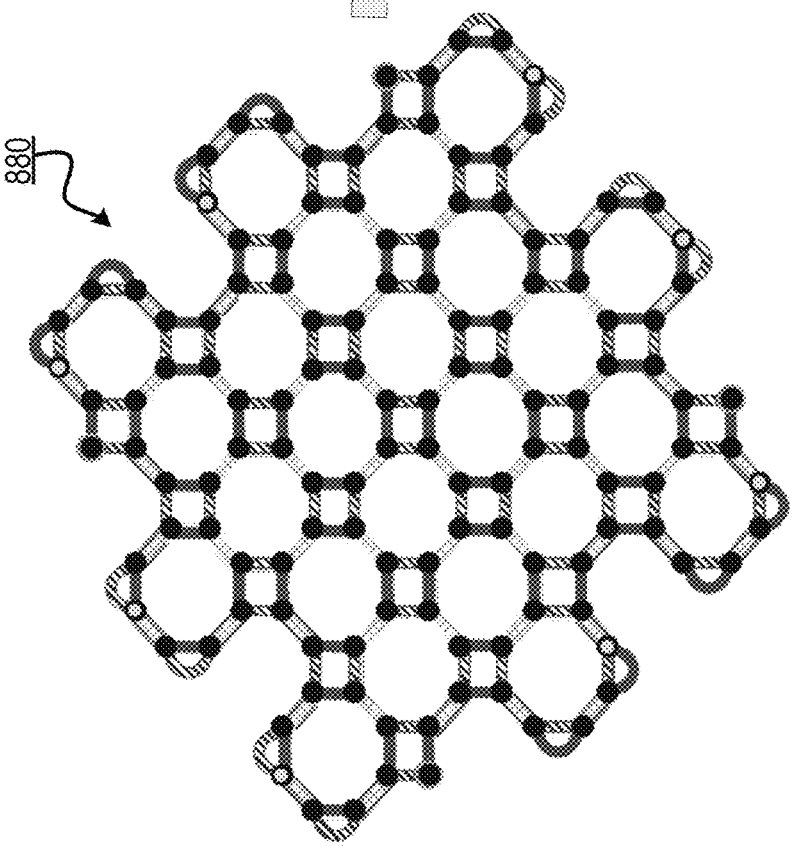
Figure 8G:
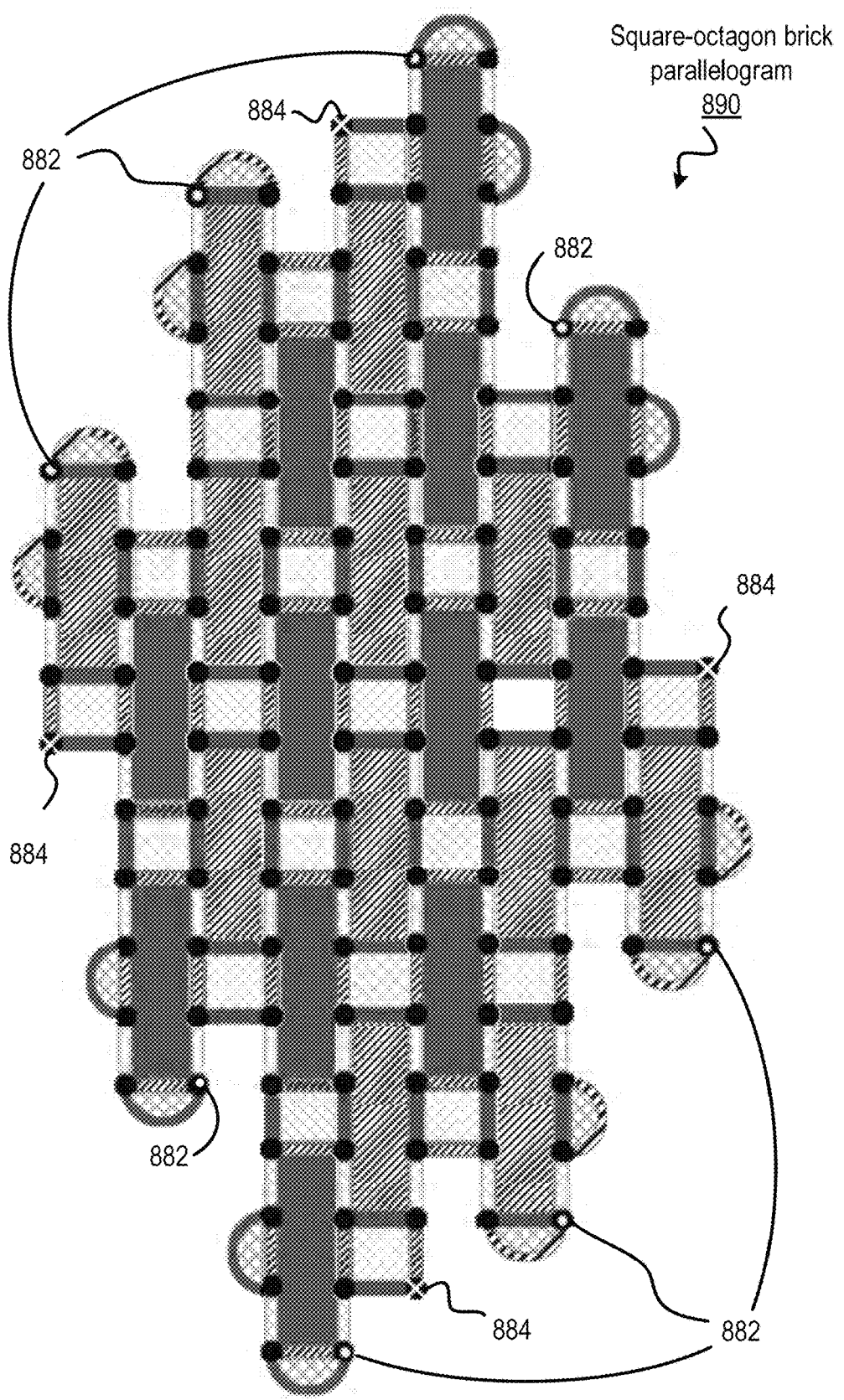
FIG. 8G illustrates the brick parallelogram for a square-octagon lattice, according to one embodiment.
Figure 8H:
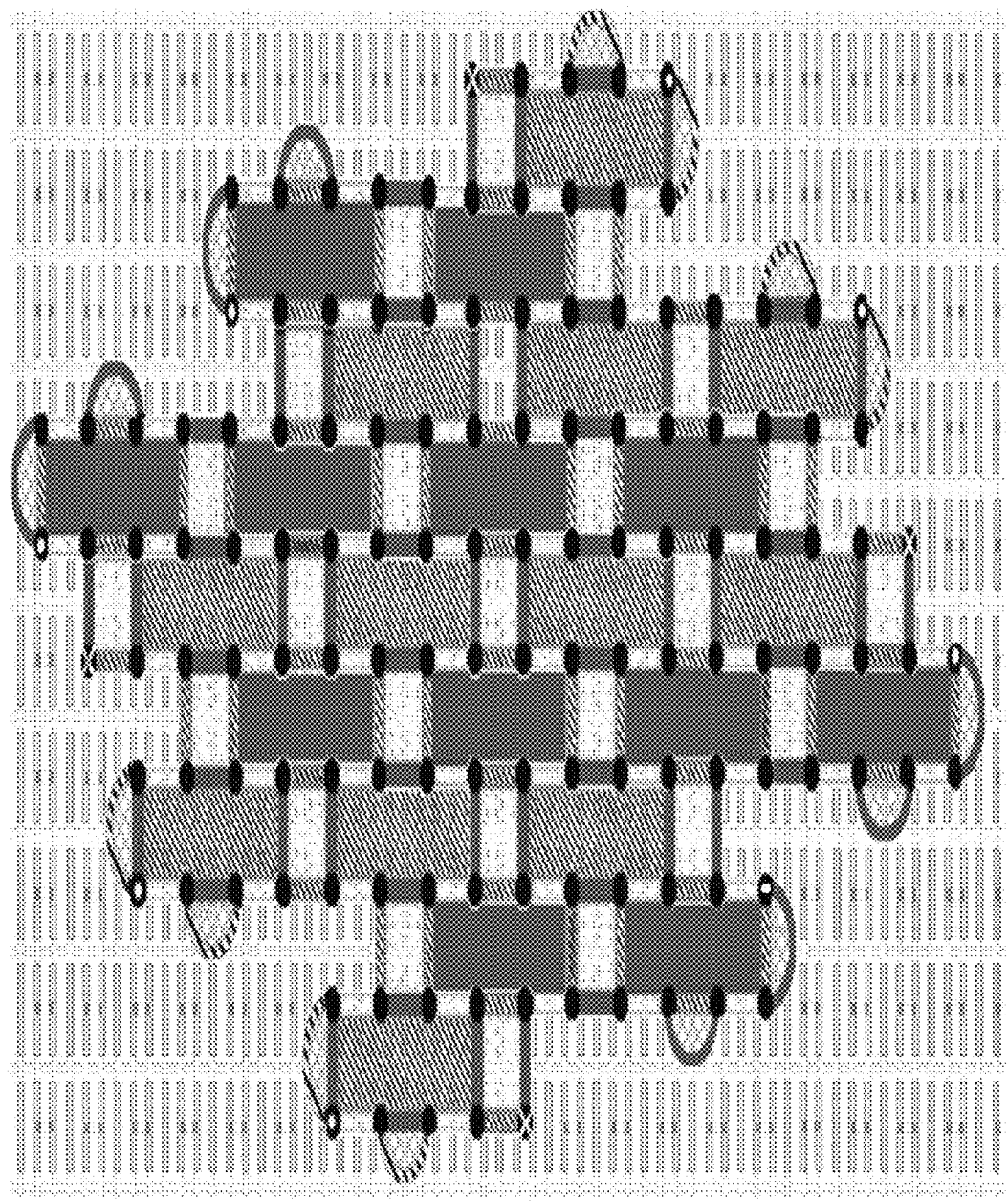
FIG. 8H illustrates the brick parallelogram for a square-octagon lattice superimposed on the tetron lattice, according to one embodiment.
Figure 8I:
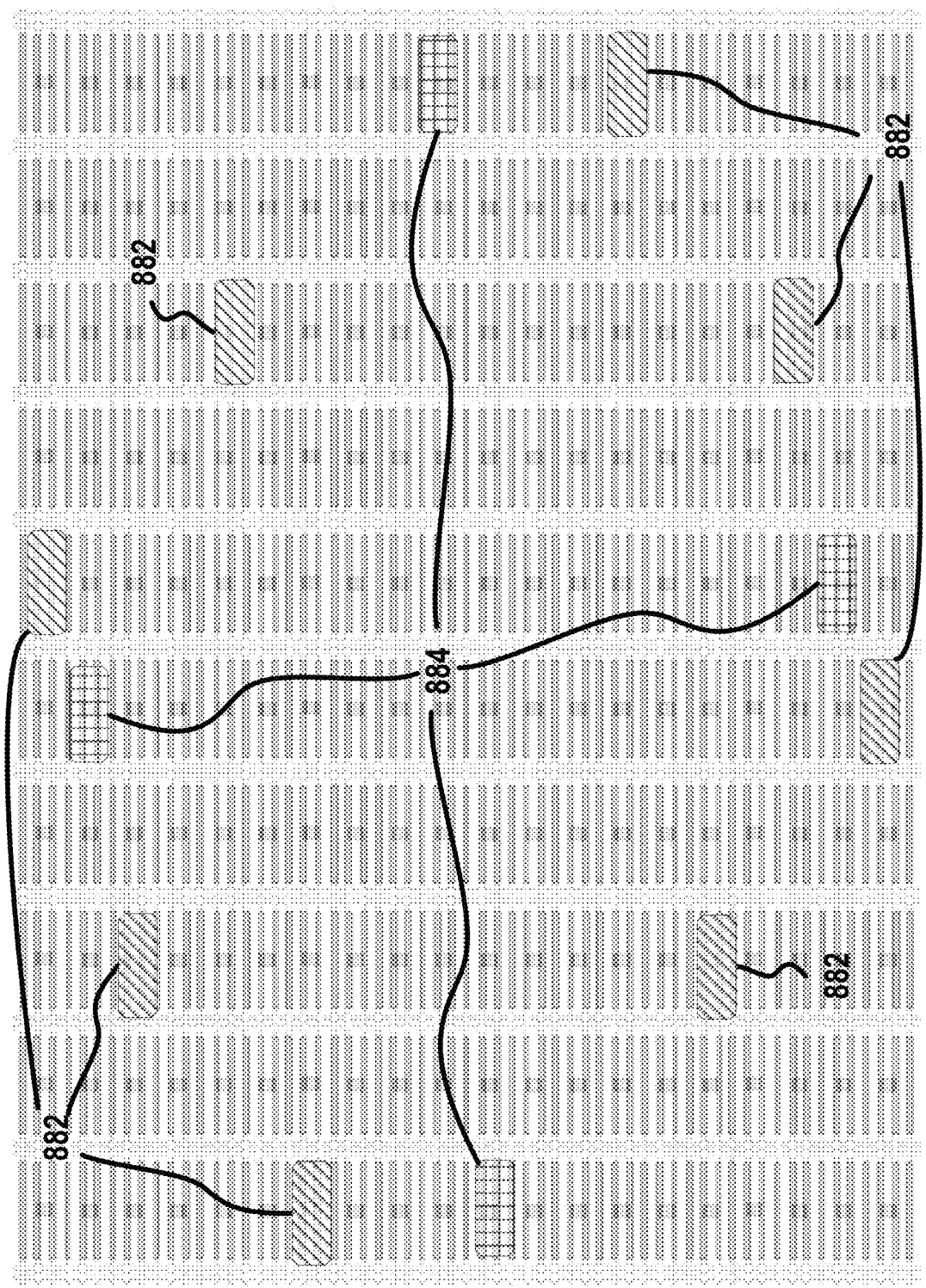
FIG. 8I illustrates an example of locations of distinguished qubits on a tetron lattice for a square-octagon Floquet code, according to one embodiment.

FIG. 8F shows the mapping from the square-octagon lattice parallelogram 880 to the square-octagon brick parallelogram 890. The square-octagon brick parallelogram 890 provides a representation of how the parallelogram is arranged on the tetron lattice 200. FIG. 8G shows the square-octagon brick parallelogram 890, and where the distinguished qubits 882 and 884 are located. FIG. 8H shows the square-octagon brick parallelogram 890 superimposed over the tetron lattice 200. FIG. 8I shows where the distinguished qubits 882 and 884 are located on the tetron lattice.

Figure 9A:
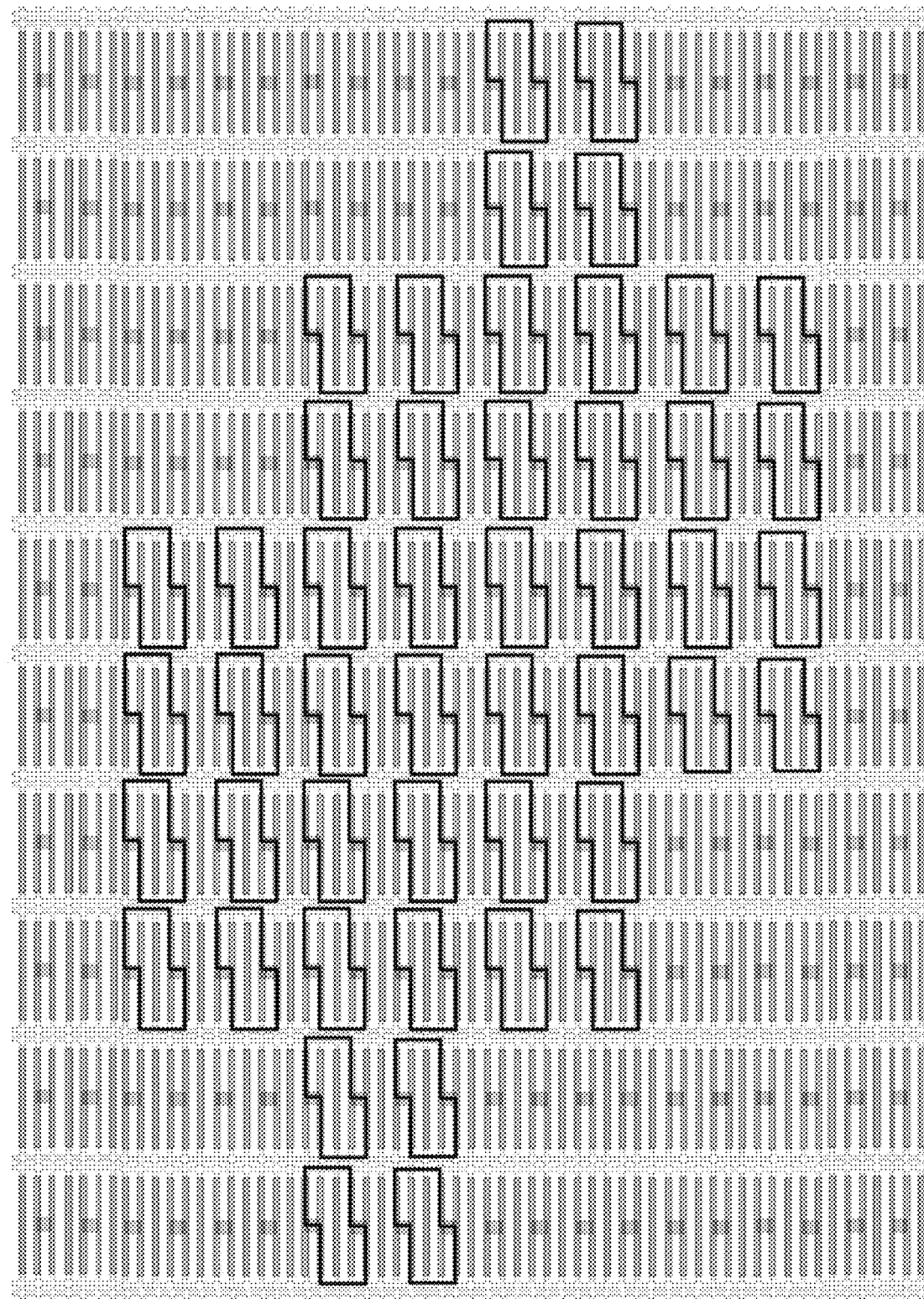
FIG. 9A illustrates an example of a first step of a square-octagon Floquet code, according to one embodiment.
Figure 9B:
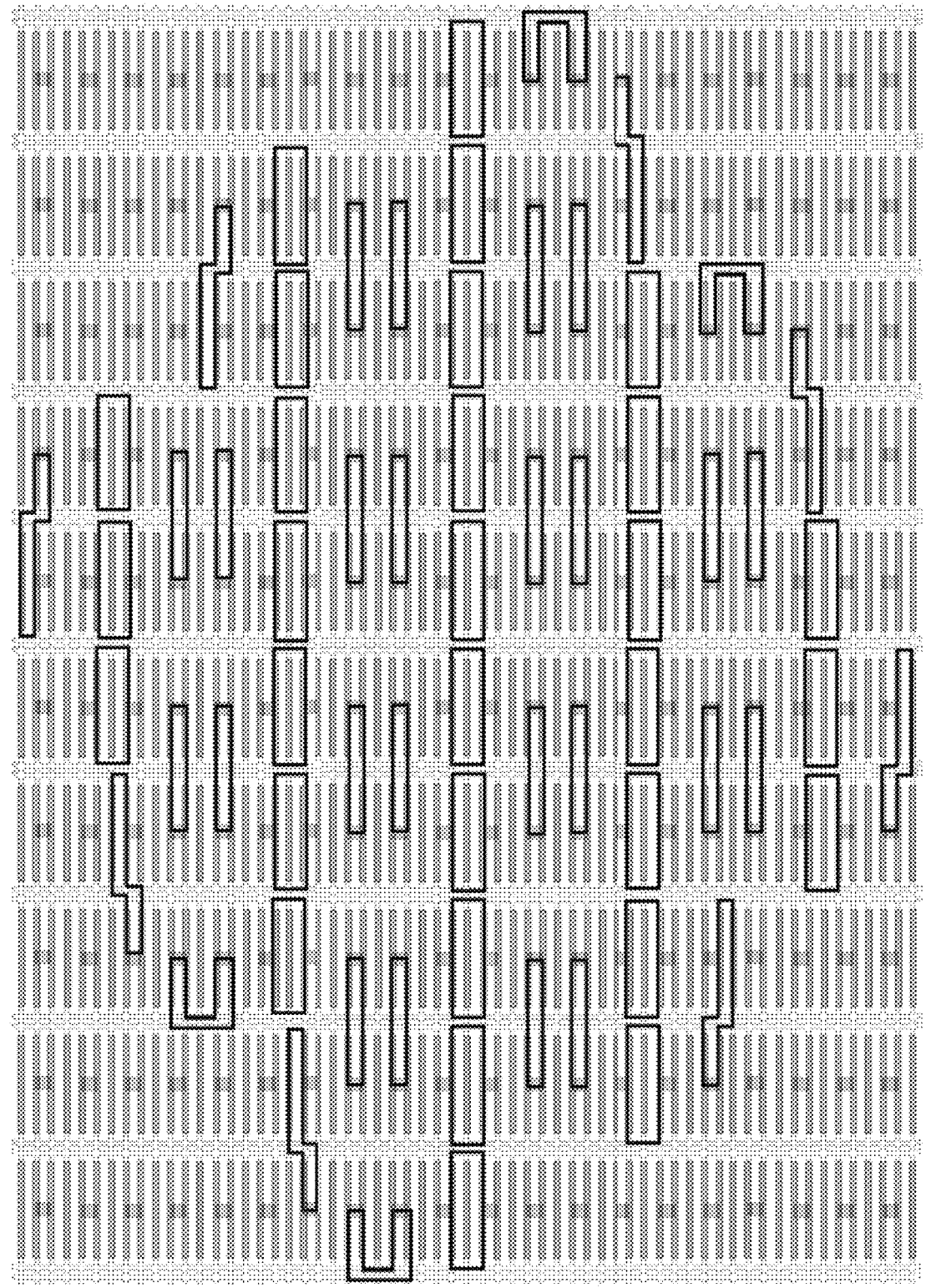
FIG. 9B illustrates an example of a second step of a square-octagon Floquet code, according to one embodiment.
Figure 9C:
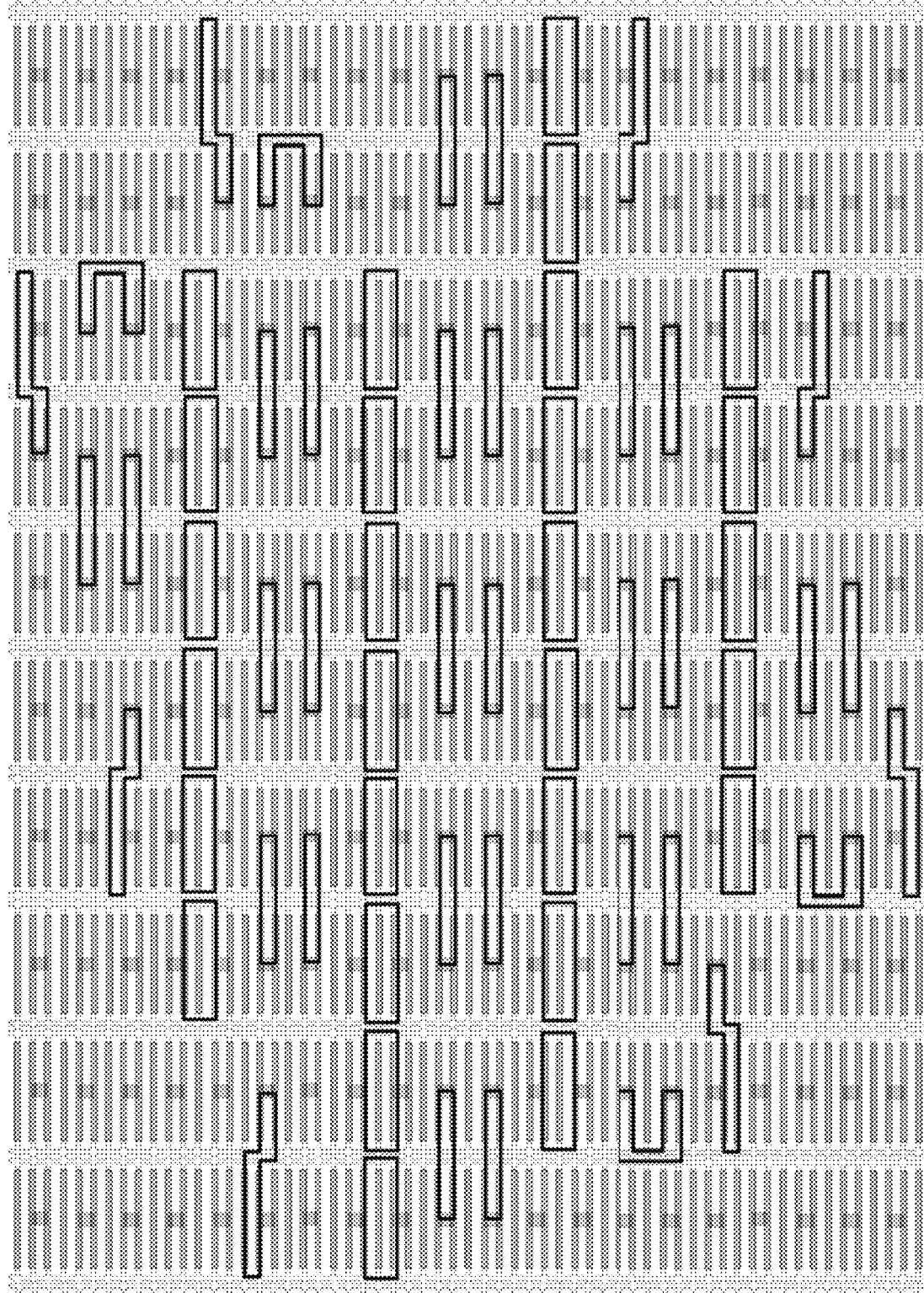
FIG. 9C illustrates an example of a third step of a square-octagon Floquet code, according to one embodiment.
Figure 9D:
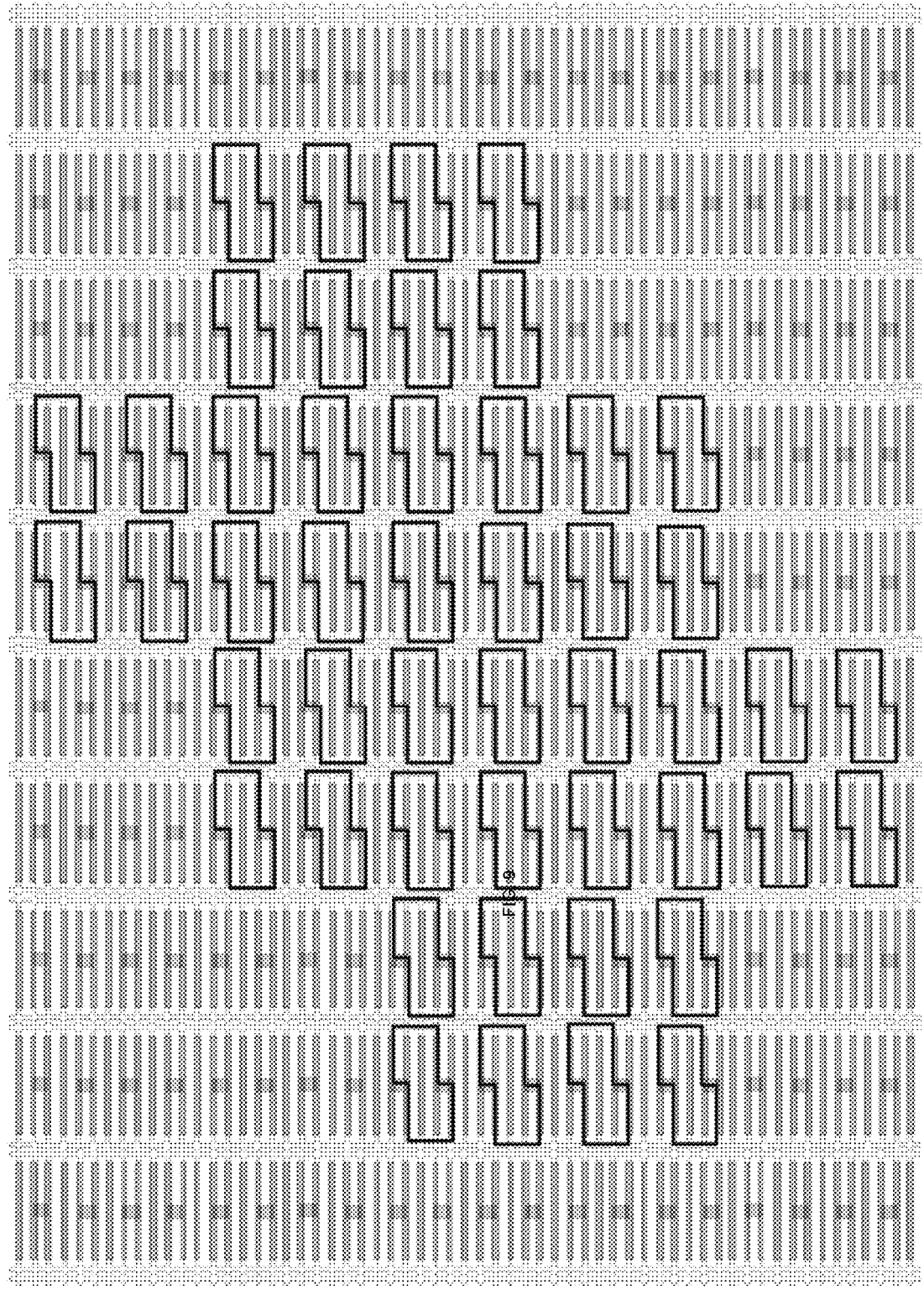
FIG. 9D illustrates an example of a fourth step of a square-octagon Floquet code, according to one embodiment.
Figure 9E:
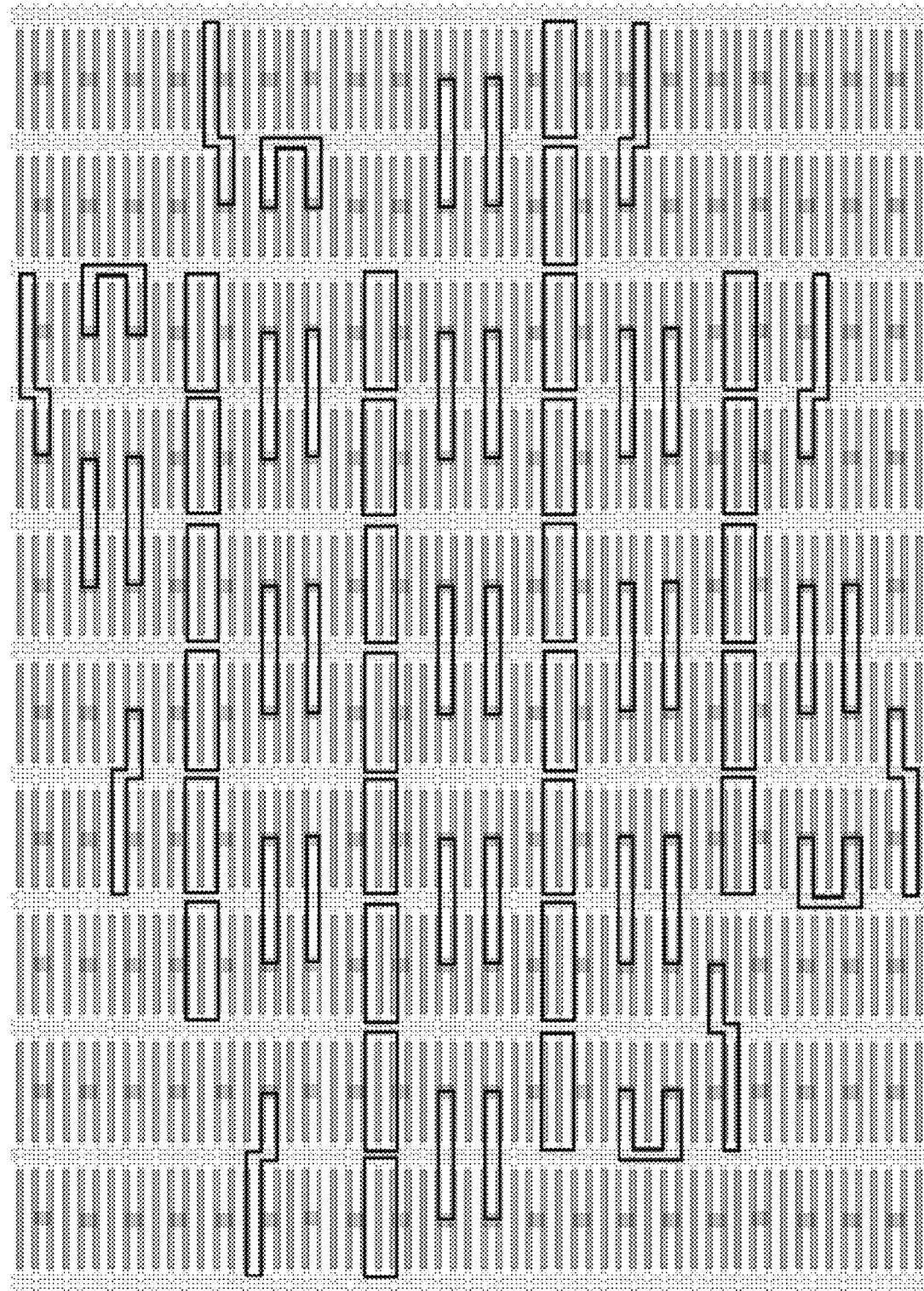
FIG. 9E illustrates an example of a fifth step of a square-octagon Floquet code, according to one embodiment.
Figure 9F:
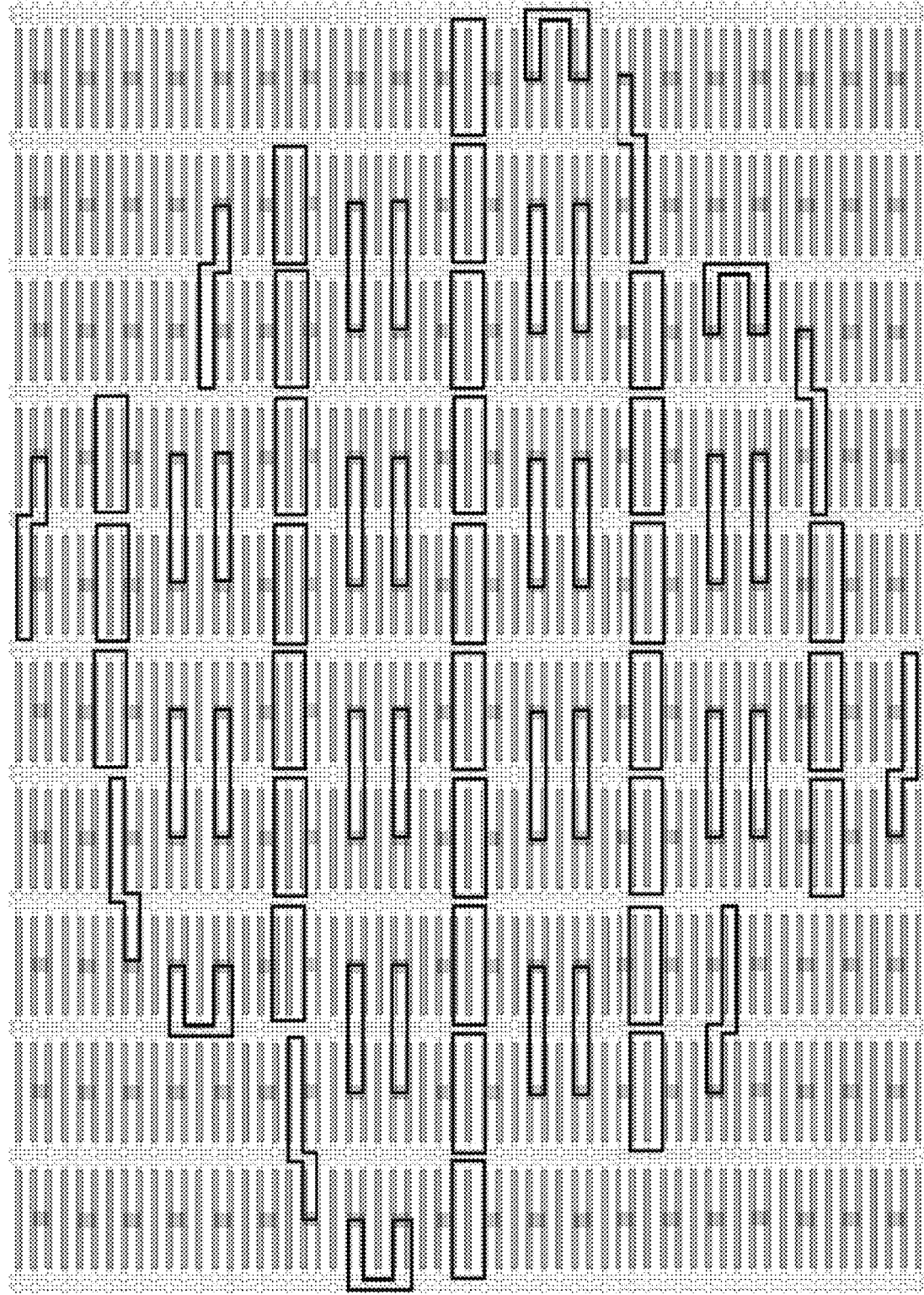
FIG. 9F illustrates an example of a sixth step of a square-octagon Floquet code, according to one embodiment.

FIGS. 9A-F show the measurements performed for each of the respective steps of the six step sequence for the 4.8.8 Floquet code. At step one, the measurements shown in FIG. 9A are performed. At step two, the measurements shown in FIG. 9B are performed, and so forth to step six at which time the measurements shown in FIG. 9F are performed.

Figure 10A:
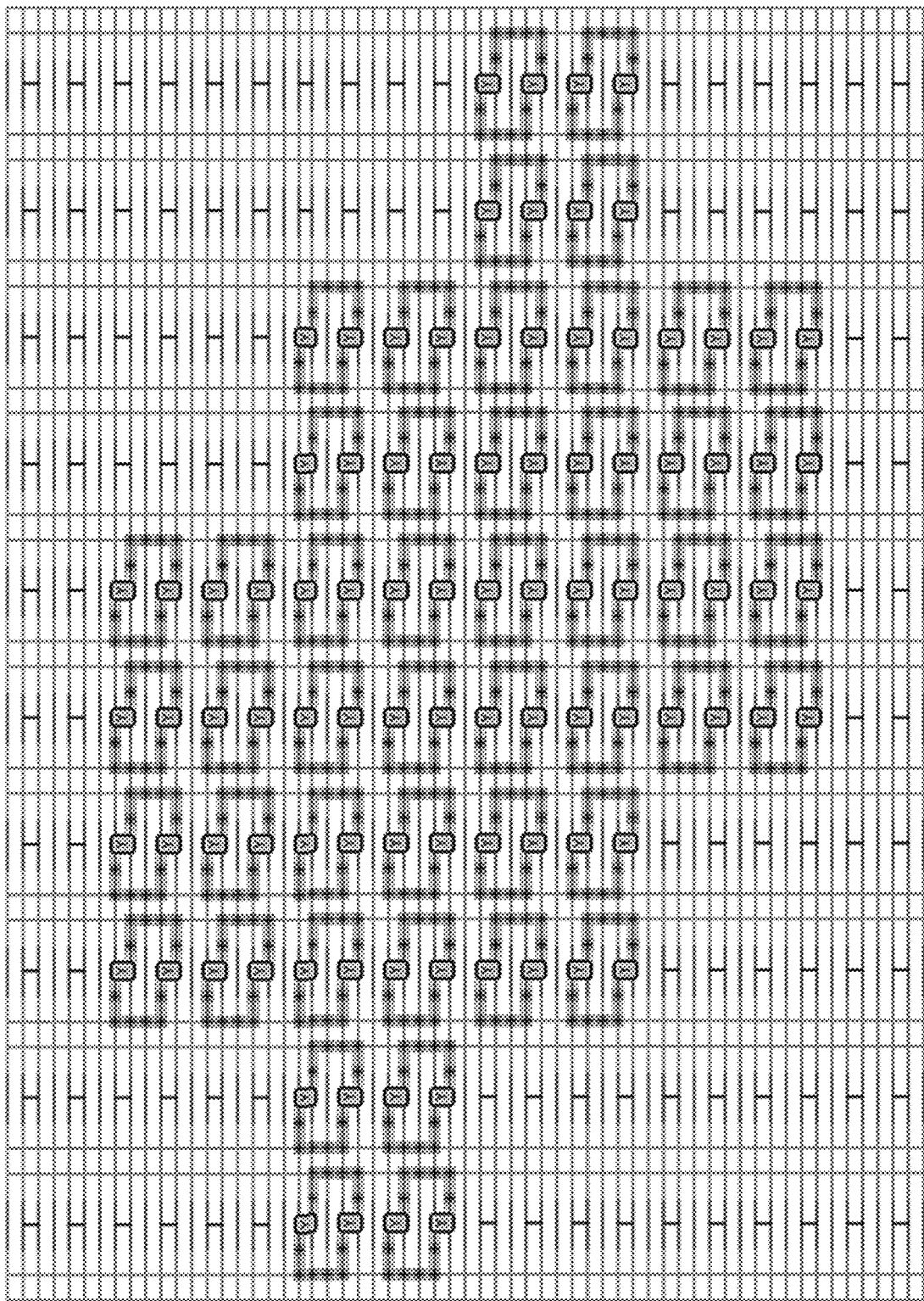
FIG. 10A illustrates another example of a first step of a square-octagon Floquet code, according to one embodiment.
Figure 10B:
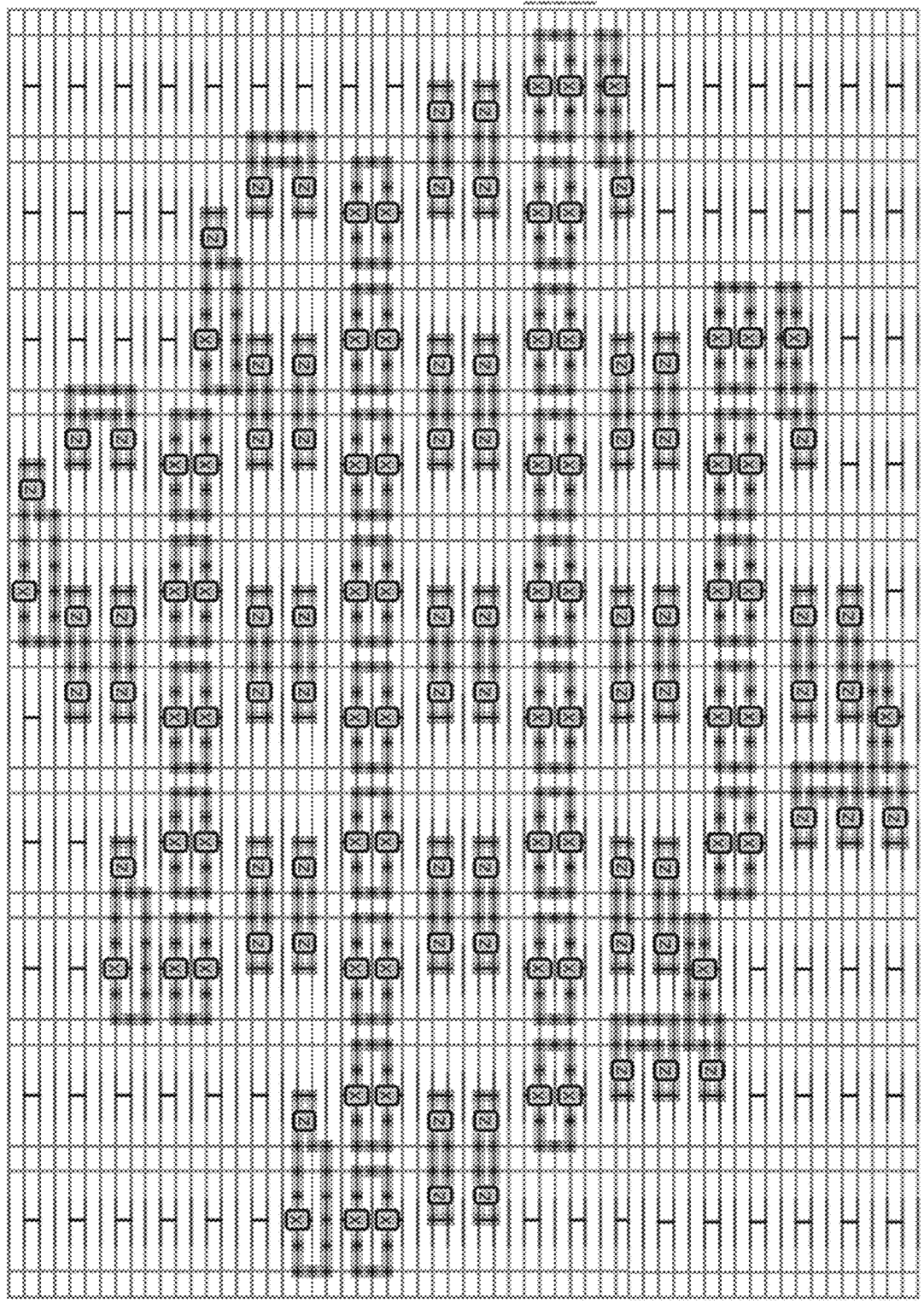
FIG. 10B illustrates another example of a second step of a square-octagon Floquet code, according to one embodiment.
Figure 10C:
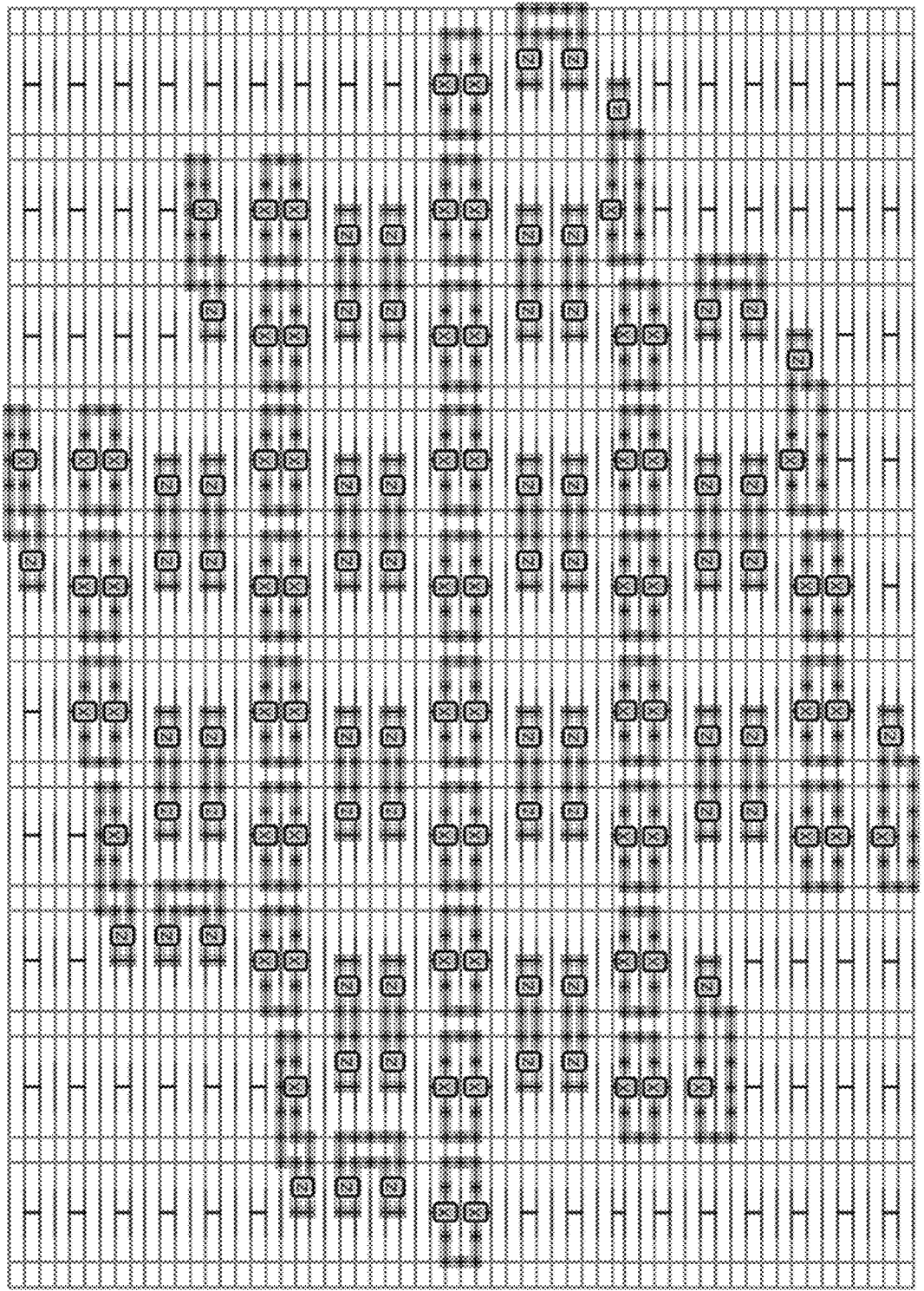
FIG. 10C illustrates another example of a third step of a square-octagon Floquet code, according to one embodiment.
Figure 10D:
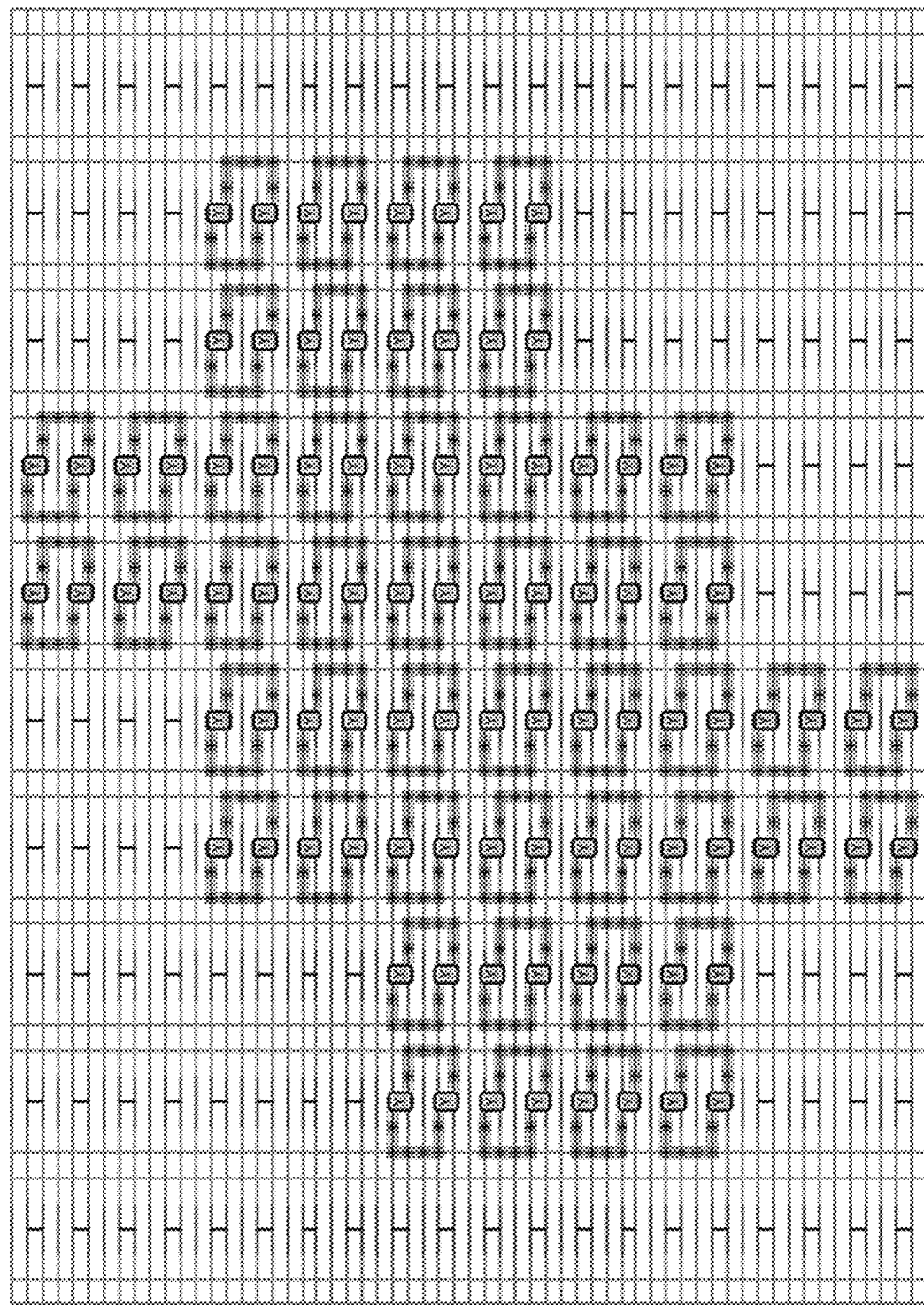
FIG. 10D illustrates another example of a fourth step of a square-octagon Floquet code, according to one embodiment.
Figure 10E:
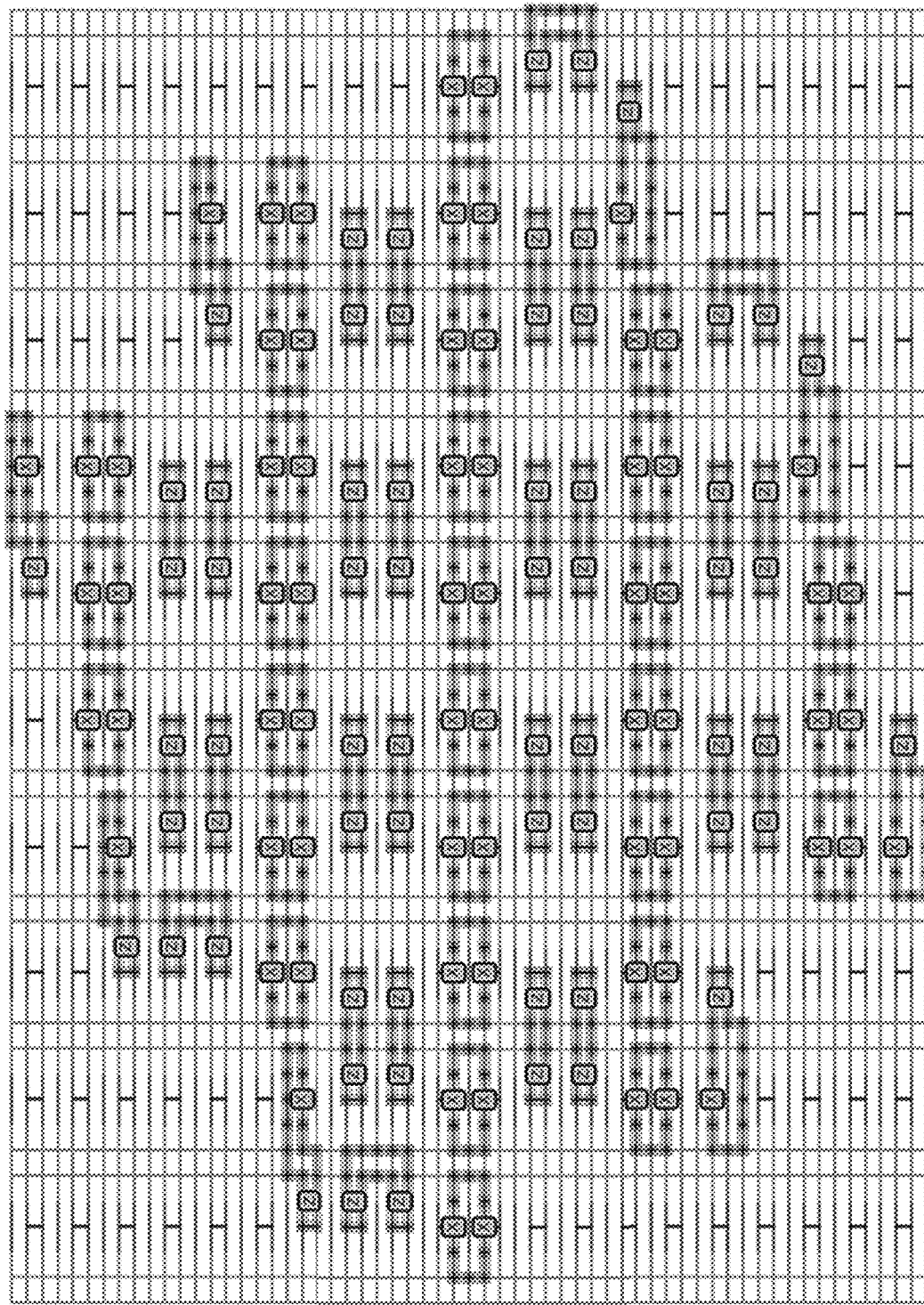
FIG. 10E illustrates another example of a fifth step of a square-octagon Floquet code, according to one embodiment.
Figure 10F:
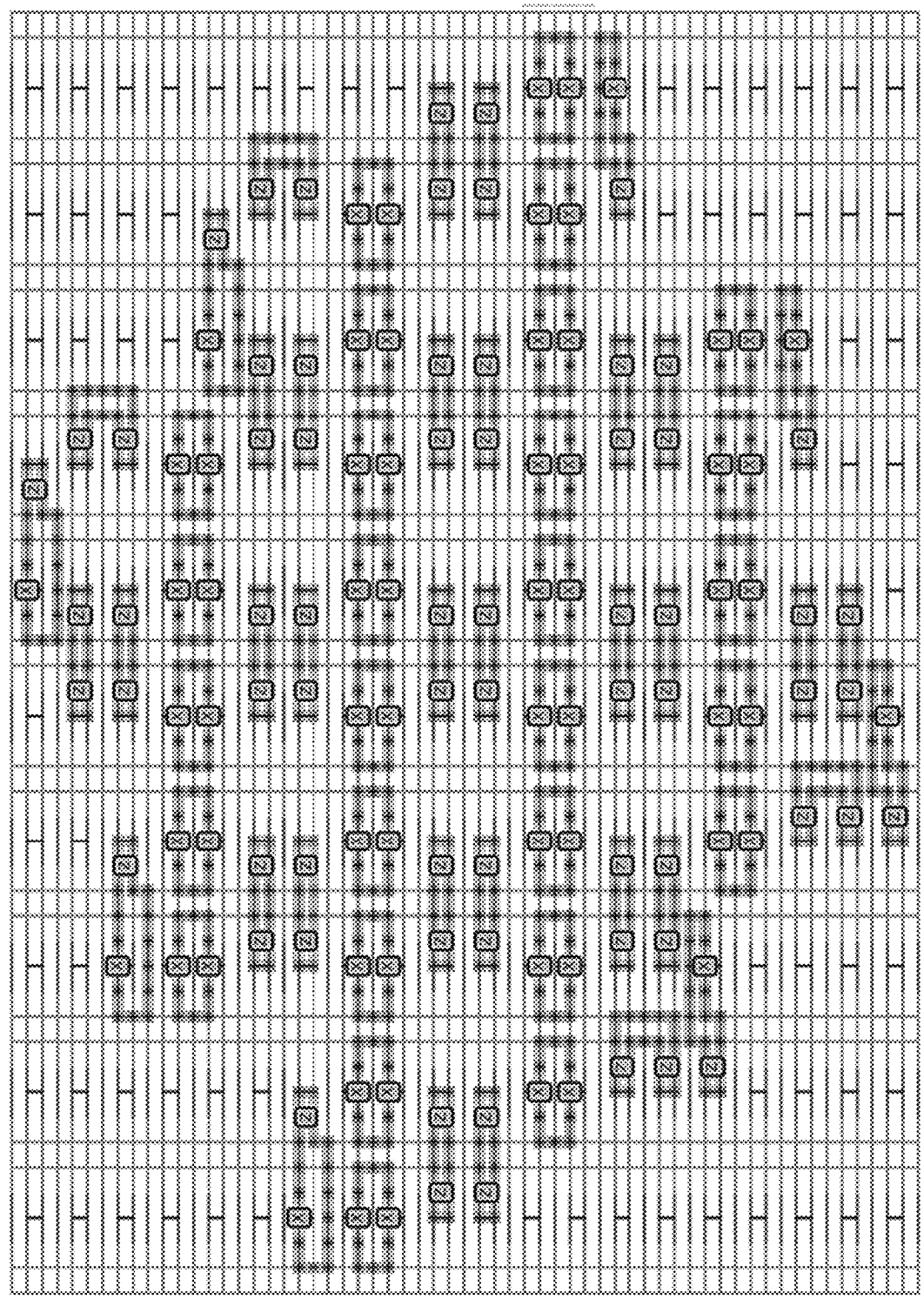
FIG. 10F illustrates another example of a sixth step of a square-octagon Floquet code, according to one embodiment.

Similarly, FIGS. 10A-F show the measurements performed for each of the respective steps of the six step sequence for the 4.8.8 Floquet code. At step one, the measurements shown in FIG. 10A are performed. At step two, the measurements shown in FIG. 10B are performed, and so forth to step six at which time the measurements shown in FIG. 10F are performed.

The six step sequence for the 4.8.8 Floquet code can be performed using method 10, which is illustrated in FIG. 7J.

The honeycomb and square-octagon Floquet codes have several advantages over their surface code counterparts. The honeycomb and square-octagon Floquet codes have a zero-overhead (no extra time steps, no auxiliary qubits) implementation with tetrons, such that only a subset of boundary measurements require coherent links. In contrast, implementing the surface code with tetrons whose native operations are single- and two-qubit measurements requires half of the qubits to be auxiliary qubits (up to boundary conditions) to implement the higher-weight stabilizers of the code. This increases both the qubit count and time overhead of the code. Moreover, the physical layout of the surface code with tetrons uses a coherent link for every 2-qubit measurement between data and auxiliary qubits, increasing the expected probability of a measurement error. Thus, the honeycomb and square-octagon Floquet codes are more naturally suited to a tetron architecture.

Figure 11:
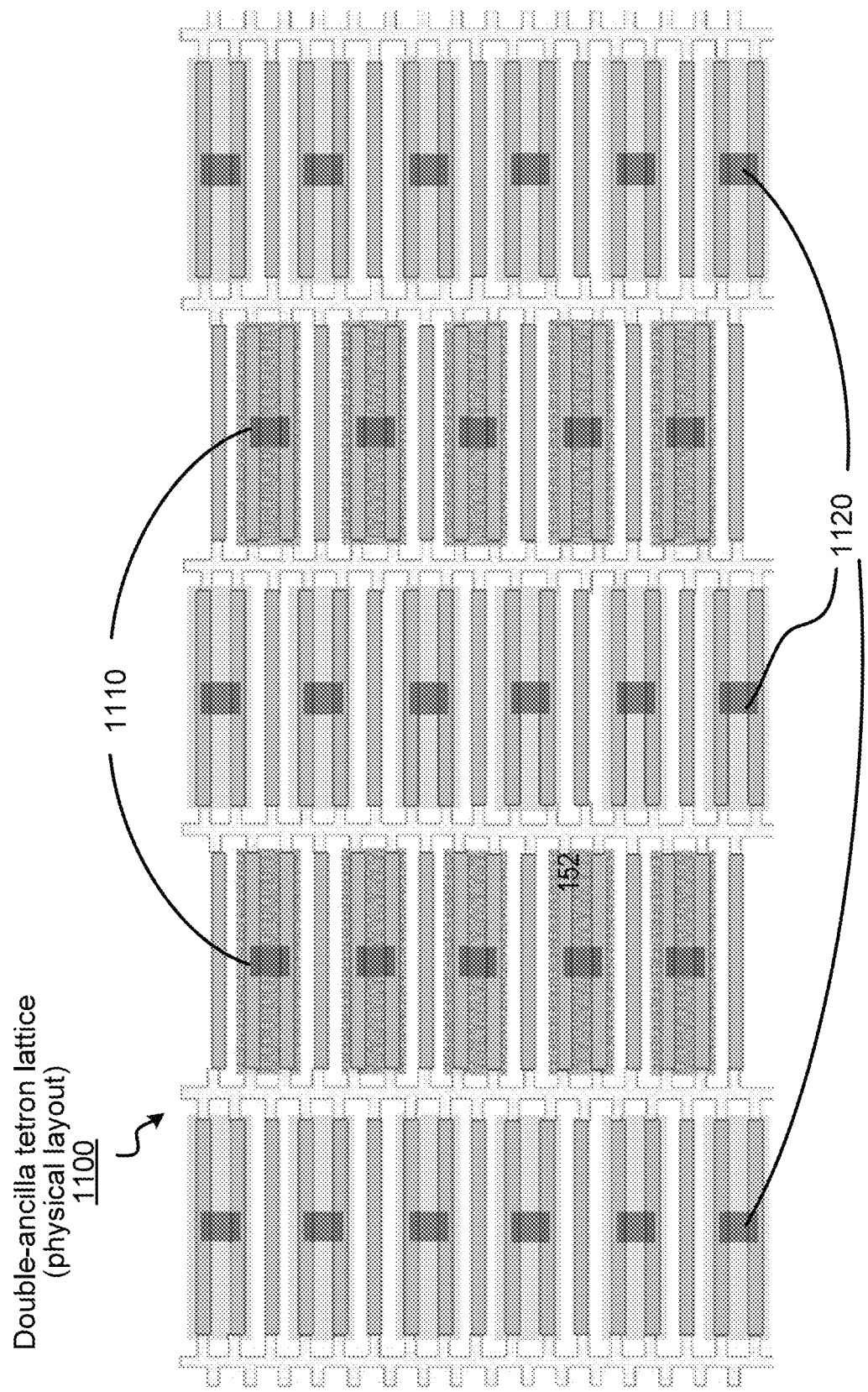
FIG. 11 illustrates an example of a double ancilla tetron lattice, according to one embodiment.

FIG. 11 shows the physical layout 1100 for the double-ancilla version of the surface code with tetrons. The rows of auxiliary qubits 1110 are used for implementing four qubit stabilizers from two0wubit Pauli measurements. The rows of auxiliary qubits 1110 are offset from the rows of qubit islands 1120. Note that the square lattice of tetrons is rotated by 45 degrees compared to that used for the Floquet codes. Moreover, the semiconducting segments linking qubits now correspond to a single semiconducting column, with left and right horizontal branches offset.

Alternative Boundary Conditions

Now, alternate boundary conditions are discussed. The above discussion focuses on the boundary conditions (e.g., Floquet code patches encoding logical qubits) that is expected to provide the optimal result with respect to the physical requirements. Other choices of boundary conditions may be preferable from a quantum error correcting code distance perspective.

In the examples below, boundary 4-gons and 2-gons are used with a lattice of hexagons. For a lattice of plaquettes with a boundary, some vertices at the boundary that participate in only two edges, and nearest degree-2 vertices have to be connected by some extra edges, to meet the 3-edge-per-vertex condition.

In the following, cells are provided at honeycomb edges, and appropriate connection labels and checks are assigned. With these edge configurations, some edges do not participate in at least one round and six rounds are generally required. For convenient illustration, 0-rounds (connections associated with connecting hexagons labeled 0) are selected so that there can be 0-rounds that include all 0-connections and 0*-rounds in which some 0-connections are excluded. Other arrangements can be used, including sequences in which some 0-connections are excluded from two or more 0-rounds.

Figure 12A:
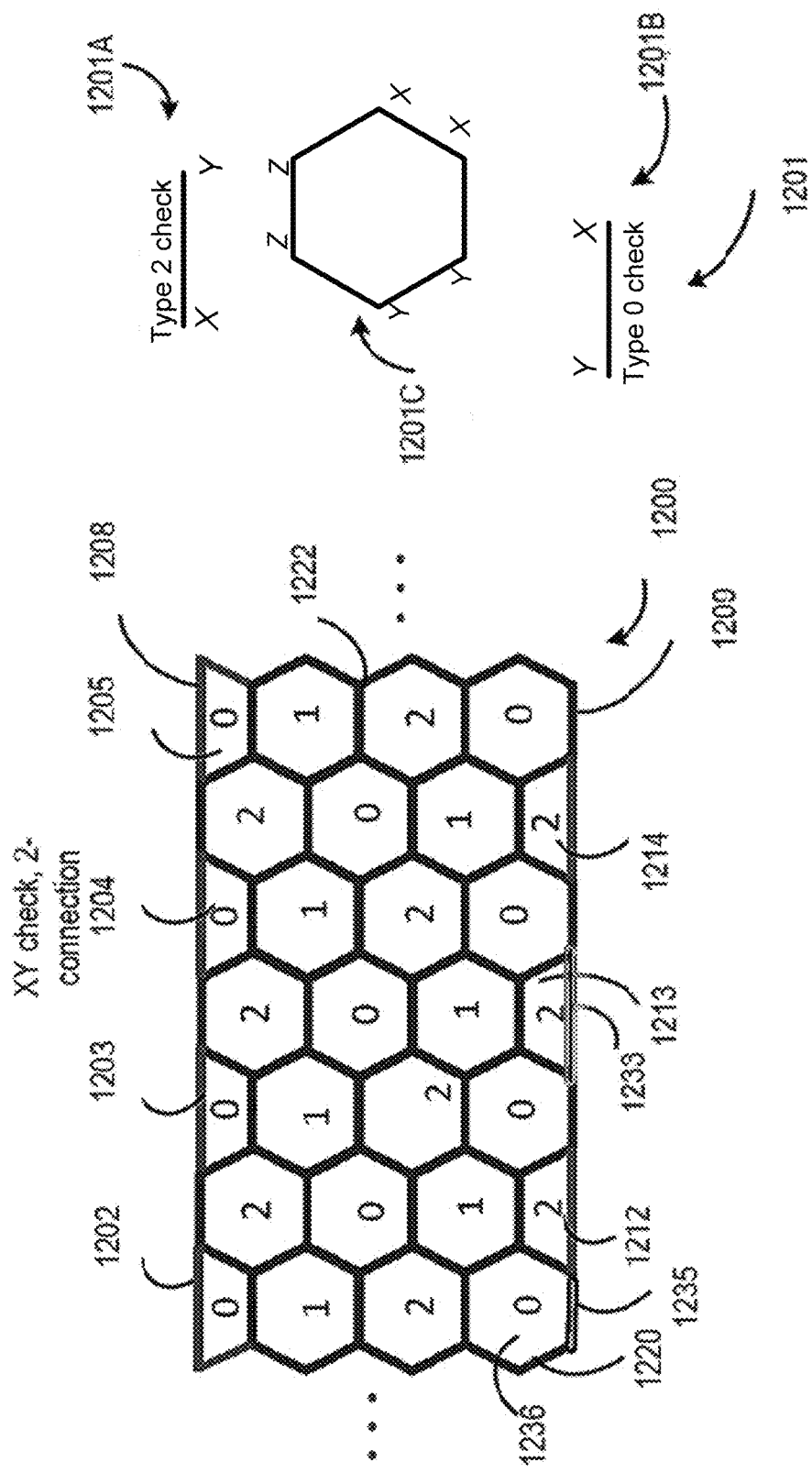
FIG. 12A illustrates an example of a hexagonal lattice with 4-gons on both top and bottom boundaries and associated boundary check operators, according to one embodiment.
Figure 12B:
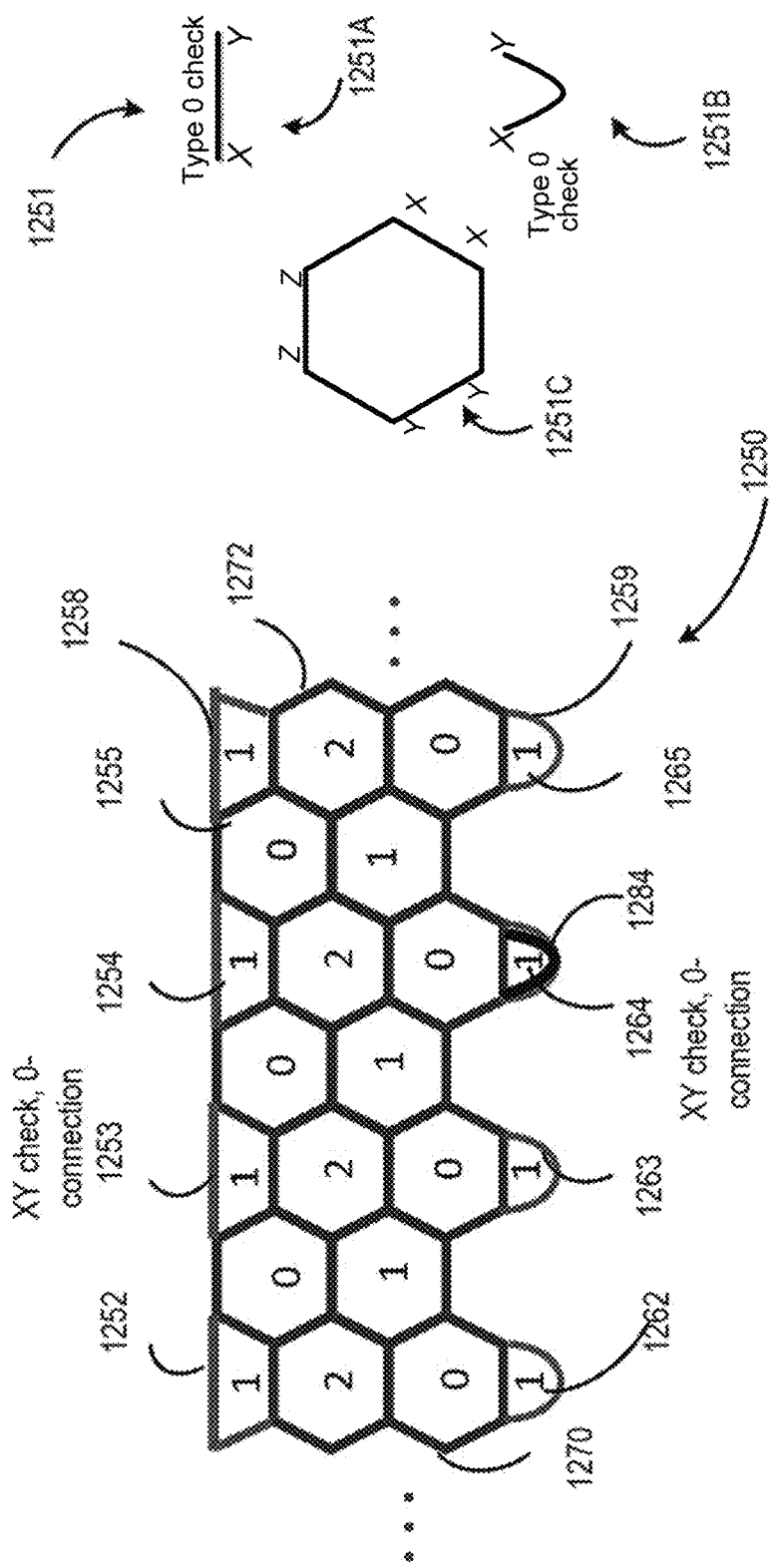
FIG. 12B illustrates an example of a hexagonal lattice with 2-gons on a bottom boundary and 4-gons at a top boundary and associated boundary check operators, according to one embodiment.
Figure 12C:
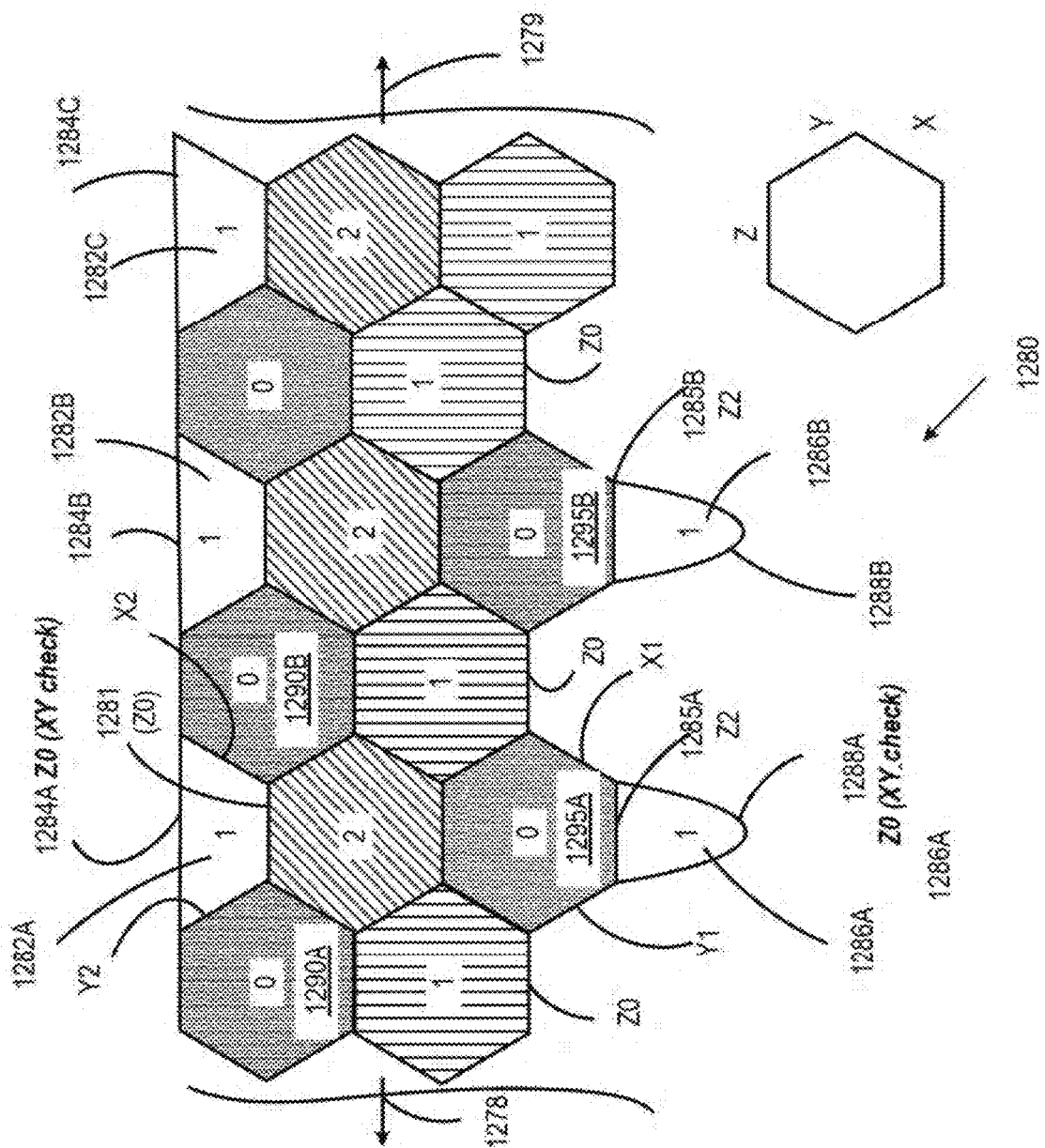
FIG. 12C illustrates an example of a hexagonal lattice with 4-gons on both top and bottom boundaries and associated boundary check operators, according to one embodiment.

FIG. 12C illustrates a strip 1280 arrangement of cells having representative boundaries based on two-sided cells referred to as 2-gons such as 1286A, 1286B (bottom edge) and four-sided cells referred to as 4-gons 1282A, 1282B (top edge) in a honeycomb arrangement such as discussed above. The strip 1280 continues at the left and right to form an annulus as indicated with arrows 1278, 1279. The 4-gons 1282A, 12826, 1282C are noted as type 1, continuing the 3-color arrangement. Connection labels and check assignments of innermost edges of the 4-gons 1282A, 1282B, 1282C such as edge 1281 (i.e., Z0) is unchanged from the assignments of the hexagonal grid. Outer edges 1284A, 1284B, 1284C are assigned connection labels based on the adjoining hexagonal cells 1290A, 1290B. Although the edges 1284A, 1284B, 1284C are parallel to a z-direction, an XY check is assigned and not a ZZ check. This XY check can be viewed as resulting from an X-edge and a Y-edge of full hexagons truncated to form the 4-gons 1282A, 1282B. For convenience, checks such as the XY check are referred to as complementary checks. As shown in FIG. 12C, the 4-gon edge 1284A could be labeled Z0 based on the z-directed edge and the 0 cell connection, but while the edge 1284A can participate in connection-labeled 0-rounds, an XY check is applied. The edges 1284B, 1284C also participate in 0-rounds but with XY checks. However, as noted above and discussed below, some edges do not participate in 0-rounds, despite having 0-connections.

The 2-gons 1286A, 1286B are noted as type 1, continuing the 3-color arrangement. Connection labels and check assignments of inner edges 1285A, 1285B of the 2-gons 1286A, 1286B are unchanged from the assignments of the hexagonal grid even though the hexagon type 2 cells connected by the inner edges 1285A, 1285B are not included. Outer edges 1288A, 1288B are assigned connection labels based the cells to which they connect.

The edges 1288A, 1288B are assigned XY checks which can be viewed as resulting from combining X-edges and Y-edges of full hexagons. As noted above, for convenience, checks such as the XY check are referred to as complementary checks. The connection labels correspond to those of the edges of the hexagonal cells 1295A, 1295B adjacent the 2-gons. As shown in FIG. 12C, the 2-gon edges 1288A, 1288B participate in connection-labeled 0-rounds with an XY check applied.

FIGS. 12A-12B illustrate arrangements that provide suitable boundary conditions. In the arrangement of FIG. 12A, a strip arrangement of cells 1200 includes hexagonal cells as discussed above and additional cells 1202-1205 (referred to as top boundary cells) are provided at a top boundary 1208 and additional cells 1212, 1213, and 1214 (referred to as bottom boundary cells) are provided at a bottom boundary 1218. The strip arrangement of cells 1200 can be continued at a left edge 1220 or a right edge 1222 and joined to make an (topological) annulus. The geometry of the hexagons may be termed an "armchair" geometry at the boundary following terminology used in describing carbon nanotubes. In this example, the additional cells 1202, 1203, 1204, 1205, 1212, 1213, and 1214 have four sides (edges) and are 4-gons.

The hexagonal cells of FIG. 12A are labeled as shown previously such as in FIG. 1B and the labeling of the border 4-gons continues this labeling. The top boundary cells 1202, 1203, 1204, and 1205 are labeled as type 0 and the bottom boundary cells 1212, 1213, and 1214 are labeled as type 2 following the usual 3-color mapping. In other examples such as in strips with additional hexagonal cells in a vertical direction, boundary cells can be of any type and the top and bottom boundary cells can all be of the same type. Edges of hexagonal cells at the top boundary 1208 are type 0 edges (connect 0-labeled hexagons) and the corresponding edges of the 4-gon boundary cells 1202, 1203, 1204, and 1205 are type 2 (connect 2-labeled hexagons); edges of hexagonal cells at the bottom boundary 1209 are type 2 edges (connect 2-labeled hexagons) and the corresponding edges of the 4-gon boundary cells 1212-1215 are type 0 edges (connect 0-labeled hexagons). For example, an edge 1233 of a bottom boundary cell 1213 is a type 0 edge and an edge 1235 of a hexagonal cell 1236 is a type 2 edge.

In the arrangement of FIG. 12B, a strip arrangement of cells 1250 includes hexagonal cells and additional cells 1252, 1253, 1254, and 1255 (referred to as top boundary cells) are provided at a top boundary 1258 and additional cells 1262, 1263, 1264, and 1265 (referred to as bottom boundary cells) are provided at a bottom boundary 1259. The strip arrangement of cells 1250 can be continued at a left edge 1270 or a right edge 1272 and joined to make an (topological) annulus. In this example, the additional cells 1252, 1253, 1254, and 1255 are 4-gons and the additional cells 1262, 1263, 1264, and 1265 are 2-gons.

The hexagonal cells of FIG. 12B are labeled as shown previously as in FIG. 1B and the labeling of the border 4-gons and 2-gons continues this labeling. The top boundary cells 1252, 1253, 1254, and 1255 are labeled as type 1 and the bottom boundary cells 1262, 1263, 1264, and 1265 are labeled as type 1. In other examples such as in strips with additional hexagonal cells in a vertical direction, boundary cells can be of any type and the top and bottom boundary cells can all be of the same type or different types. Boundary (curved edges) such as edge 1284 of the bottom boundary cell 1264 are type 0 edge (connect to a 0-labeled cell); the other edges of the 2-gons are type 2 edges (they extend into missing type 2 hexagonal cells).

FIGS. 12A-12B show that a height of a strip can be tuned by using different boundary conditions. FIGS. 12A-12B also illustrate sets of check operators 1201, 1251 associated with the strip arrangements 1200, 1250, respectively. In FIG. 12A, checks associated with hexagonal cells are illustrated on hexagons as XX, YY, ZZ (combinations of Pauli operators discussed above) as shown at 1201C. Checks associated with boundary edges of the top and bottom 4-gons are shown as a Type 2 check (XY) and a Type 0 check (XY) at 1201A, 1201B, respectively. In FIG. 12B, checks associated with hexagonal cells are illustrated on a hexagon as XX, YY, ZZ (combinations of Pauli operators) as shown at 1251C. Checks associated with boundary edges of the top 4-gons and bottom 2-gons are shown as a Type 0 check (XY) and a Type 0 check (XY) at 1251A, 1251B, respectively. Checks applied to boundary edges are generally complementary. For example, if a boundary edge is associated with a connection direction to which an XX, YY, or ZZ check is to be applied, the boundary edge is associated with a YZ, XZ, or XY check, respectively.

Note that the perpetual plaquette stabilizer on a 2-gon has weight 2. Further, note that if there is measured a check which is an edge of a 2-gon (either type 0 or type 2 in this figure), then the two qubits in the 2-gon are in a Bell state, and so disentangled from the others.

It is routine to identify an embedded toric code state with gapped boundary after each round. Every check projects a pair of qubits into an effective qubit ($C^2$) and perpetual plaquette stabilizers correspond to vertex and plaquette stabilizers on a superlattice of the effective qubits. The result is drawn in FIGS. 13A-13B; see the quadrants labeled by 0, 1, and 2 (not by 0*).

The thickness of the annulus is chosen such that the top boundary conditions of the embedded toric code state match the bottom ones. With a different thickness it is possible to have 2-gons at both top and bottom.

Figure 13A:
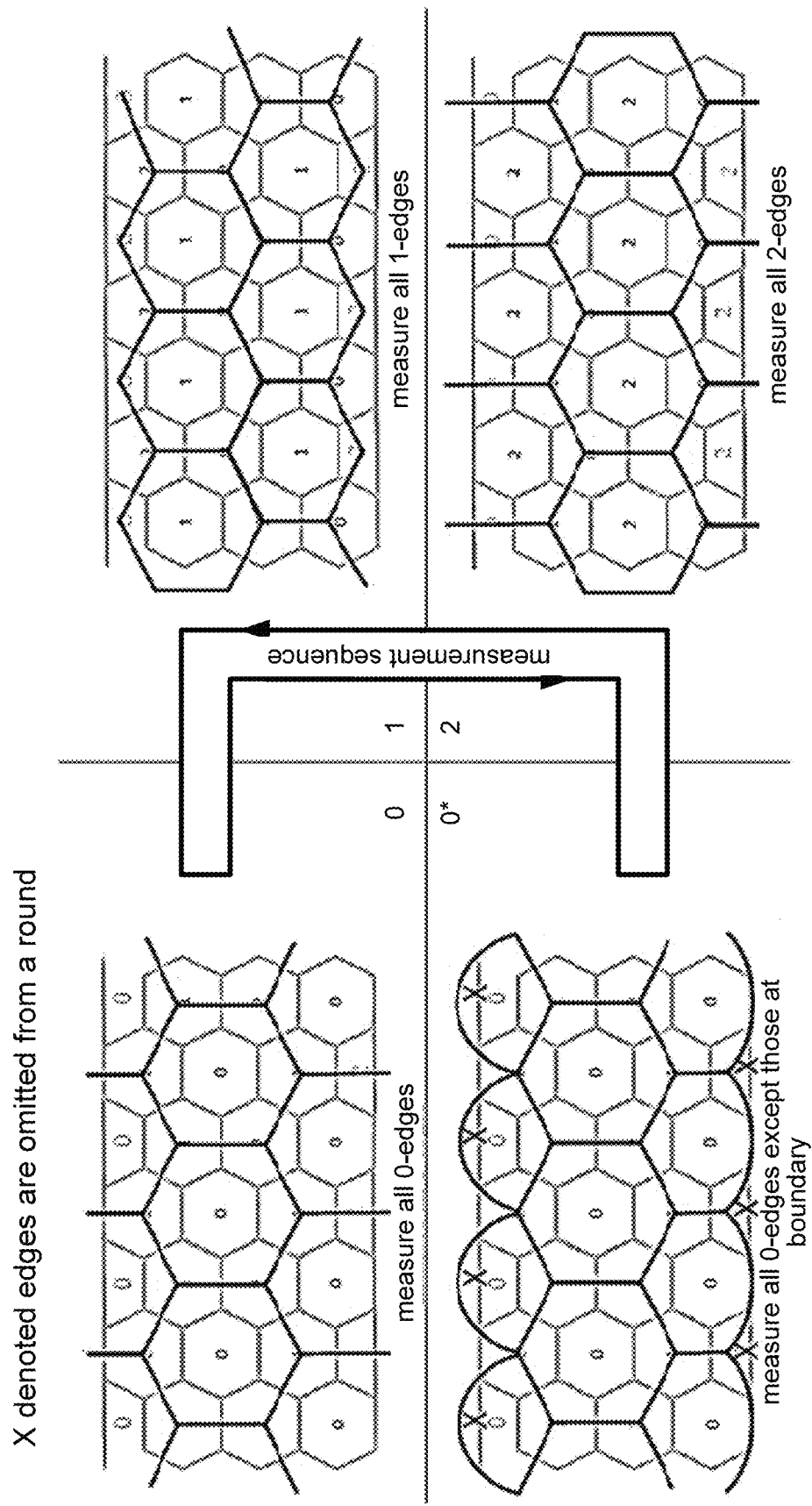
FIG. 13A illustrates an example of a measurement sequence associated with an arrangement such as shown in FIG. 12A in which marked edges are omitted from a round, according to one embodiment.

With reference to FIG. 13A, at each round, the superlattice supports an embedded toric code state with boundaries. After round 0, each 4-gon at the bottom has two edges of type 0, both of which are measured. Since there is a perpetual plaquette stabilizer at each 4-gon, the instantaneous stabilizers on a 4-gon project its four qubits down to $C^2$, depicted by a slightly longer vertical superedge. After round 2, a similar projection is realized at the top 4-gons of type 0. After round 0*, the edges of type 0 at the boundary (top and bottom) are not measured, and therefore the type 2 check at the boundary remains in the ISG, projecting its two qubits to $C^2$. These projections make super-3-gons and super-5-gons at the boundaries.

Figure 13B:
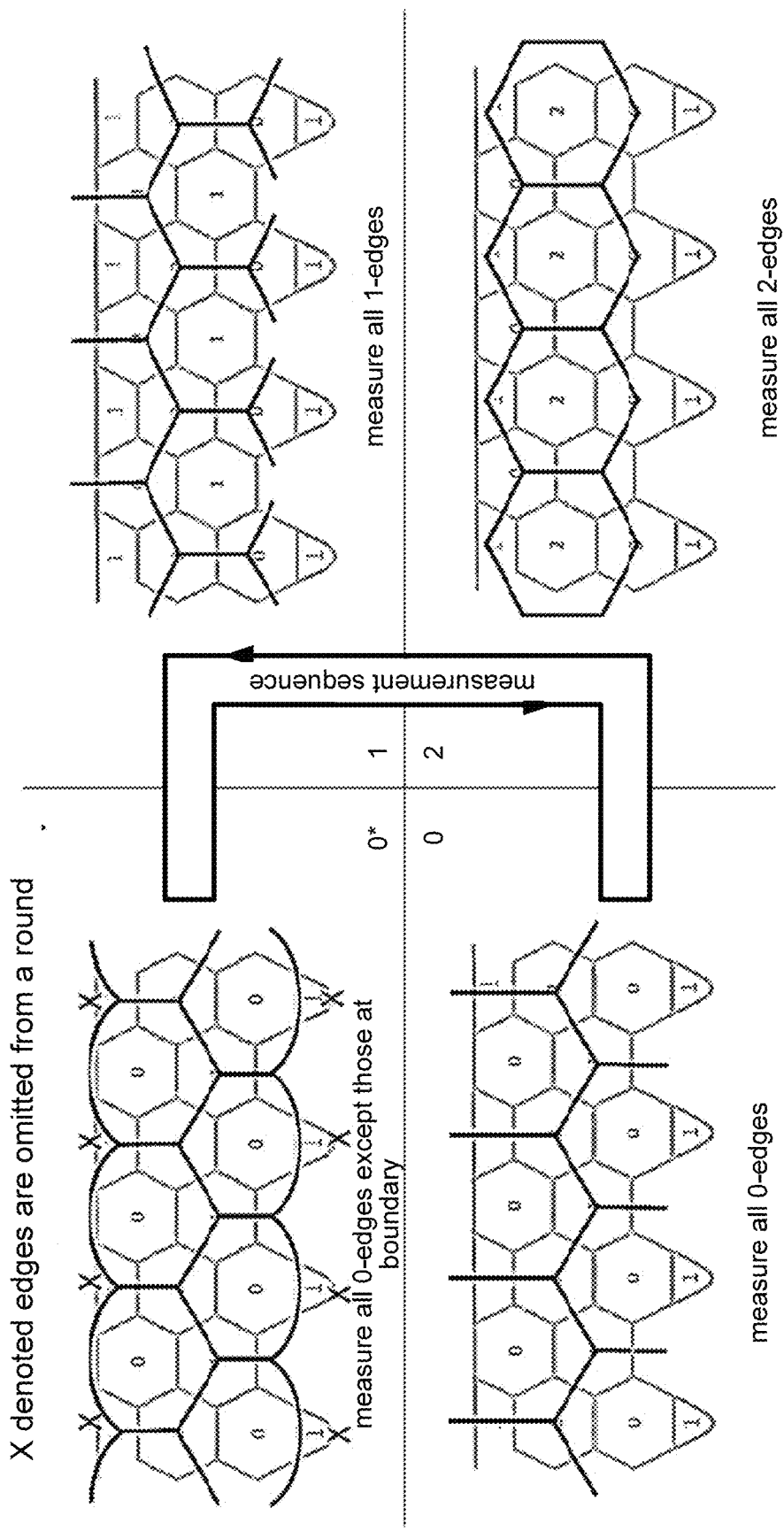
FIG. 13B illustrates an example of a measurement sequence associated with an arrangement such as shown in FIG. 12B in which marked edges are omitted from a round, according to one embodiment.

Superlattices similar to those in FIG. 13A are shown in FIG. 13B. After round 0*, the checks of type 1 at the top boundary remain in the ISG, rendering the superlattice to have 5-gons at the top boundary. The perpetual plaquette stabilizer on each 2-gon projects the two qubits of the 2-gon to $C^2$, rendering the superlattice to have 5-gons at the bottom boundary. The product of the two type 1 checks positioned the lowest in the figure around a "bay," survives in the ISG and gives the supervertex stabilizer. After round 2, the type 2 check on the edge of a 2-gon and its perpetual stabilizer make a Bell state, disentangling the two qubits of the 2-gon from the others. After round 0, each 4-gon makes its four qubits into one effective qubit, and each 2-gon makes a Bell state.

Under the choice of boundaries with all 4-gons as in FIG. 12A, if type 2 checks are measured and then type 0 checks are measured, the inner logical operator would be revealed, destroying the dynamically generated logical qubit. This may be understood in two ways. One way is that the bulk dynamics interchanges electric and magnetic operators every round, while the boundary conditions after round 2 and round 0 are of the same type (both rough) rather than alternating. Another way is to view the annulus on a topological 2-dimensional sphere so that the bottom edges form the boundary of a single "very large plaquette" of type 1; measuring type 2 and then type 0 checks infers the stabilizer of the very large plaquette. A similar problem arises in FIG. 12B. In this case, the "very large plaquette" is of type 2, whose stabilizer (an inner logical operator) would be revealed if type 0 are measured and then type 1 checks are measured.

To have a dynamically generated logical qubit on an annulus, while using only pairwise checks, we modify the bulk measurement sequence as follows. We measure edges of type 0, 1, 2, 0*, 2, 1 in order and repeating. Depending on the boundary geometry we may use a sequence

0*, 1, 2, 0, 2, 1.

Such sequences have period 6, not 3. The notation is that 0, 1, 2 means measuring all checks of the given type, but 0* means measuring all type-0 checks except those on a boundary. Thus we do not reveal the inner operator.

Both sequences infer all small plaquettes: for (a, b, c) that is a permutation of (0, 1, 2), after measuring checks of type a and type b in succession, we infer plaquette stabilizers of type c. In other words, we infer plaquette stabilizers of type 2, 2, 0, 1, 1, 0 in sequence. This is independent of where we have 0* in the measurement sequence. The boundary conditions in the embedded toric codes are alternating from round to round as they should.

It is also possible to continue the bulk sequence 0, 1, 2 indefinitely at the cost of "shrinking" the code. For example, after measuring 0, 1, 2, 0* in FIG. 13A, we may measure a two-qubit Pauli operator on each of the type 2 edges on the boundary; this operator, however, will involve the same Pauli operators as the type 0 checks on the boundary. In this way, we bring the pair of qubits on each such check into a Bell state, disentangling them from the rest of the code, turning the type 0 hexagons on the boundary into 4-gons on a smaller code. As a result, measuring type 1 checks leaves rough boundary conditions on the smaller code. We may continue in this way, shrinking the code while retaining the same bulk sequence, and then occasionally using higher weight checks to do surgery to increase the code thickness back.

Figure 14:
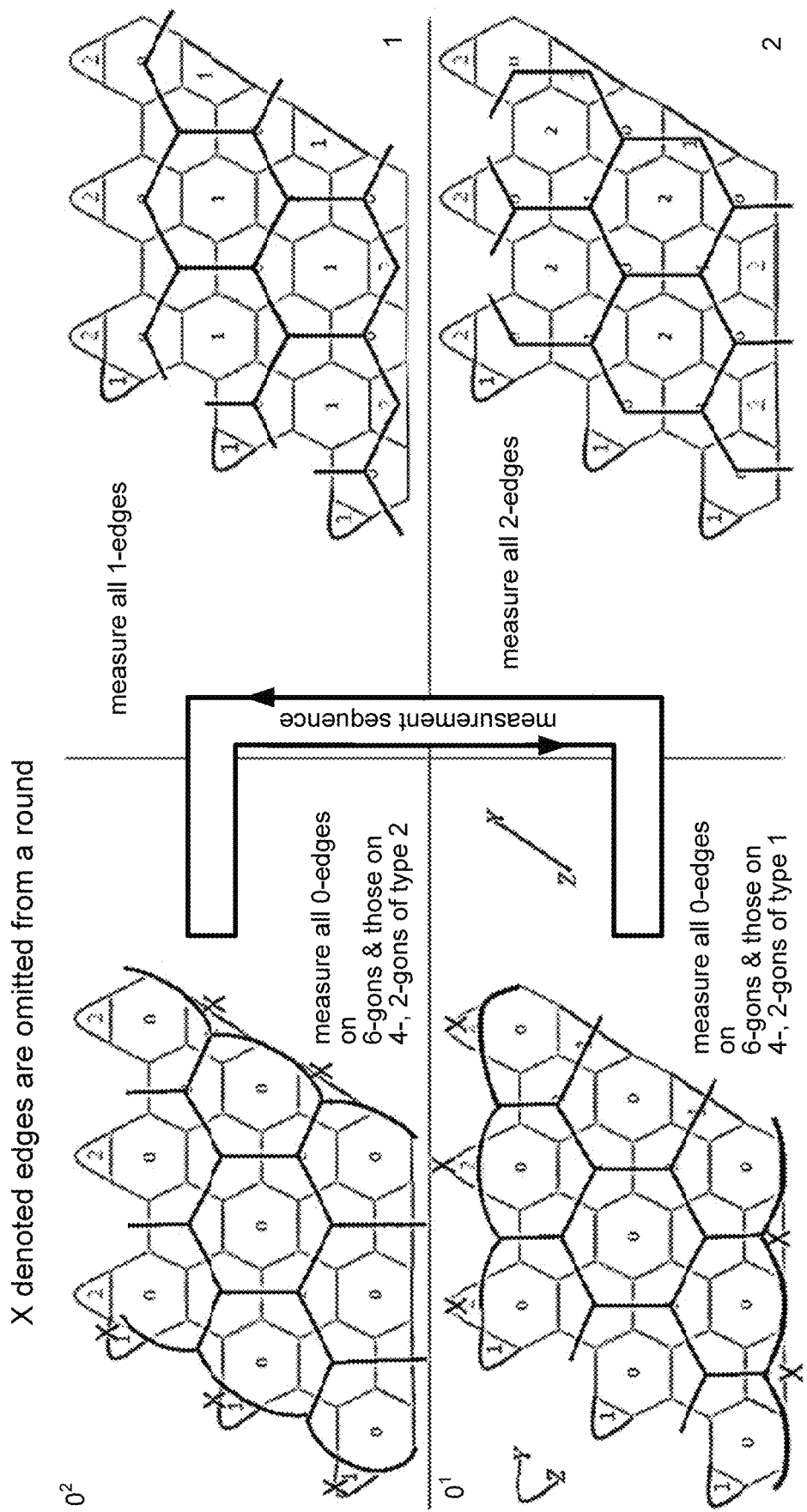
FIG. 14 illustrates an example of a parallelogram patch of honeycomb code using 4- and 2-gon boundaries and an associated measurement sequence, according to one embodiment.

FIG. 14 illustrates a parallelogram patch of honeycomb code using 4- and 2-gon boundaries. The construction of superlattice follows the same method as above. New phenomena occur at the corners. First, the top left qubit participates in four checks, and there is no static plaquette stabilizer associated with the two intersecting 2-gons; however, the three qubits in the support of these two 2-gons are in some subspace $C^2$ always (except for the very first round). Second, in the lower left corner after round $0^2$ the perpetual plaquette stabilizer at the 2-gon and the type 1 check from the previous round 1 project the three qubits covered by the curvy line to a subspace $C^2$. A symmetric situation (1↔2) is observed in the top right corner at round $0^1$.

Figure 15A:
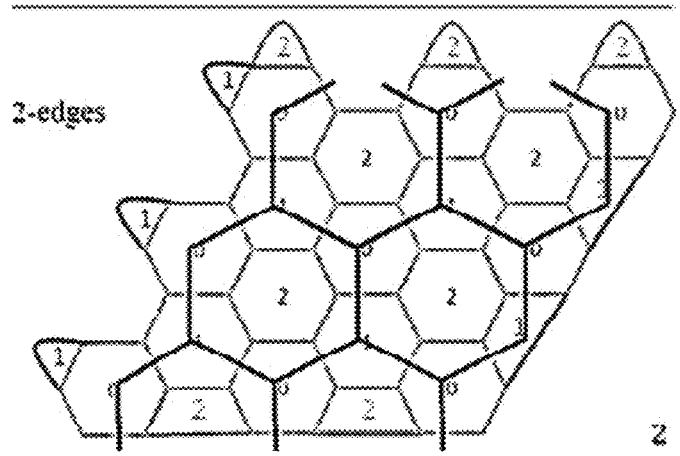
FIG. 15A illustrates step 2 of a measurement sequence of a Floquet code for the parallelogram patch of honeycomb code using 4- and 2-gon boundaries, according to one embodiment.

Now, alternate boundary conditions for the Floquet honeycomb code are discussed. FIG. 15A shows a step for measuring two-qubit Pauli operator on each of the type 2 edges, as shown in the lower right panel of FIG. 14. FIG. 15A shows a parallelogram patch whose boundaries involve both 2-gons and 4-gons.

FIGS. 15B-E illustrate alternate honeycomb boundary measurement choices on the physical layout, which involves boundary 4-gons, which along a horizontal boundary have similar physical requirements (measurements involving a single coherent link) to those of the boundary 2-gons used above. These boundary 4-gons along a vertical boundary require long-distance measurement loops that are better to avoid from a physical resource point of view. It is noted that implementing the long-distance measurements for 4-gons and 6-gons along vertical boundaries could potentially be obviated by using auxiliary qubits.

Figure 15B:
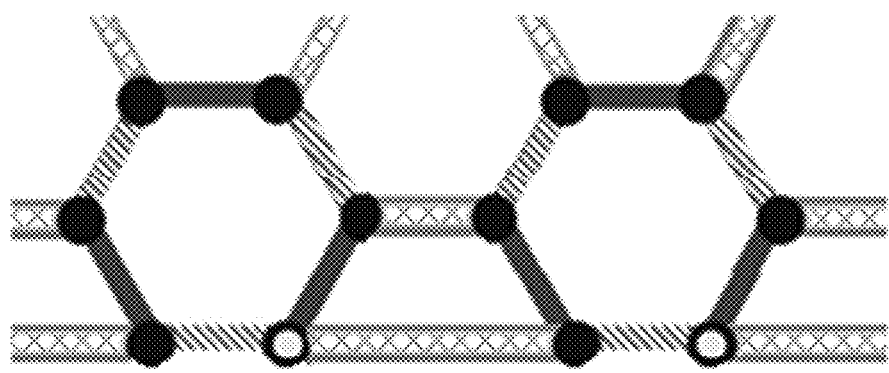
FIG. 15B illustrates an example of a hexagon lattice of a bottom edge of the parallelogram patch of FIG. 15A, according to one embodiment.
Figure 15C:
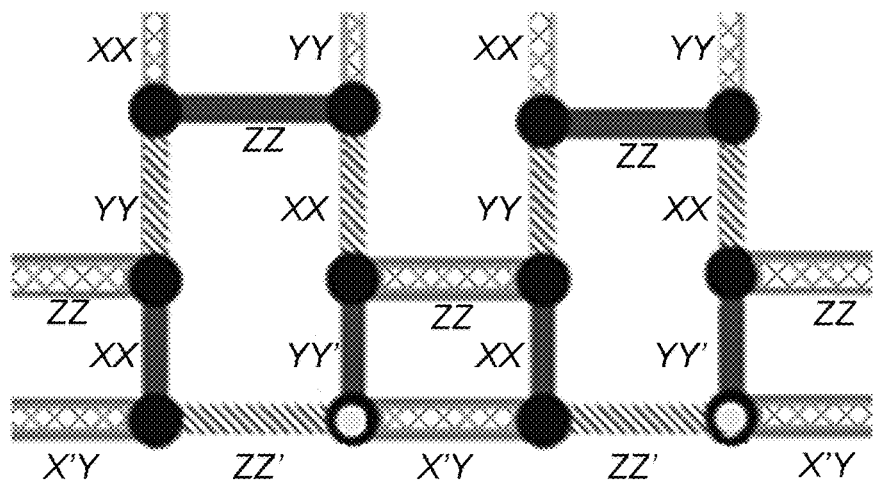
FIG. 15C illustrates an example of a brick diagram of a bottom edge of the parallelogram patch of FIG. 15A, according to one embodiment.
Figure 15D:
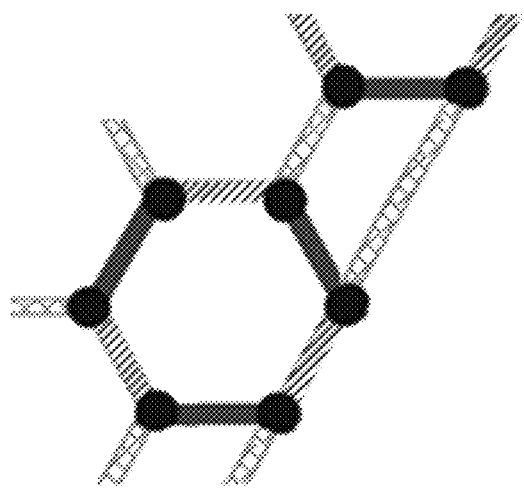
FIG. 15D illustrates an example of a hexagon lattice of a right edge of the parallelogram patch of FIG. 15A, according to one embodiment.
Figure 15E:
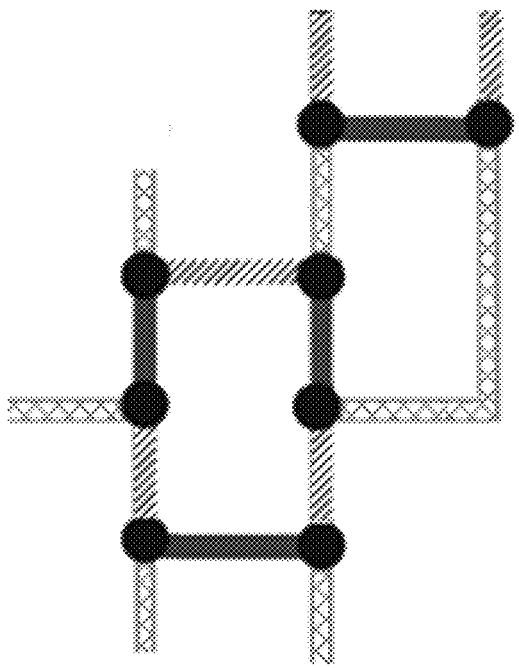
FIG. 15E illustrates an example of a brick diagram of a right edge of the parallelogram patch of FIG. 15A, according to one embodiment.

FIG. 15B shows a hexagon lattice implementation of the horizontal 4-gon boundaries. FIG. 15C shows a vertical brick wall implementation of the horizontal 4-gon boundaries. The qubits with white dots at their center indicate qubits encoded in the primed basis. The new boundary measurement X'Y involves one coherent link, with similar physical resource requirements to the 2-gon boundaries used in previous slides. FIG. 15D shows a hexagon lattice implementation of the vertical 4-gon boundaries—the diagonal edge in the Honeycomb FIG. 15E shows a vertical brick-wall implementation of the vertical 4-gon boundaries—the diagonal edge in the honeycomb lattice maps to an edge between next-next nearest neighbor qubits in the vertical brick wall implementation, requiring a long-distance measurement loop that is unfavorable in the tetron implementation Now, alternate boundary conditions for the Floquet square-octagon code are discussed. FIGS. 16A-D illustrates alternate square-octagon boundary measurement choices. The square octagon lattice can have boundary 6-gons that involve single coherent link measurements along horizontal boundaries, and long-distance measurement loops along vertical boundaries. For this mapping, it is beneficial to use yet another qubit encoding (the double-primed basis) that swaps Z and Y, while leaving X unchanged (up to signs).

Figure 16A:
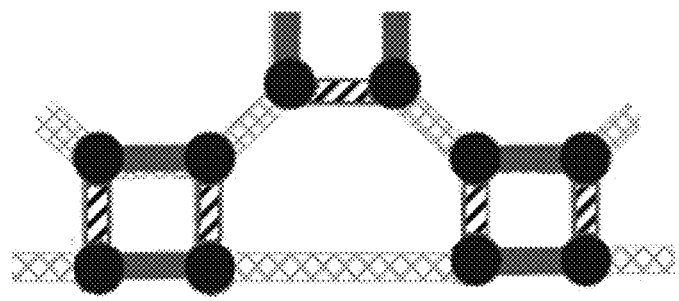
FIG. 16A illustrates an example of a square-octagon lattice of a bottom edge, which is analogous to the 4-gon boundaries for the honeycomb code illustrated in FIG. 15B, according to one embodiment.
Figure 16B:
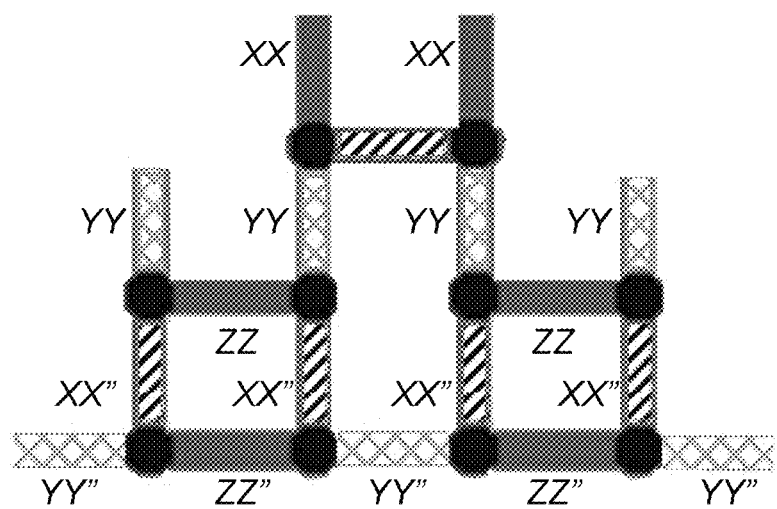
FIG. 16B illustrates an example of a square-octagon brick diagram of a bottom edge, which is analogous to the 4-gon boundaries for the honeycomb code illustrated in FIG. 15C, according to one embodiment.
Figure 16C:
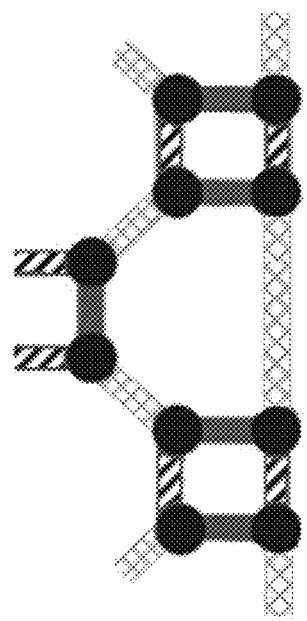
FIG. 16C illustrates an example of a square-octagon lattice of a right edge, which is analogous to the 4-gon boundaries for the honeycomb code illustrated in FIG. 15D, according to one embodiment.
Figure 16D:
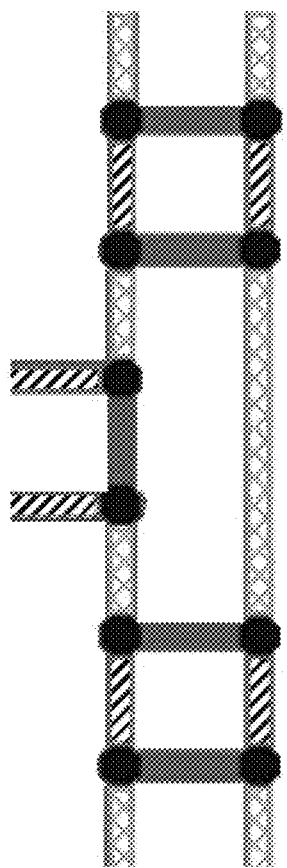
FIG. 16D illustrates an example of a square-octagon brick diagram of a right edge, which is analogous to the 4-gon boundaries for the honeycomb code illustrated in FIG. 15E, according to one embodiment.

FIGS. 16A-B show a vertical brick wall implementation of the horizontal 6-gon boundaries. The qubits having a grey dot at their center indicate qubits encoded in the double-primed basis: X"=X, Z"=Y, Y"=Z up to signs. The new measurements, ZZ", Y"Y each require one coherent link. FIGS. 16A-B show vertical brick-wall implementation of the vertical 6-gon boundaries. The vertical edge maps to a long-distance measurement loop between qubits three rows apart. Therefore, it is favorable to avoid these types of boundaries.

Note that implementing the long-distance measurements for 4-gons and 6-gons along vertical boundaries could potentially be obviated by using auxiliary qubits.

Now, embodiments using hexons rather than tetrons are discussed. The physical layout for two-sided tetrons applies equally well to two-sided hexons for both the honeycomb and square-octagon Floquet codes. The straightforward implementation simply replaces every tetron with a hexon, keeping coherent links separating each row of qubit islands. Note that, as for the tetron implementation, bulk measurements do not require coherent links, while certain boundary measurements do. The additional topological wires in the hexon implementation therefore add length to the semiconducting segments (for bulk YY measurements, as well as for certain boundary measurements) and thus the straightforward implementation of Floquet codes with hexons looks less favorable than Floquet codes with tetrons.

The encoding of the hexons may be further optimized to avoid using coherent links for boundary measurements. In this case, coherent links can be removed throughout the physical layout (sacrificing the ability to perform complete single qubit characterization), such that the bulk measurement loops have the same physical distance as for the tetron implementation, and the boundary measurement loops are preferable.

Figure 17A:
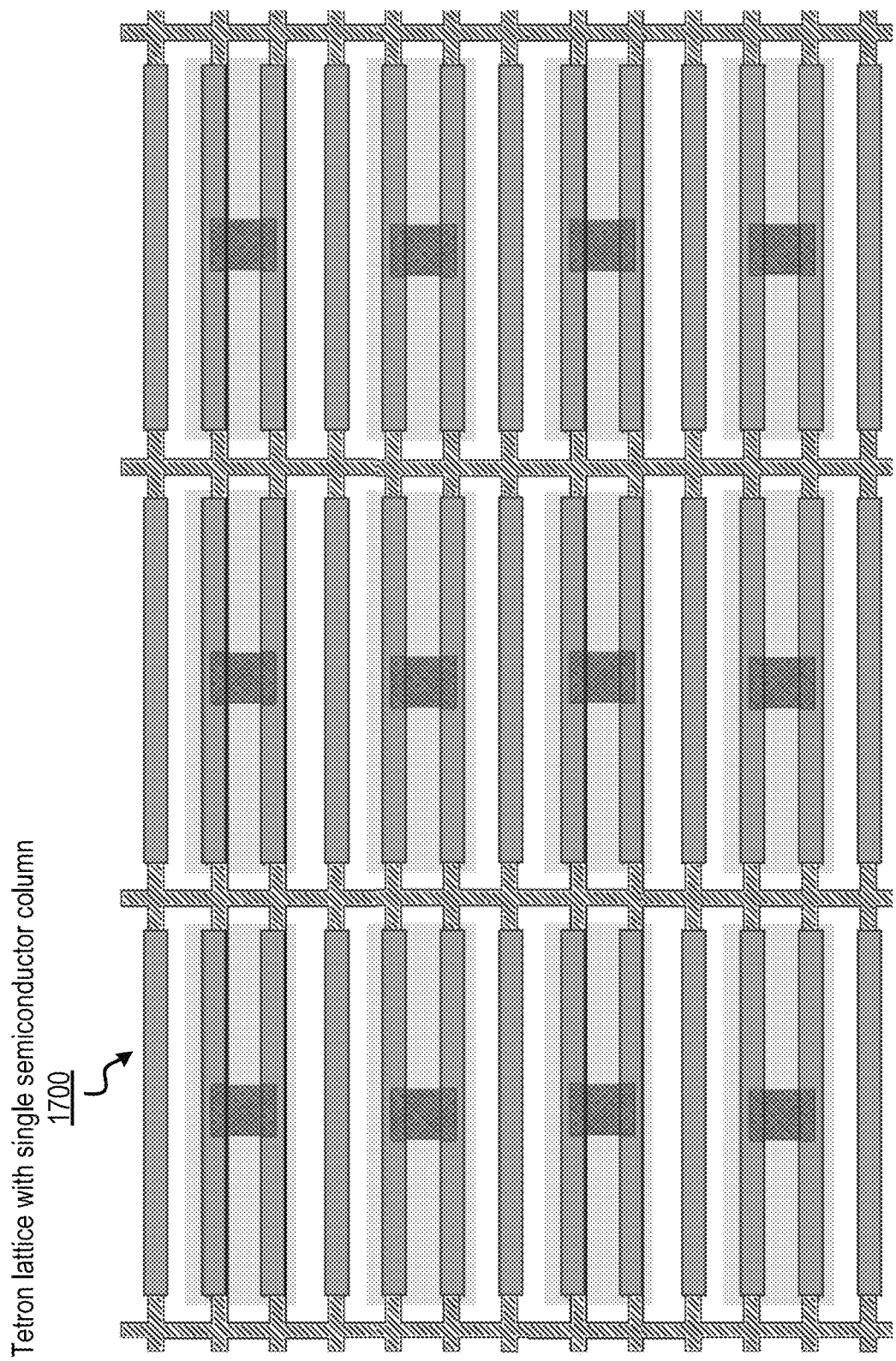
FIG. 17A illustrates an example of a tetron lattice with single semiconductor column, according to one embodiment.

Now, embodiments using a single semiconducting column with vertical brick wall mapping are discussed. FIG. 17A shows a tetron lattice 1700 having a single semiconductor column. As shown in FIG. 17A, the physical tetron layout 1700 has a single semiconducting column separating columns of qubit islands. In contrast to the double semiconducting column tetron lattice 200, here, the two semiconducting columns between each column of qubits are replaced by a single semiconducting column. However, this reduction of the number of semiconducting columns entails doubling the number of time steps to implement the Floquet code in either the honeycomb or the square-octagon lattice. In the double semiconducting column tetron lattice 200, the two semiconducting columns are used to avoid intersecting measurement loops (e.g., between $X_{NE}X_{SE}$ and $Y_{NW}Y_{SW}$ for the honeycomb code, or between $X_{NE}X_{SE}$ and $X_{NW}X_{SW}$ for the square octagon code). If these measurements are divided between two time steps, there is no need for two semiconducting columns separating columns of qubit islands in the bulk. Vertical boundary measurements involving Z also require the two semiconducting columns. These can be avoided with an alternate choice of boundary conditions for the patches, or by changing the encoding of certain boundary qubits.

Now, embodiments using a horizontal brick wall mapping are discussed. In contrast to the single semiconducting column with vertical brick wall mapping discussed above, which uses 12 time steps, the Floquet code can be implemented in six time steps with a square lattice of qubit islands separated by a single semiconducting column by mapping the honeycomb lattice to a horizontal brick wall. In this layout, two thirds of the bulk measurements require one coherent link (half of the measurements between horizontal nearest neighbors), while the other third of bulk measurements do not use coherent links. Some of the boundary measurements involve two coherent links, and thus are expected to be more resource intensive than any of the measurements used in the vertical brick wall mapping. For the nonlimiting example discussed herein, the disclosure mostly focuses on two-sided tetrons; the same implementation can be done using two-sided hexons, with the same tradeoffs discussed above. Note that the horizontal brick wall mapping of the square-octagon lattice would still uses two semiconducting columns separating columns of qubit islands, as otherwise the measurement loops corresponding to the vertical edges of square plaquettes would intersect, as illustrated in FIG. 17B.

Figure 17B:
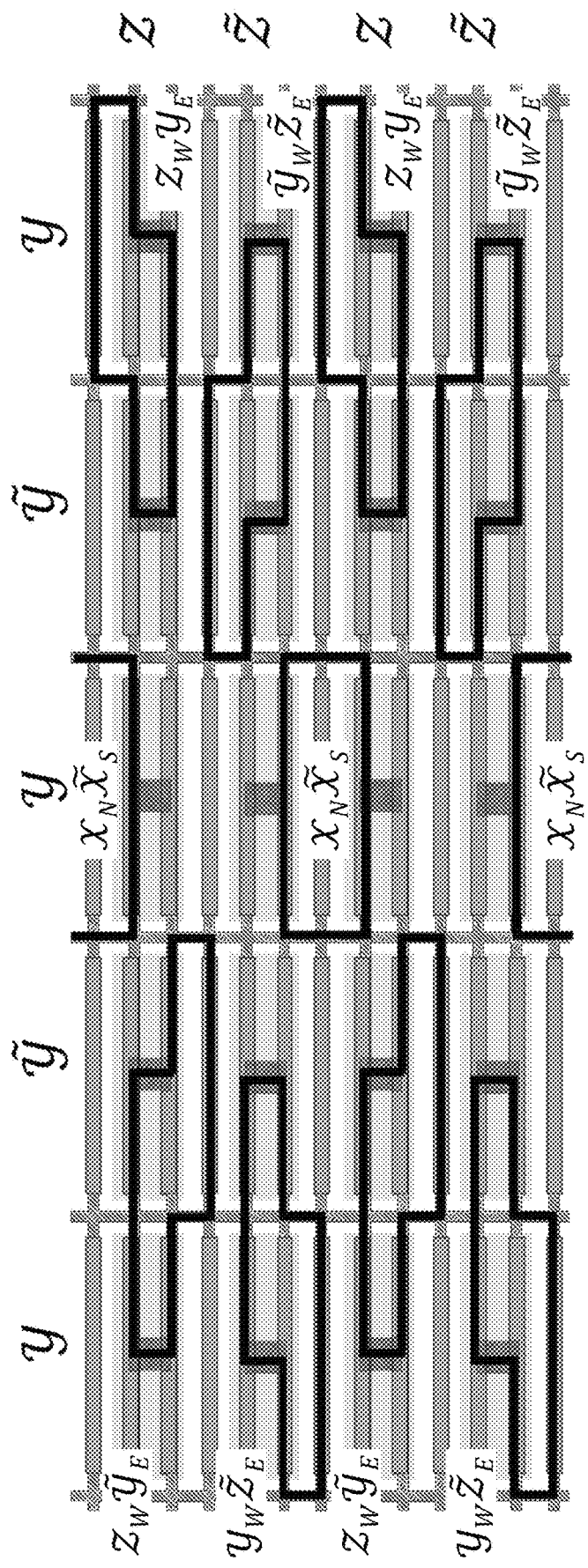
FIG. 17B illustrates an example of a step in a measurement sequence using the tetron lattice with single semiconductor column of FIG. 17A, according to one embodiment.

FIG. 17B shows bulk measurements for the horizontal brick wall mapping of the Floquet honeycomb code. Here, vertical two-qubit measurements are fixed to be XX (no coherent links). Horizontal measurements are either ZY (rows labeled by $\mathcal{Z}$) or YZ (rows labeled by $\tilde{\mathcal{Z}}$). Both the $\mathcal{Z}$ rows and the $\tilde{\mathcal{Z}}$ rows use one coherent link. The choice of which Y measurement is determined by the column of that qubit island (i.e., the Y measurement is different depending on whether the column is a $\mathcal{Y}$ column or a $\tilde{\mathcal{Y}}$ column). The choice of using the upper or lower coherent link is determined by the closest column of XX measurements to avoid intersecting measurement loops. Other choices are possible without increasing measurement distances (for instance fixing vertical two-qubit measurements to be YY and horizontal measurements to be ZX, XZ). Note that the single semiconducting column separating columns of qubit islands restrict which measurement loops can be performed simultaneously, reducing the flexibility of measurement choices compared to the physical layout with two semiconducting columns separating columns of qubit islands.

Figure 18A:
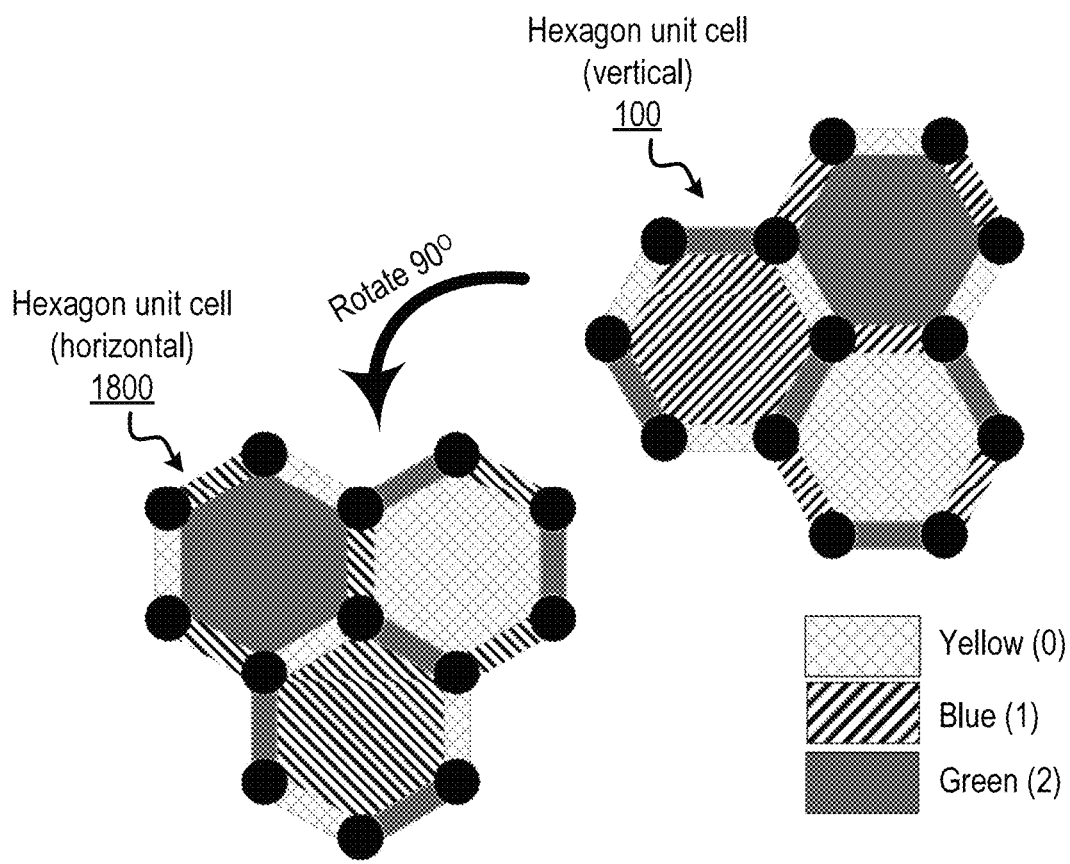
FIG. 18A illustrates an example of a hexagon unit cell for a horizontal brick wall, according to one embodiment.
Figure 18B:
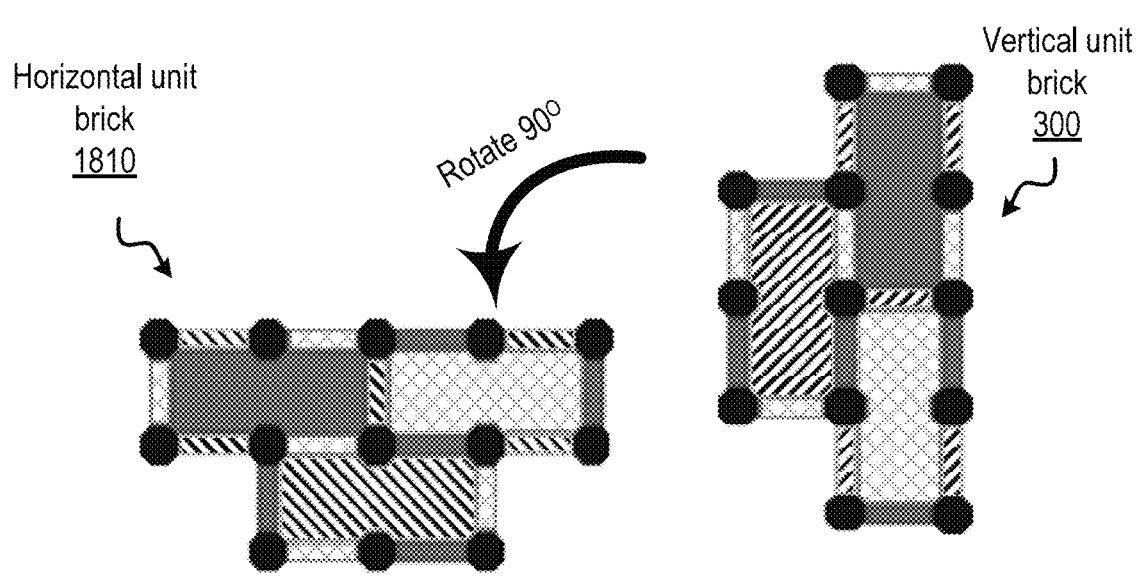
FIG. 18B illustrates an example of a unit brick for a horizontal brick wall, according to one embodiment.
Figure 18C:
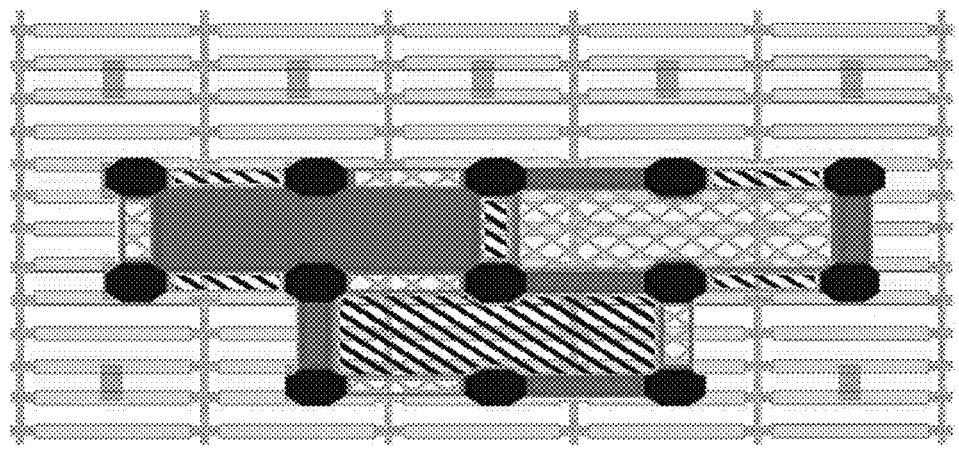
FIG. 18C illustrates an example of a unit brick for a horizontal brick wall superimposed over a tetron lattice having a single semiconductor column, according to one embodiment.
Figure 18D:
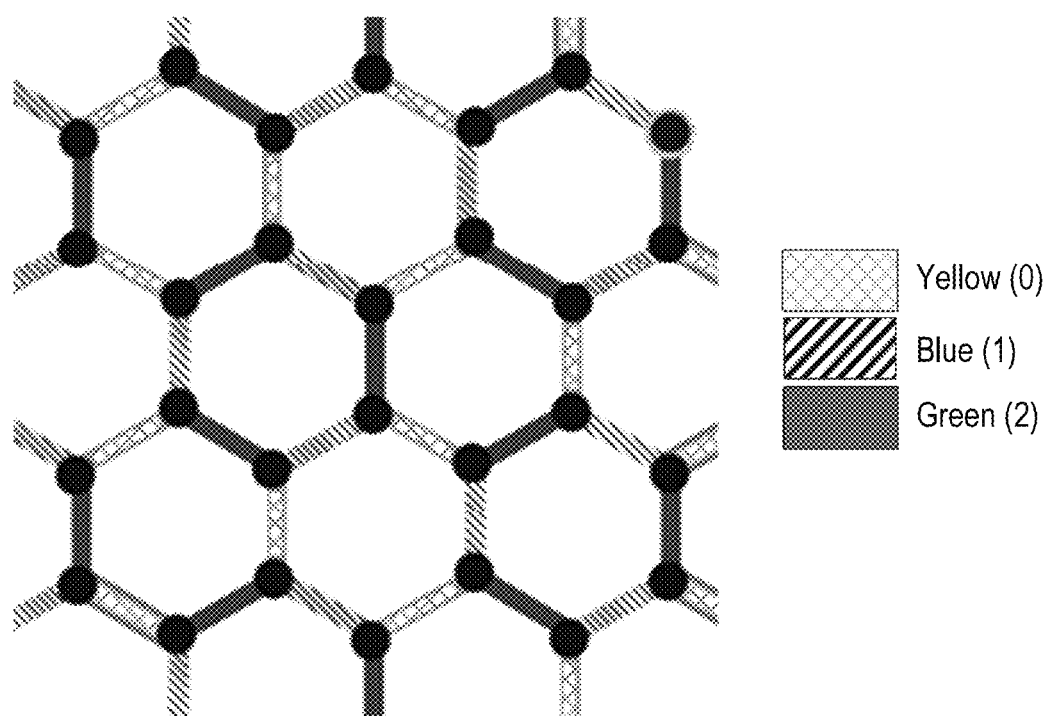
FIG. 18D illustrates an example of a bulk hexagon lattice for a horizontal brick wall, according to one embodiment.

FIG. 18A (FIG. 18B) shows that the horizontal hexagon unit cell 1800 (horizontal unit brick 1810) is related to the vertical hexagon unit cell 100 (vertical unit brick 300) by a 90 degree rotation. between the s that the horizontal brick configuration. FIG. 18C shows the horizontal unit brick 1810 superimposed of the single semiconducting column tetron lattice 1700. FIG. 18D shows a bulk mapping of honeycomb lattice to horizontal brick wall honeycomb lattice. Again, black dots correspond to qubits and edges correspond to 2-qubit measurements with explicit measurement loops shown FIGS. 18E-G. Colors indicate which time step each measurement is performed in.

Figure 18E:
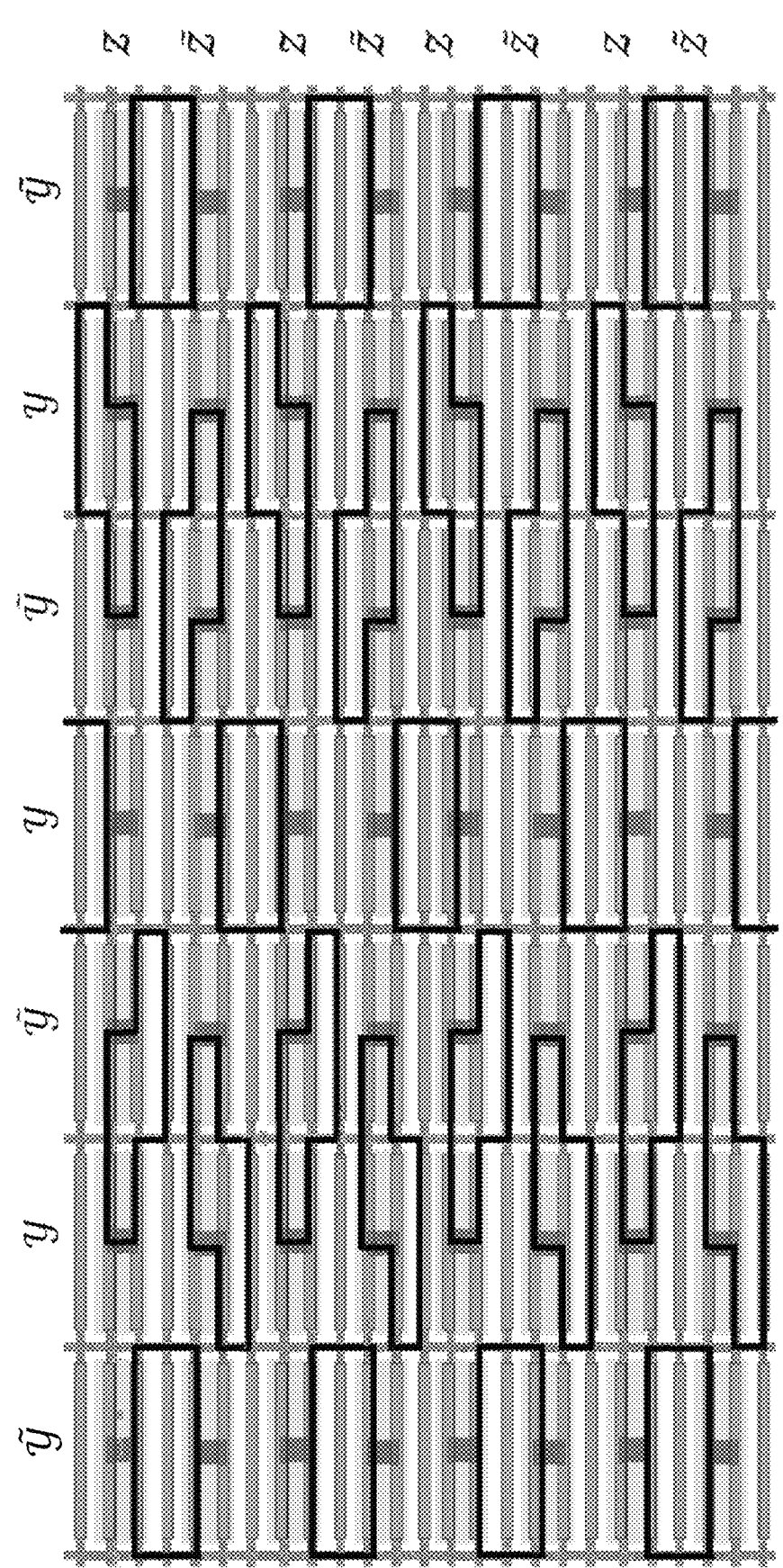
FIG. 18E illustrates an example of a first step of a bulk Floquet code for a horizontal brick wall implementation, according to one embodiment.
Figure 18F:
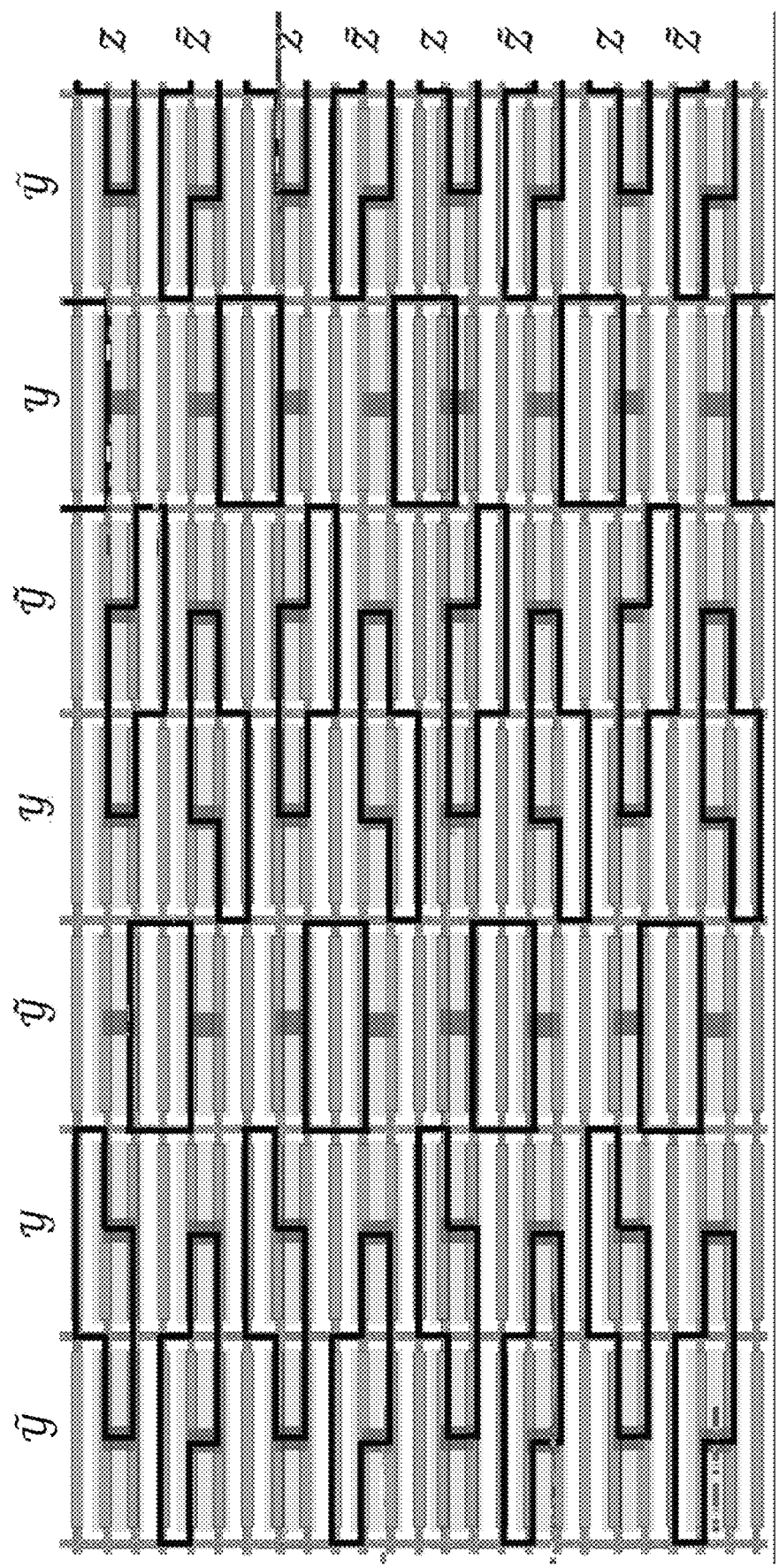
FIG. 18F illustrates an example of a second step of a bulk Floquet code for a horizontal brick wall implementation, according to one embodiment.
Figure 18G:
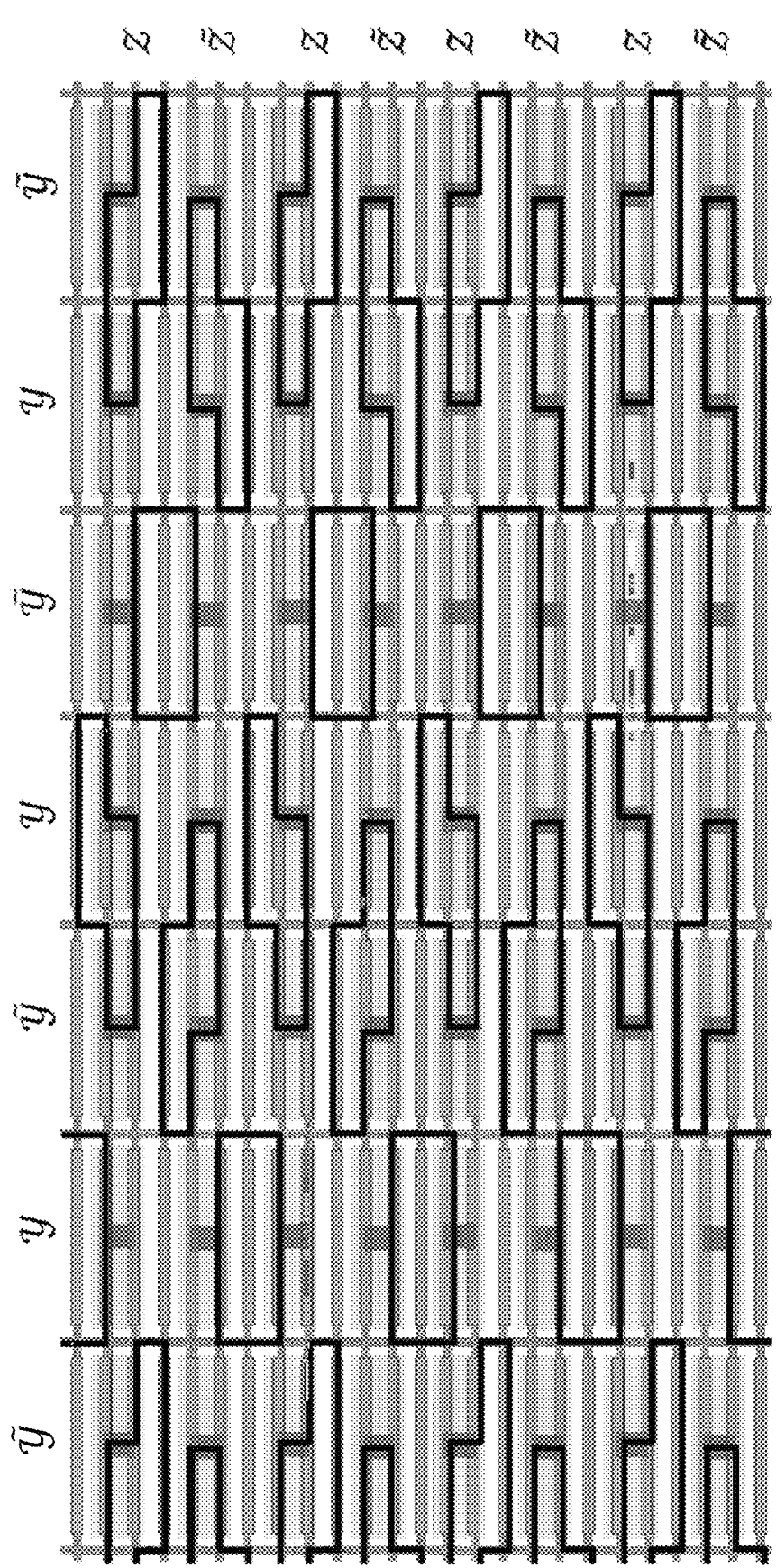
FIG. 18G illustrates an example of a third step of a bulk Floquet code for a horizontal brick wall implementation, according to one embodiment.

FIGS. 18C-D show the horizontal brick wall mapping of the honeycomb lattice, and the horizontal brick wall mapping/correspondence to the physical tetron layout 1700. The bulk measurements for one of the steps of the Floquet code are shown in FIG. 17B. FIGS. 18E-G show the bulk measurements for steps 1, 2, and 3 of the Floquet code. Significantly, there are several differences compared to the vertical brick wall mapping of the honeycomb lattice.

First, avoid two-qubit measurements using two-coherent links in the bulk of the code, rather than using the bulk measurement set of XX, YY, and ZZ as done in the vertical brick wall mapping, the horizontal brick wall mapping instead uses XX on all vertical links, and Y Z and ZY on alternating rows of qubit islands.

Second, whereas the vertical brick wall implementation of the honeycomb Floquet code was flexible with regard to using $\mathcal{Y}$ measurements or $\tilde{\mathcal{Y}}$ measurements, this exemplary the horizontal brick wall mapping is not flexible with regard to using $\mathcal{Y}$ measurements or $\tilde{\mathcal{Y}}$ measurements. Because there is a single semiconducting column separating columns of qubit islands, the choice of whether $\mathcal{Y}$ measurement or $\tilde{\mathcal{Y}}$ measurement needs to be made carefully to avoid intersecting measurement loops in each time step. The measurement circuit shown in FIG. 17B (see also FIG. 18E-G) shows one such choice. Different choices/options are shown in FIG. 18I.

Third, for the illustrated pattern of bulk measurements, it is unavoidable to use 2-coherent links in certain boundary measurements in this layout. Vertical YY measurements do not use coherent links. Horizontal ZX and XZ measurements use one coherent link. Horizontal YX and YX measurements use two coherent links. Other choices of which coherent links to use in the measurement loops are valid as well.

Figure 18H:
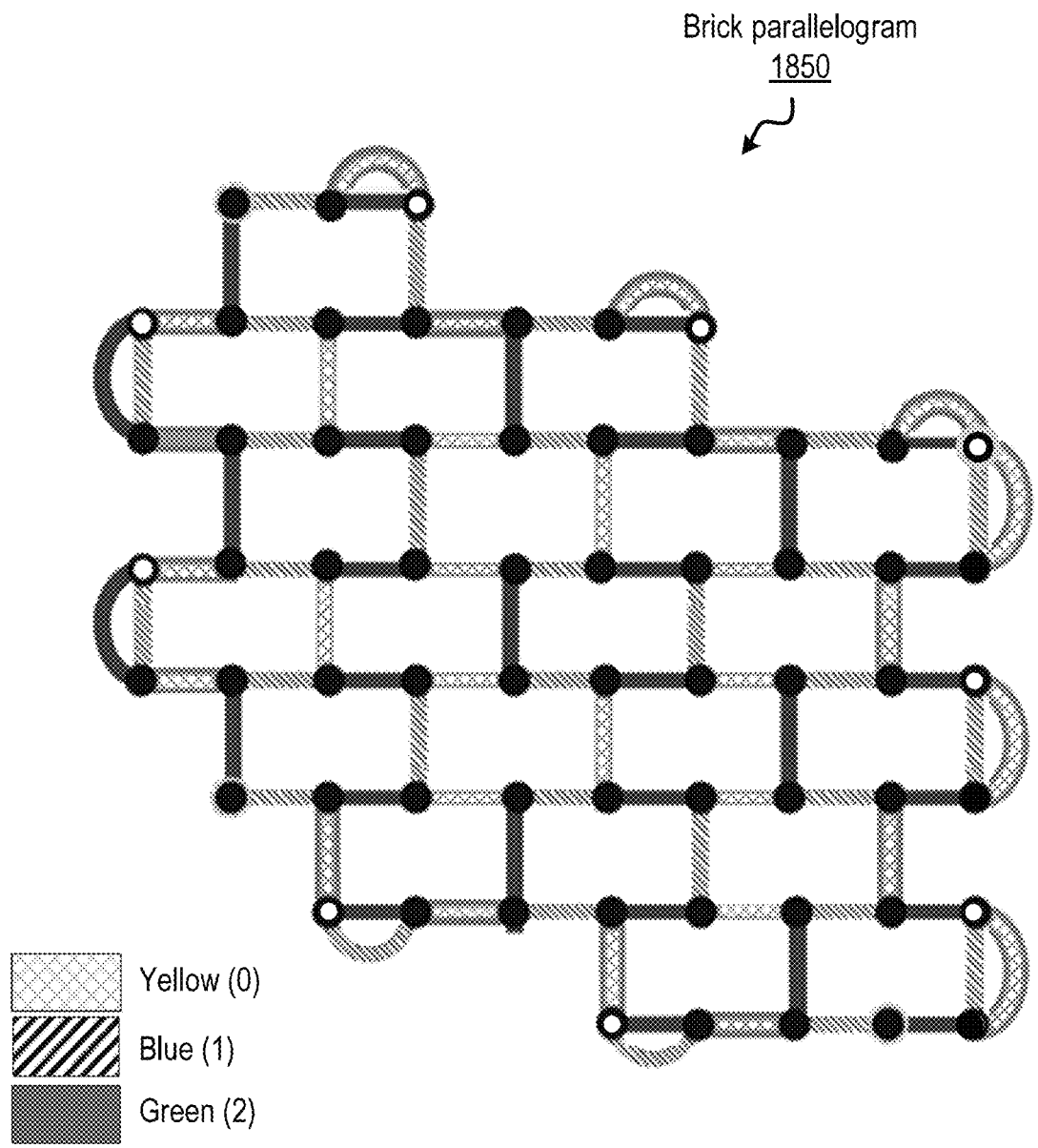
FIG. 18H illustrates an example of a brick parallelogram with boundary edges for a horizontal brick wall implementation, according to one embodiment.

FIGS. 18H-K illustrate boundary considerations for the horizontal brick wall embodiment. FIG. 18H shows a brick parallelogram 1850 for the horizontal brick wall embodiment, which includes the additional boundary measurements for the horizontal brick wall implementation of the Floquet honeycomb code. The patch (i.e., brick parallelogram 1850 for the horizontal brick wall embodiment) shown in FIG. 8H is the same (but rotated) as the brick parallelogram 350 for the vertical brick wall embodiment, which is illustrated in FIG. 5A, for example. Qubits with white dots indicate qubits whose measurements break the bulk pattern.

Figure 18I:
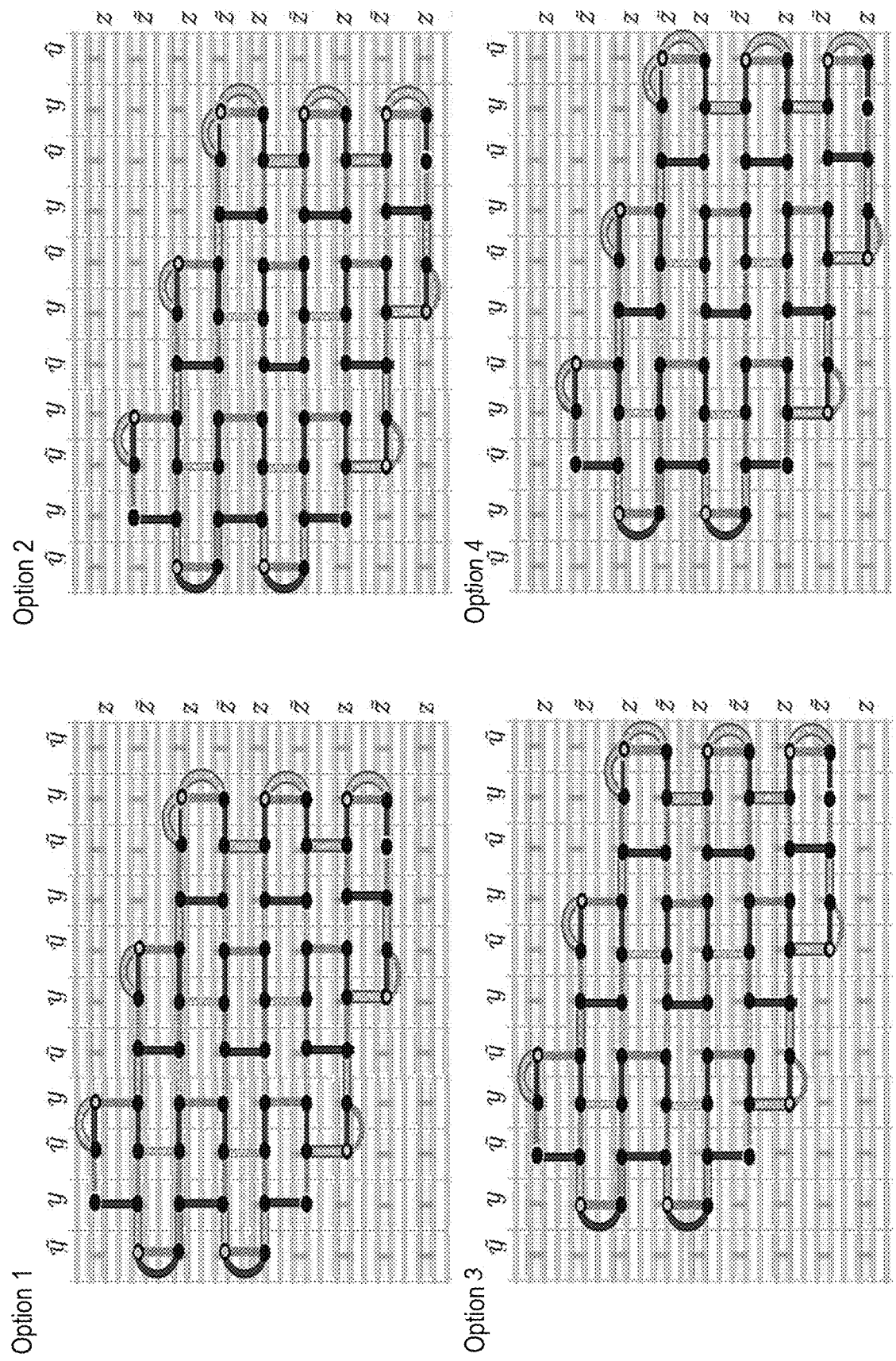
FIG. 18I illustrates four options for a horizontal brick wall implementation, according to one embodiment.

FIG. 18I shows that there are four options regarding how the brick parallelogram 350 is arranged with respect to the columns (i. e., $\mathcal{Y}$ column versus $\widetilde{\mathcal{Y}}$ column) and the rows (i.e., $\mathcal{Z}$ row versus $\widetilde{\mathcal{Z}}$ row). Accordingly, there are four different sets of boundary measurements depending on which of the four options is chosen).

Figure 18J:
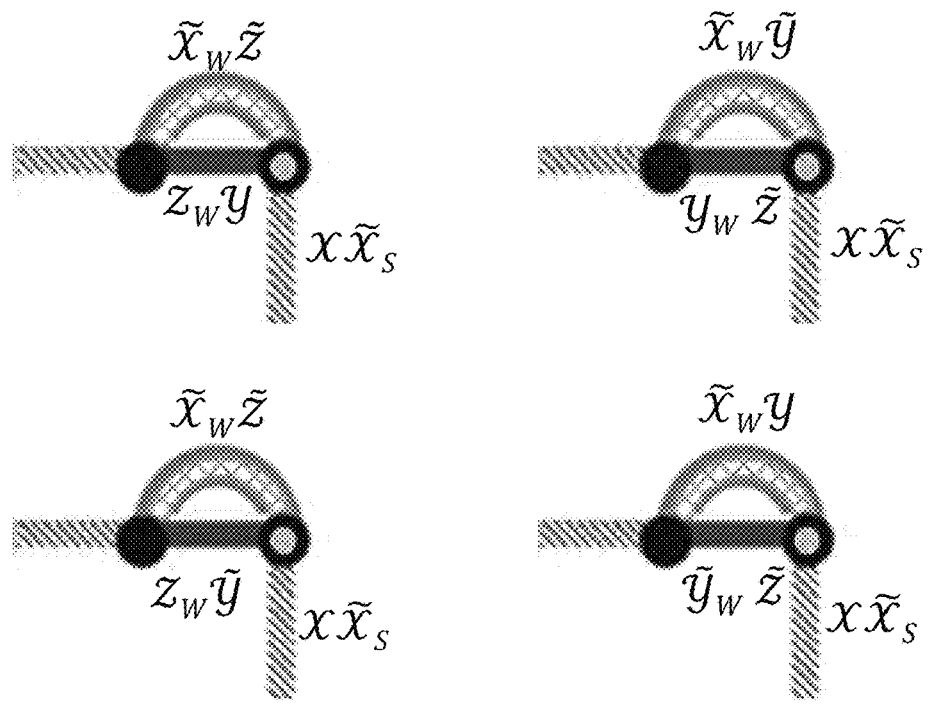
FIG. 18J illustrates top boundary measurements for a horizontal brick wall implementation, according to one embodiment.

FIG. 18J shows the 2-gon measurements for the edges on the top boundary. The bottom boundary 2-gons have the analogous measurements.

Figure 18K:
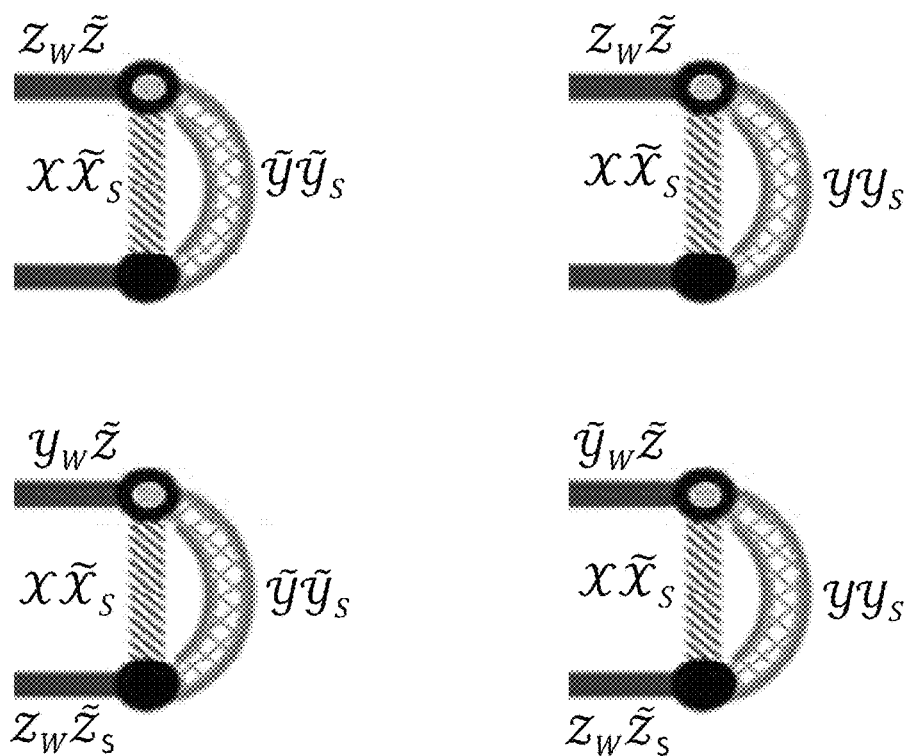
FIG. 18K illustrates right boundary measurements for a horizontal brick wall implementation, according to one embodiment.

FIG. 18K shows the 2-gon measurements for the edges on the right boundary. The left boundary 2-gons have the analogous measurements.

Figure 19:
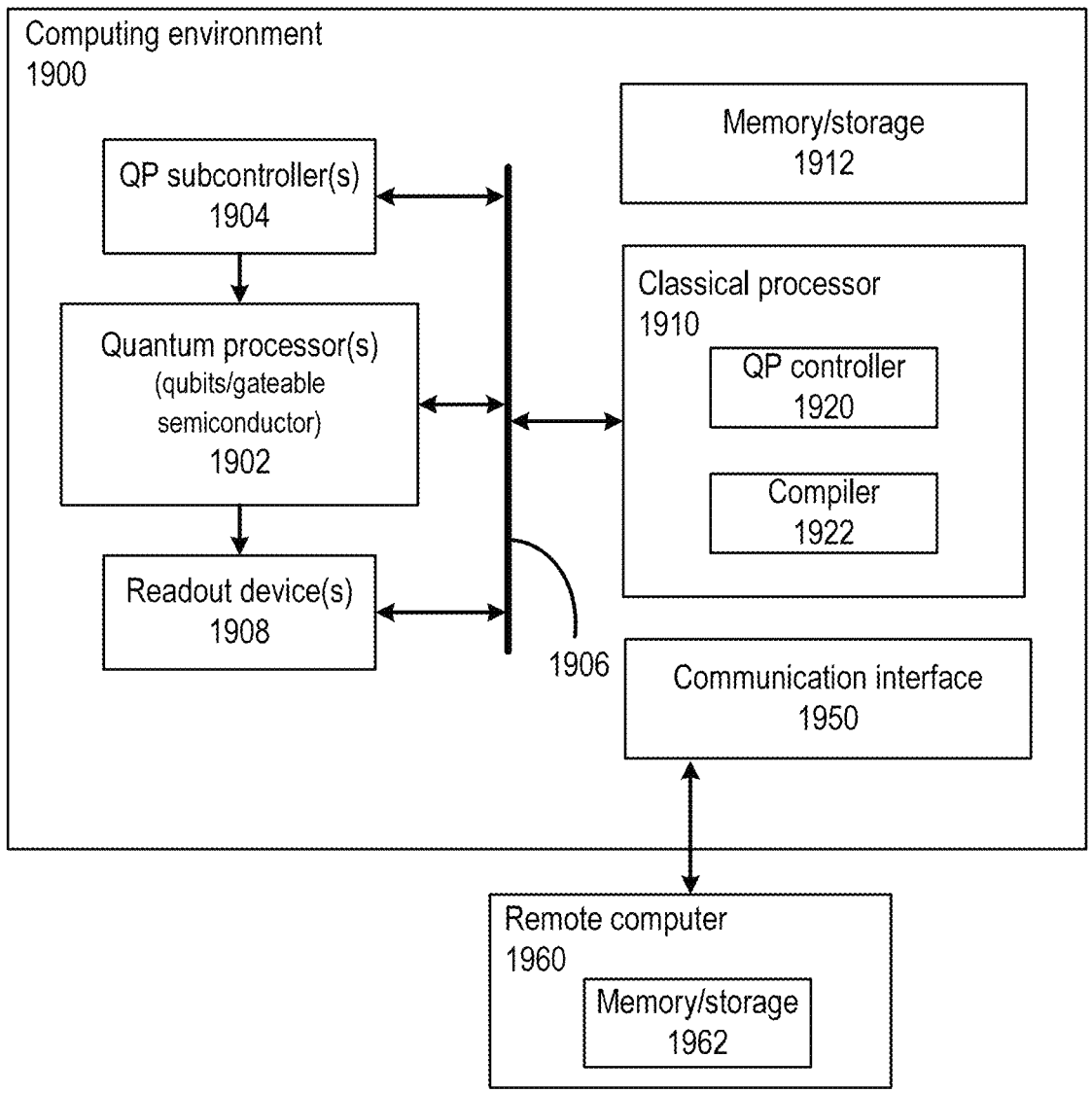
FIG. 19 illustrates a classical processing system coupled to a quantum processor, according to one embodiment.

With reference to FIG. 19, an exemplary system for implementing the disclosed technology includes computing environment 1900. The environment 1900 includes one or more quantum processors 1902 and one or more readout device(s) 1908. The quantum processor(s) 1902 execute quantum circuits/measurements (e.g., the steps of the Floquet code). The processes executed by the quantum processor(s) 1902 can be precompiled. The quantum processor(s) 1902 can be a topological quantum architecture (e.g., a topological quantum computing device using Majorana zero modes). The quantum processor(s) 1902 can be arrays of tetrons and/or hexons as described herein, for example. The quantum processor(s) 1902 can use a single semiconductor column or a double semiconductor column to facilitate interaction between respective MZMs of the tetrons and/or hexons.

The computing environment 1960 can execute instructions to perform the quantum computing techniques described herein, including, e.g., causing the quantum computer circuitry described herein to execute the Floquet code techniques as disclosed herein. Further, the quantum computer circuitry can implement the coding techniques for a quantum architecture (e.g., Majorana-based systems) as discussed herein.

The precompiled quantum circuits/measurements (including, for example, selections of any of the codes and checks) can be sent into (or otherwise applied to) the quantum processor(s) 1902 via control lines 1906 at the control of quantum processor controller 1920. The control lines 1906 can be a bus, for example, that coneys signals among the components of the computing environment 1900. The quantum processor controller (QP controller) 1920 can operate in conjunction with a classical processor 1910 to implement the desired quantum computing process. In the illustrated example, the QP controller 1920 further implements the desired quantum coding process (i.e., application of the checks and confirming measurements) via one or more QP subcontrollers 1904 that are specially adapted to control a corresponding one of the quantum processor(s) 1902. For instance, in one example, the quantum controller 1920 facilitates implementation of the compiled quantum circuit by sending instructions to one or more memories (e.g., lower-temperature memories), which then pass the instructions to low-temperature controllers (e.g., QP subcontroller (s) 1904) that transmit, for instance, pulse sequences representing the measurements/unitary operations on the quantum processor(s) 1902. In other examples, the QP controller(s) 1920 and QP subcontroller(s) 1904 operate to provide appropriate magnetic fields, encoded operations, or other such control signals to the quantum processor(s) to implement the operations of the compiled quantum computer circuit description. The quantum controller(s) can further interact with readout devices 1908 to help control and implement the desired quantum computing process (e.g., by reading or measuring out data results from the quantum processors once available, etc.)

With reference to FIG. 19, compilation is the process of translating a high-level description of a quantum algorithm into a quantum computer circuit description comprising a sequence of quantum operations or gates, which can include the coding methods as disclosed herein. The compilation can be performed by a compiler 1922 using a classical processor 1910 of the environment 1900 which loads the high-level description from memory or storage devices 1912 and stores the resulting quantum computer circuit description in the memory or storage devices 1912.

In other embodiments, compilation and/or code generation/implementation can be performed remotely by a remote computer 1960 (e.g., a computer having a computing environment as described above) which stores the resulting quantum computer circuit description in one or more memory or storage devices 1962 and transmits the quantum computer circuit description and/or training instructions to the computing environment 1900 for implementation in the quantum processor(s) 1902. Still further, the remote computer 1900 can store the high-level description and/or Majorana fermion code generating (or implementing) instructions in the memory or storage devices 1962 and transmit the high-level description and/or instructions to the computing environment 1900 for compilation and use with the quantum processor(s). In any of these scenarios, results from the computation performed by the quantum processor(s) can be communicated to the remote computer after and/or during the computation process. Still further, the remote computer can communicate with the QP controller(s) 1920 such that the quantum computing process (including any compilation, error correction, and/or QP processor control procedures) can be remotely controlled by the remote computer 1960. In general, the remote computer 1960 communicates with the QP controller(s) 1920 via communication connections 1950.

In particular embodiments, the environment 1900 can be a cloud computing environment, which provides the quantum processing resources of the environment 1900 to one or more remote computers (such as remote computer 1960) over a suitable network (which can include the internet).

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A quantum device, comprising:
   a quantum processor comprising:
   a plurality of qubits arranged in qubit columns and assigned to respective plaquettes in a three-colorable lattice, and
   a gateable semiconductor device comprising semiconductor columns respectively arranged between the qubit columns, the gateable semiconductor device performing two-qubit Pauli measurements between respective qubit pairs of the plurality of qubits;

a classical processor that applies a Floquet code to the quantum processor, the Floquet code detecting errors based on results of the two-qubit Pauli measurements, wherein the classical processor applies the Floquet code to the quantum processor by controlling the gateable semiconductor device to perform a sequence of the two-qubit Pauli measurements, and the classical processor applies a bulk code of the Floquet code to a first portion of the plurality of qubits, the first portion corresponding to a first set of the plaquettes, the first set of the plaquettes being arranged in unit cells that each have two 4-gon plaquettes and two 8-gon plaquettes.

2. The quantum device according to claim 1, wherein each of the unit cells includes a first type of 8-gon plaquette and a second type of 8-gon plaquette, each plaquette being an 2n-gon arranged as a vertical brick having 2n qubits, wherein n=2 for all 4-gon plaquettes and n=4 for all 8-gon plaquettes, and each 2n-gon plaquette having n qubits in two adjacent qubit columns.

3. The quantum device according to claim 2, wherein, for a given vertical brick of the 2n-gon plaquette, a first column of the semiconductor columns extends along a first side of the given vertical brick next to a first set of n qubits of the vertical brick, a second column of the semiconductor columns extends along a second side of the given vertical brick next to a second set of n qubits of the vertical brick, and a third column of the semiconductor columns extends between the first set of n qubits and the second set of n qubits.

4. The quantum device of claim 2, wherein all the two-qubit Pauli measurements performed in the first portion are between qubits that are either adjacent in a vertical direction or adjacent in a horizontal direction.

5. The quantum device of claim 1, wherein the plurality of qubits are Majorana-based qubits comprising an upper topological superconducting wire with a first end on a first side and a second end on a second side and a lower topological superconducting wire with a first end on the first side and a second end on the second side, and the two-qubit Pauli measurements are performed by switching gates in the gateable semiconductor device to connect ends of superconducting wires of one qubit with ends of superconducting wires of another qubit to form an interference loop.

6. The quantum device of claim 5, wherein a size of the interference loop is minimized by selecting superconducting wires and ends thereof to form the interference loop to have closer spatial proximity than unselected superconducting wires and ends of the one qubit and of the another qubit.

7. The quantum device of claim 5, wherein the interference loop is shaped by selecting superconducting wires and ends thereof to form the interference loop that avoid using a same part of the gateable semiconductor device for two check measurements performed during a same step of the Floquet code.

8. The quantum device of claim 5, wherein the Majorana-based qubits are either two-sided tetrons or two-sided hexons, the two-sided tetrons each being two topological superconducting wires with each wire having two ends and having a Majorana Zero Mode (MZM) at each of the two ends, and the two-sided hexons each being three topological superconducting wires with each wire having two ends and having an MZM at each of the two ends.

9. The quantum device of claim 5, further comprising:

coherent links, each of the coherent links comprising a segment of a topological superconductor arranged in a qubit column of the qubit columns between vertically adjacent Majorana-based qubits of the qubit column, the coherent link providing a quantum information path from a first side of the qubit column to a second side of the qubit column.

10. The quantum device of claim 9, wherein the classical processor identifies a second portion of the plurality of qubits and corresponding plaquettes with a boundary code of the Floquet code, and the two-qubit Pauli measurements performed in the second portion are each performed using at most one of the coherent links.

11. The quantum device of claim 9, wherein one or more 2-gon plaquettes in the second portion includes qubits defined using different bases and thereby either (i) a size of an interference loop is reduced relative to a case in which all qubits in the one or more 2-gon plaquettes are defined in a same basis or (ii) reducing a number of coherent links used in the interference loop of the one or more 2-gon plaquettes relative to a case in which all qubits in the one or more 2-gon plaquettes are defined in the same basis.

12. The quantum device of claim 9, wherein the classical processor identifies a second portion of the plurality of qubits and corresponding plaquettes with a boundary code of the Floquet code, and check measurements that are performed in the first portion are each performed using none of the coherent links.

13. The quantum device according to claim 1, wherein the classical processor applies the Floquet code to perform the sequence of the two-qubit Pauli measurements such that, at each time step, no qubit of the plurality of qubits is included in more than one of the two-qubit Pauli measurements.

14. The quantum device of claim 1, wherein the classical processor identifies a second portion of the plurality of qubits and corresponding plaquettes with a boundary code of the Floquet code, and the second portion comprises 2-gon plaquettes.

15. The quantum device of claim 14, wherein all the two-qubit Pauli measurements performed in the second portion are between qubits that are either adjacent in a vertical direction or adjacent in a horizontal direction.

16. The quantum device of claim 1, wherein the semiconductor columns each comprise a double column having two vertical paths along which to connect qubits on each side of a given semiconductor column, and classical processor applying the Floquet code to the quantum processor in a repeating sequence of six steps.

17. The quantum device of claim 1, wherein the Pauli measurements are performed by forming interference loops between a pair of qubits of the plurality of qubits by connecting the pair of qubits via the gateable semiconductor device, and for each of the plaquettes, a plaquette forms a rectangular array of qubits with each qubit being adjacent to two other qubits of the rectangular array of qubits, and the bulk code includes a respective two-qubit Pauli measurement between each pair of adjacent qubits of the rectangular array of qubits.

18. A method of performing a Floquet code on a quantum processor, the method comprising:

assigning, using a classical processor, a plurality of qubits to plaquettes in a three-colorable lattice, the qubits being arranged in qubit columns, and semiconductor columns of a gateable semiconductor device being arranged between the respective qubit columns to perform two-qubit Pauli measurements on the plurality of qubits;

identifying, using the classical processor, a bulk portion of the plurality of qubits and corresponding plaquettes with a bulk code of the Floquet code;

performing, using the classical processor, a sequence of steps of the bulk code on the bulk portion, each step comprising two-qubit Pauli measurements in the bulk portion that are performed by controlling a gateable semiconductor device to form connections between pairs of qubits in the plaquettes of the bulk portion; and detecting, using the classical processor, errors based on results of the two-qubit Pauli measurements a quantum processor comprising, wherein the plaquettes in the bulk portion are arranged in unit cells that each have two 4-gon plaquettes and two 8-gon plaquettes.

19. The method of claim 18, further comprising identifying a boundary portion of the plurality of qubits and corresponding plaquettes with a boundary code of the Floquet code;

performing a sequence of steps of the boundary code on the boundary portion, each step comprising two-qubit Pauli measurements on qubits in the boundary portion that are performed by controlling the gateable semiconductor device to form connections between respective qubits in the boundary portion, wherein the boundary portion includes coherent links, each of the coherent links comprising a segment of a topological superconductor arranged in a qubit column of the qubit columns between vertically adjacent Majorana-based qubits of the qubit column, the coherent link providing a quantum information path from a first side of the qubit column to a second side of the qubit column, and the two-qubit Pauli measurements performed in the boundary portion each use at most one of the coherent links, and the two-qubit Pauli measurements performed in the bulk portion each use none of the coherent links.

20. A quantum device, comprising:

a quantum processor comprising:
   a plurality of qubits configured arranged in respective qubit columns, and
   a gateable semiconductor device comprising semiconductor columns each arranged between the respective qubit columns, the gateable semiconductor device performing two-qubit Pauli measurements by connecting respective qubit pairs of the plurality of qubits; and a classical processor storing code that when executed applies a Floquet code to the quantum processor, the Floquet code detecting errors based on results of the two-qubit Pauli measurements, wherein the classical processor assigns the plurality of qubits to plaquettes, in a first portion of the plurality of qubits the classical processor applies a bulk code of the Floquet code, and the first portion includes plaquettes arranged in unit cells, each of the unit cells consisting of two 4-gon plaquettes and two 8-gon plaquettes, and the classical processor applies the Floquet code to the quantum processor by controlling the gateable semiconductor device to perform a sequence of the two-qubit Pauli measurements.

\* \* \* \* \*